US005590134A

United States Patent [19]

Yin

[11] Patent Number: 5,590,134

[45] Date of Patent: Dec. 31, 1996

[54] TEST CIRCUITS AND METHOD FOR INTEGRATED CIRCUIT HAVING MEMORY AND NON-MEMORY CIRCUITS BY ACCUMULATING BITS OF A PARTICULAR LOGIC STATE

[75] Inventor: Chenwei J. Yin, Richardson, Tex.

[73] Assignee: Texas Instruments Incorporated, Dallas, Tex.

[21] Appl. No.: 477,213

[22] Filed: Jun. 7, 1995

Related U.S. Application Data

[60] Continuation of Ser. No. 934,598, Aug. 24, 1992, which is a division of Ser. No. 544,771, Jun. 27, 1990, abandoned.

[51] Int. Cl.[6] .................................................. G11C 29/00

[52] U.S. Cl. .................................... 371/21.5; 371/22.5

[58] Field of Search ............................ 365/210, 210.1, 365/210.2, 210.3; 395/185.07, 183.18; 371/21.1, 21.2, 21.3, 21.5, 22.5

[56] References Cited

U.S. PATENT DOCUMENTS

| | | | |
|---|---|---|---|
| 3,597,199 | 5/1971 | Anderson et al. | 340/172.5 |
| 3,838,264 | 9/1974 | Maker | 235/153 AM |
| 4,559,626 | 12/1985 | Brown . | |

FOREIGN PATENT DOCUMENTS

| | | |
|---|---|---|
| 61-182150 | 8/1986 | Japan . |
| 02267650 | 11/1990 | Japan . |

*Primary Examiner*—Robert W. Beausoliel, Jr.
*Assistant Examiner*—Ly V. Hua
*Attorney, Agent, or Firm*—Robert D. Marshall, Jr.; James C. Kesterson; Richard L. Donaldson

[57] ABSTRACT

An integrated circuit includes read/write memory and non-memory circuitry. A detector generates a count of the number of bits of each data words recalled from the memory having a predetermined logic state. An adder accumulates the count for plural data words over a period of time into a count register. The integrated circuit may be tested by lading each data word of the read/write memory with a first logic state and repeatedly addressing said read/write memory circuitry with a predetermined number of each possible address in sequence. The resulting count in the count register is compared with an expected count. The integrated circuit may also be tested by loading a predetermined addressable storage location with another logic state while loading all other addressable storage locations with the first logic state and repeatedly addressing the predetermined addressable storage location. The resulting count in the count register is compared with another expected count. The non-memory circuitry is preferably digital to analog converters, whose outputs may be compared to test their operation.

9 Claims, 43 Drawing Sheets

TEST CIRCUITS AND METHOD FOR INTEGRATED CIRCUIT HAVING MEMORY AND NON-MEMORY CIRCUITS BY ACCUMULATING BITS OF A PARTICULAR LOGIC STATE

This application is a continuation of U.S. patent application Ser. No. 07/934,598, filed Aug. 24, 1992; which is a divisional of U.S. Pat. application Ser. No. 07/544,771, filed Jun. 27, 1990, and now abandoned.

NOTICE (C) Copyright, Texas Instruments Incorporated, 1990. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS-REFERENCE TO RELATED APPLICATIONS

All of the following U.S. patent applications are cross-referenced to one another, and all have been assigned to Texas Instruments Incorporated. These applications have been concurrently filed and are hereby incorporated into this patent application by reference.

| Ser. No. | Title |
|---|---|
| U.S. Pat. No. 5,341,470 | Computer Graphics Systems, Palette Devices and Methods for Shift Clock Pulse Insertion During Blanking |
| U.S. Pat. No. 5,270,687 | Palette Devices, Computer Graphics Systems and Methods With Parallel Lookup and Input Signal Splitting |
| Ser. No. 08/080,735 | Palette Devices, Systems and Methods for True Color Mode a continuation of Ser. No. 07/544,774 now abandoned |
| U.S. Pat. No. 5,309,551 | Devices Systems, and Methods for Palette Pass Through Mode A continuation of Ser. No. 07/544,771 now abandoned. |
| U.S. Pat. No. 5,293,468 | Controlled Delay Devices, Systems, and Methods |
| U.S. Pat. No. 5,327,159 | Packed Bus Selection of Multiple Pixel Depths in Pallete Devices, Systems and Methods |
| U.S. Pat. No. 5,287,100 | Graphics Systems, Palettes Graphics Systems, Palettes and Methods with Combined Video and Shift Clock Control |

The following coassigned patents and patent applications and a nonpatent publication are hereby incorporated herein by reference as supporting information to the subject matter disclosed herein:

U.S. Pat. No. 4,799,053, filed Apr. 28, 1986, issued Jan. 17, 1989, "Color Palette Having Multiplexed Color Look Up Table Loading";

Ser. No. 08/263,501, filed Jun. 21, 1994, a continuation of Ser. No. 08/135,754, filed Oct. 12, 1993, and now abandoned, a continuation of Ser. No. 07/933,865, filed Aug. 21, 1992, and now abandoned, a continuation of Ser. No. 435,591, filed Nov. 17, 1989, and now abandoned, Ser. No. (TI-14608), filed Nov. 17, 1989, "Multi-Processor with Crossbar Link of Processors and Memories and Method of Operation";

TMS34070 User's Guide: Color Palette, Texas Instruments Incorporated, 1986.

BACKGROUND OF THE INVENTION

Without limiting the general scope of the invention, its background is described in connection with computer graphics, as an example only.

In computer graphics systems the low cost of dynamic random access memories (DRAM) has made it economical to provide a bit map or pixel map memory for the system. In such a bit map or pixel map memory a color code is stored in a memory location corresponding to each pixel to be displayed. A video system is provided which recalls the color codes for each pixel and generates a raster scan video signal corresponding to the recalled color codes. Thus, the data stored in the memory determines the display by determining the color generated for each pixel (picture element) of the display.

The requirement for a natural looking display and the minimization of required memory are conflicting. In order to have a natural looking display it is necessary to have a large number of available colors. This requires a large number of bits for each pixel in order to specify the particular color from among a large number of possibilities. However, the provision of a large number of bits per pixel requires a large amount of memory for storage. Since a number of bits must be provided for each pixel in the display, even a modest sized display would require a large memory. Thus, it is advantageous to provide some method to reduce the amount of memory needed to store the display while retaining the capability of choosing among a large number of colors.

The provision of a circuit called a color palette enables a compromise between these conflicting requirements. The color palette stores color data words that are longer in bit length than color codes that are stored in the pixel map memory instead of the actual color data words themselves. The color data words can specify colors to be displayed in a form that is ready for digital-to-analog conversion directly from the palette. The color codes stored in the memory for each pixel have a limited number of bits, thereby reducing the memory requirements. The color codes are employed to select one of a number of color registers or palette locations. Thus, the color codes do not themselves define colors but instead identify a selected palette location. These color registers or palette locations each store color data words which are longer than the color codes in the pixel map memory. The number of such color registers or palette locations provided in the color palette is equal to the number of selections provided by the color codes. For example a four-bit color code can be used to select 2-to-the-n or sixteen palette locations. The color data words can be redefined in the palette from frame to frame to provide many more colors in an ongoing sequence of frames than are present in any one frame.

Due to the advantages of the color palette devices, systems and methods, any improvements in their implementation are advantageous in computer color graphics technology.

SUMMARY OF THE INVENTION

Generally, one form of the invention is an integrated circuit including a semiconductor chip and chip circuitry including memory circuitry and additional non-memory circuitry all fabricated on the semiconductor chip. The chip circuitry has a defined set of locations having logic states including a first logic state and at least one other logic state. A semiconductor chip package has pins connected to the chip circuitry. Accumulator circuitry on-chip and connected to the chip circuitry generates a count of the the number of locations in the set that have the first logic state over time. The semiconductor chip package has pins connected to the chip circuitry and accumulator circuitry for external access to the count.

A technical advantage of the invention is that the count enhances chip testability and reliability of the chip as a product.

BRIEF DESCRIPTION OF THE DRAWINGS

These and other features of the present invention will be readily understood from the following Description, taken in conjunction with the Drawings, in which:

FIG. 26 is a block diagram of a computer graphics system with VGA and having an added printed wiring board of FIG. 25 with VGA pass through;

DETAILED DESCRIPTION OF PREFERRED EMBODIMENTS

Figure 1:
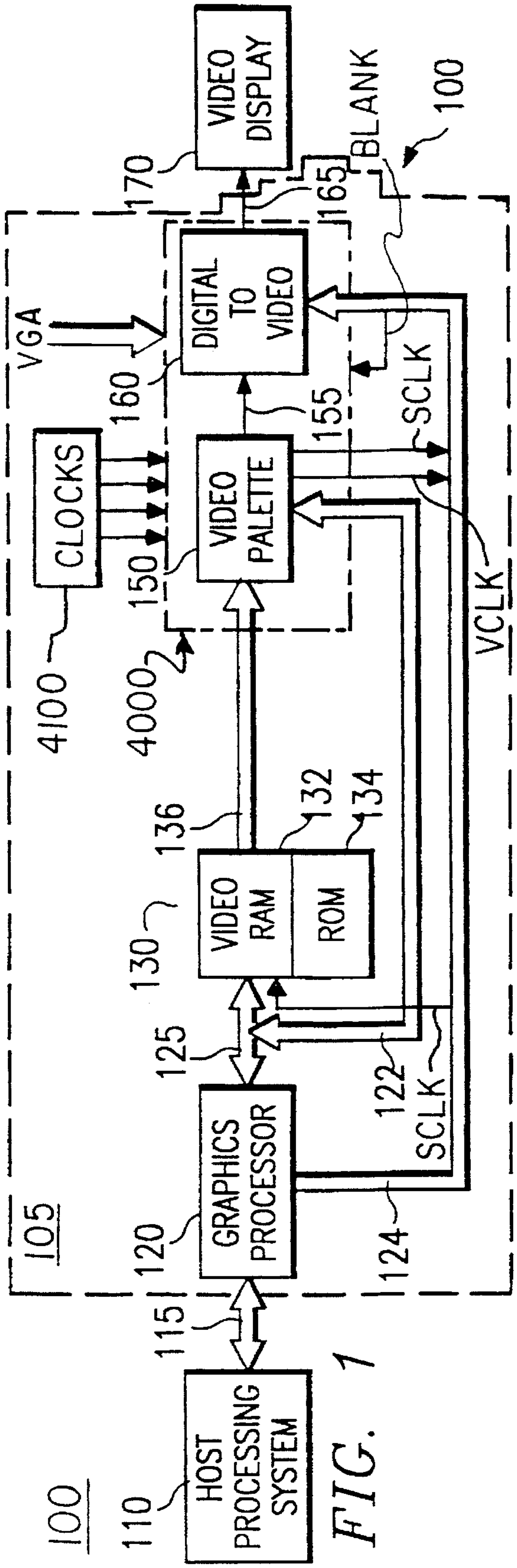
FIG. 1 illustrates a block diagram of a computer graphics system.
Figure 2:
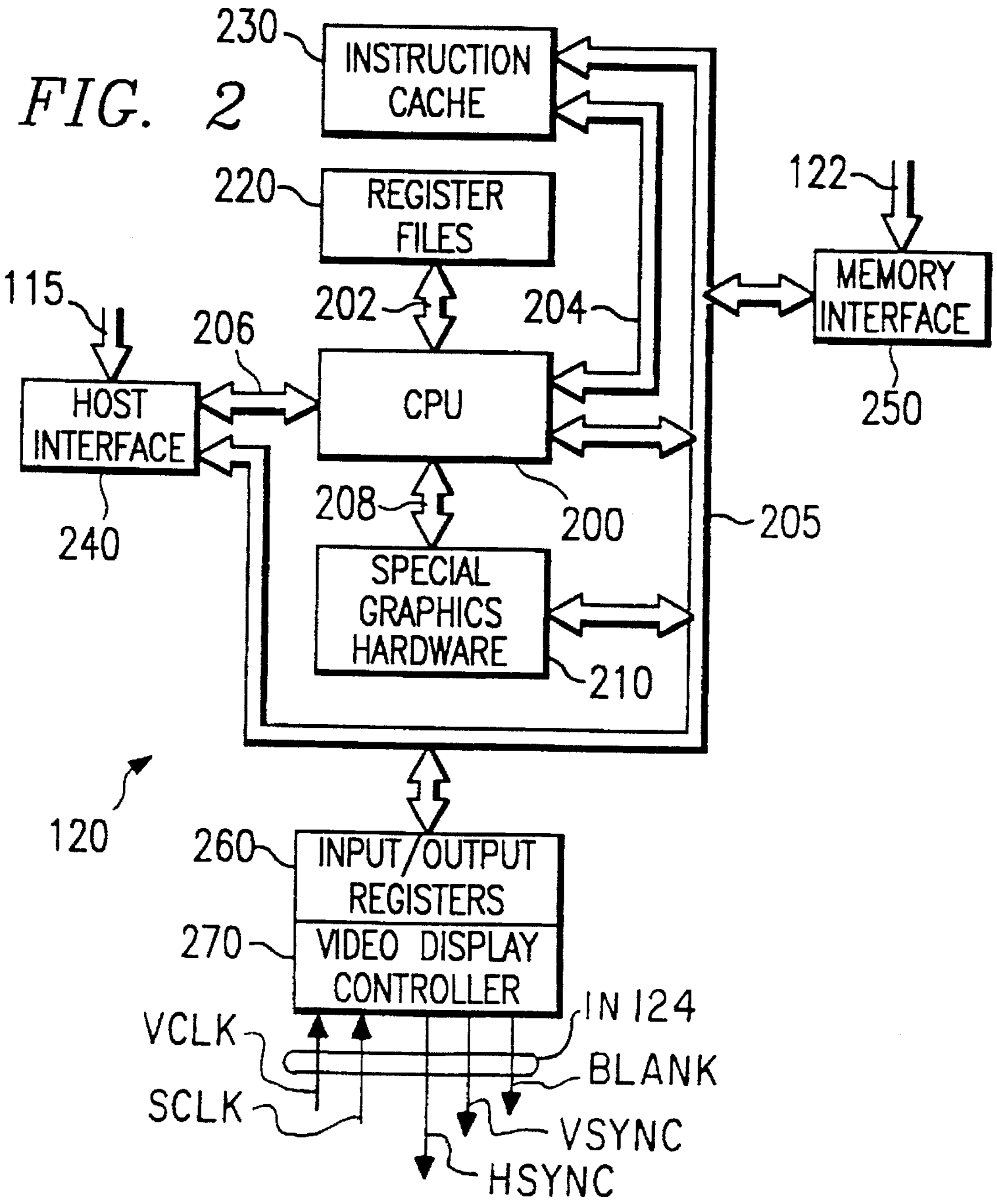
FIG. 2 illustrates a block diagram of a graphics coprocessor.

Before moving into the detailed discussion of the invention, it might be helpful to briefly review, with respect to FIGS. 1 and 2, the basic operation of a graphic processor operating in conjunction with a host system. A more complete detailed discussion can be found in U.S. patent application Ser. No. 07/965,561, filed Oct. 32, 1992, entitled "Graphics Data Processor, A Data Processing System, a Graphics Processing System and a Method of Processing Graphics Data", a continuation of U.S. patent application Ser. No. 07/426,480, field Oct. 23, 1989, and now abandoned, a continuation of U.S. patent application Ser. No. 346,388, filed Apr. 27, 1989, and now abandoned, a continuation of U.S. patent application Ser. No. 07/207,034, filed Jun. 13, 1988, and now abandoned, a continuation of U.S. patent application Ser. No. 06/821,641, filed Jan. 23, 1986, and now abandoned, and assigned to the assignee of this application. The aforementioned application is hereby incorporated by reference. Also incorporated by reference herein are Texas Instruments TMS 34010 User's Guide (August 1988); TIGA-340 (TM) Interface, Texas Instruments Graphics Architecture, User's Guide, 1989, TMS 34020 User's Guide (January 1990), and TMS 44C251 Specification, all of which documents are currently available to the general public from Texas Instruments Incorporated.

For convenience and ease of understanding the inventive concepts taught herein there has been no attempt to show each and every operation and data movement since the actual embodiment of the invention in a system will, to a large degree, depend upon the actual system operation in which the inventive concept is embodied.

FIG. 1 illustrates a block diagram of graphics computer system 100 which is constructed in accordance with the principles of the present invention. Graphics computer system 100 includes a graphics printed wiring board 105 connected to a host processing system 110. Located on printed wiring board 105 are a graphics processor 120, memory 130, shift register 140, video palette 150 and a digital to video converter 160. A video display 170 is driven from the video output of board 105.

Host processing system 110 provides the major computational capacity for the graphics computer system 100. Host processing system 110 preferably includes at least one microprocessor, read only memory, random access memory and assorted peripheral devices for forming a complete computer system. Host processing system 110 preferably also includes some form of input device, such as a keyboard or a mouse, and some form of long term storage device such as a disk drive. The details of the construction of host processing system 110 are conventional in nature and known in the art, therefore the present application will not further detail this element. The essential feature of host processing system 110, as far as the present invention is concerned, is that host processing system 110 determines the content of the visual display to be presented to the user.

Graphics processor 120 provides the major data manipulation in accordance with the present invention to generate the particular video display presented to the user. Graphics processor 120 is bidirectionally coupled to host processing system 110 via host bus 115. In accordance with the present invention, graphics processor 120 operates as an independent data processor from host processing system 110; however, it is expected that graphics processor 120 is responsive to requests from host processing system 110 via host bus 115. Graphics processor 120 further communicates with memory 130, and video palette 150 via video memory bus 122. Graphics processor 120 controls the data stored within video RAM 132 via video memory bus 122. In addition, graphics processor 120 may be controlled by programs stored in either video RAM 132 or read only memory 134. Read only memory 134 may additionally include various types of graphic image data, such as alphanumeric characters in one or more font styles and frequently used icons. In addition, graphics processor 120 controls the data stored within video palette 150. Lastly, graphics processor 120 controls digital to video converter 160 via video control bus 124. Graphics processor 120 may control the line length and the number of lines per frame of the video image presented to the user by control of digital to video converter 160 via video control bus 124.

Video memory 130 includes video RAM 132 which is bidirectionally coupled to graphics processor 120 via video memory bus 125. As previously stated, video RAM 130 includes the bit mapped graphics data which controls the video image presented to the user. This video data may be manipulated by graphics processor 120 via video memory bus 122. In addition, the video data corresponding to the current display screen is output from video RAM 132 via video output bus 136. The data from video output bus 136 corresponds to the picture element to be presented to the user. In the preferred embodiment, video RAM 132 is formed of a plurality of TMS44251 256KX4 dynamic random access integrated circuits available from Texas Instruments Incorporated, the assignee of the present application. The TMS44251 integrated circuit includes dual ports, enabling display refresh and display update to occur without interference.

In accordance with the typical arrangement of video random access memory 132, this memory consists of a bank of several separate random access memory integrated circuits. The output of each of these integrated circuits is typically only one or four bits wide and is output on video output bus 136.

Video palette 150 receives the high speed video data from video random access memory 132 via bus 136. Video palette 150 also receives data from graphics processor 120 via video memory bus 122. Video palette 150 converts the data received on parallel bus 136 into a video level output via bus 155. This conversion is achieved by means of a look-up table which is specified by graphics processor 120 via video memory bus 122. The output of video palette 150 may comprise color hue and saturation for each picture element or may comprise red, green and blue primary color levels for each pixel. The table of conversion from the code stored within video memory 132 and the digital levels output via bus 155 is controlled from graphics processor 120 via video memory bus 122.

Digital to video converter 160 receives the digital video information from video palette 150 via bus 155. Digital to video converter 160 is controlled by graphics processor 120 via video control bus 124. Digital to video converter 160 serves to convert the digital output of video palette 150 into the desired analog levels for application to video display 170 via video output 165.

Video palette 150 and digital to video converter 160 are integrated together and their circuitry substantially improved to form a new device 4000 which is herein called a "programmable palette" or simply a "palette". Associated with palette 4000 is a clock circuit 4100 for multiple clock oscillators and programmable clock selection. These improve the graphics computer system and its operations generally, and are described more fully starting with FIG. 22.

Lastly, video display 170 receives the video output from digital to video converter 160 via video output line 165. Video display 170 generates the specified video image for viewing by the operator of graphics computer system 100. It should be noted that video palette 150, digital to video converter 160 and video display 170 may operate in accordance to two major video techniques. In the first, the video data is specified in terms of color hue and saturation for each individual pixel. In the other technique, the individual primary color levels of red, blue and green are specified for each individual pixel. Upon determination of the design choice of which of these major techniques to be employed, video palette 150, digital to converter 160 and video display 170 must be constructed to be compatible to this technique. However, the principles of the present invention in regard to the operation of graphics processor 120 are unchanged regardless of the particular design choice of video technique. All of the signals that contribute to display color in some way are regarded as color signals even though they may not be of the red, blue, green technique.

FIG. 2 illustrates graphics processor 120 in further detail. Graphics processor 120 includes central processing unit 200, special graphics hardware 210, register files 220, instruction cache 230, host interface 240, memory interface 250, input/output registers 260 and video display controller 270.

The heart of graphics processor 120 is central processing unit 200. Central processing unit 200 includes the capacity to do general purpose data processing including a number of arithmetic and logic operations normally included in a general purpose central processing unit. In addition, central processing unit 200 controls a number of special purpose graphics instructions, either alone or in conjunction with special graphics hardware 210.

Graphics processor 120 includes a major bus 205 which is connected to most parts of graphics processor 120 including the central processing unit 200. Central processing unit 200 is bidirectionally coupled to a set of register files, including a number of data registers, via bidirectional register bus 202. Register files 220 serve as the depository of the immediately accessible data used by central processing unit 200. As will be further detailed below, register files 220 include, in addition to general purpose registers which may be employed by central processing unit 200, a number of data registers which are employed to store implied operands for graphics instructions.

Central processing unit 200 is connected to instruction cache 230 via instruction cache bus 204. Instruction cache 230 is further coupled to bus 205 and may be loaded with instruction words from video memory 132 (FIG. 1) via video memory bus 122 and memory interface 250. The purpose of instruction cache 230 is to speed up the execution of certain functions of central processing unit 200. A repetitive function or function that is used often within a particular portion of the program executed by central processing unit 200 may be stored within instruction cache 230. Access to instruction cache 230 via instruction cache bus 204 is much faster than access to video memory 130. Thus, the program executed by central processing unit 200 may be speeded up by preliminarily loading the repeated or often used sequences of instructions within instruction cache 230. Then these instructions may be executed more rapidly because they may be fetched more rapidly. Instruction cache 230 need not always contain the same sets of instructions, but may be loaded with a particular set of instructions which will be often used within a particular portion of the program executed by central processing unit 200.

Host interface 240 is coupled to central processing unit 200 via host interface bus 206. Host interface 240 is further connected to host processing system 110 (FIG. 1) via host system bus 115. Host interface 240 serves to control the communication between host processing system 110 and graphics processor 120. Host Interface 240 controls the timing of data transfer between host processing system 110 and graphics processor 120. In this regard, host interface 240 enables either host processing system 110 to interrupt graphics processor 120 or vice versa enabling graphics processor 120 to interrupt host processing system 110. In addition, host interface 240 is coupled to major bus 205 enabling host processing system 110 to control directly the data stored within memory 130. Typically, host interface 240 would communicate graphics requests from host processing system 110 to graphics processor 120, enabling the host system to specify the type of display to be generated by video display 170 and causing graphic processor 120 to perform a desired graphic function.

Central processing unit 200 is coupled to special graphics hardware 210 via graphics hardware bus 208. Special graphics hardware 210 is further connected to major bus 205. Special graphics hardware 210 operates in conjunction with central processing unit 200 to perform special graphic processing operations. Central processing unit 200, in addition to its function of providing general purpose data processing, controls the application of the special graphics hardware 210 in order to perform special purpose graphics instructions. These special purpose graphics instructions concern the manipulation of data within the bit mapped portion of video RAM 132. Special graphic hardware 210 operates under the control of central processing unit 200 to enable particular advantageous data manipulations regarding the data within video RAM 132.

Memory interface 250 is coupled to bus 205 and further coupled to video memory bus 122. Memory interface 250 serves to control the communication of data and instructions between graphics processor 120 and memory 130. Memory 130 includes both the bit mapped data to be displayed via video display 170 and instructions and data necessary for the control of the operation of graphics processor 120. These functions include control of the timing of memory access, and control of data and memory multiplexing. In the preferred embodiment, video memory bus 122 includes multiplexed address and data information. Memory interface 250 enables graphics processor 120 to provide the proper output on video memory bus 122 at the appropriate time for access to memory 130.

Graphics processor 120 lastly includes input/output registers 260 and video display controller 270. Input/output registers 260 are bidirectionally coupled to bus 205 to enable reading and writing within these registers. Input/output registers 260 are preferably within the ordinary memory space of central processing unit 200. Input/output registers 260 include data which specifies the control parameters of video display controller 270. Video display controller 270 is clocked by a video clock signal VCLK from palette 4000. In accordance with the data stored within input/output registers 260, video display controller 270 generates the signals on video control bus 124 for the desired control of palette 4000. Data within input/output registers 260 includes data for specifying the number of pixels per horizontal line, the horizontal synchronization and blanking intervals, the number of horizontal lines per frame and the vertical synchronization and blanking intervals. Input/output registers 260 may also include data which specifies the type of frame interlace and specifies other types of video control functions. Lastly, input/output registers 260 is a depository for other specific kinds of input and output parameters which will be more fully detailed below.

Graphics processor 120 operates in two differing address modes to address memory 130. These two address modes are x y addressing and linear addressing. Because the graphics processor 120 operates on both bit mapped graphic data and upon conventional data and instructions, different portions of the memory 130 may be accessed most conveniently via differing addressing modes. Regardless of the particular addressing mode selected, memory interface 250 generates the proper physical address for the appropriate data to be accessed. In linear addressing, the start address of a field is formed of a single multibit linear address. The field size is determined by data within a status register within central processing unit 200. In x y addressing the start address is a pair of x and y coordinate values. The field size is equal to the size of a pixel, that is the number of bits required to specify the particular data at a particular pixel.

Figure 3:
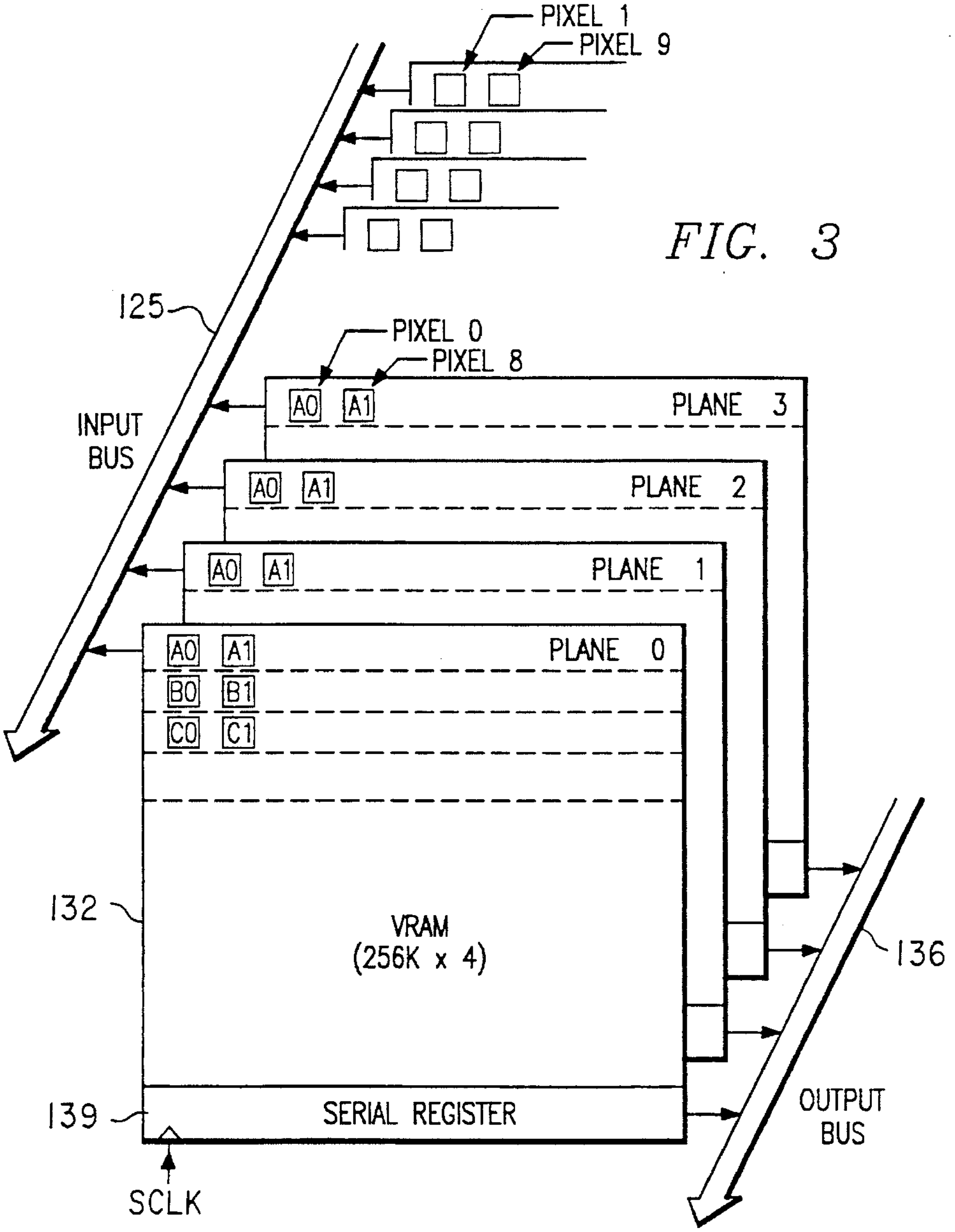
FIG. 3 (shown on sheet 2) shows an expanded, stylized view of a video memory operating in conjunction with a split serial register.

Turning now to FIG. 3, a brief discussion of the memory structure of a typical graphics memory system is in order before progressing to the actual detailed description of the functioning of the embodiment of this invention. Background information on video RAM (VRAM) is found in coassigned U.S. Pat. Nos. 4,330,852; 4,639,890 and 4,683,555 which are hereby incorporated by reference. While there are many memory structures and system which could be used, it has become typical to use a structure, such as shown in FIG. 3, which uses eight VRAM memories 130 in an array. Each VRAM memory, or unit, having four sections, or planes, 0, 1, 2 and 3. The construction of each plane is such that a single data lead is used to write information to that plane. In a system which uses a 32 bit data bus, such as data bus 122, there would be 8 VRAM memories (two of which are shown in FIG. 3) each VRAM memory having four data leads connected to the input data bus.

Thus, for a 32 bit data bus, VRAM memory 132 would have its four data leads connected to data bus leads 0, 1, 2, 3 respectively. Likewise, the next VRAM memory would have its four leads 0, 1, 2, 3 connected to data bus leads 4, 5, 6, 7 respectively. This continues for the remaining six VRAM's such that the last VRAM has its leads connected to leads 28, 29, 30, 31 of bus 122.

The memories are arranged such that the pixel information for the graphics display is stored serially across the planes in the same row. Assuming a four bit per pixel system, then the bits for each pixel are stored in a separate VRAM memory. In such a situation, pixel 0 would be in the first VRAM and pixel 1 would be in the second VRAM. The pixel storage for pixels 2 through 7 are not shown. The pixel information for pixel 8 then would be stored in the first VRAM, still in row 0 but in column 2 thereof. The reason for this arrangement of pixel information will be more fully appreciated from an understanding of how information is retrieved from the memory.

Continuing with FIG. 3, each VRAM plane has a serial register 139 for shifting out information from a row of memory. The shifting occurs at a rate determined by shift clock signal SCLK from palette 4000. The outputs from these registers are connected to bus 136 in the same manner as the data input leads are connected to the input bus. Thus, data from a row of memory, say row 0, would be moved into register 139 and occur serially from each register 139 and in parallel on bus 136. This would occur for each plane of the eight memory array.

Looking at data output bus 136 then at an instant of time the first bit in each shift register would be on the bus. Thus, assuming row 0 is being outputted to the bus, the bus would have an its lead 0 the row 0, bit A0 (plane 0) of memory 130. Bus 136 lead 1 would have on it row 0, bit A0 (plane 1), while lead 2 would have row 0, bit A0 (plane 2) and lead 3 would have on it row 0, bit A0 (plane 3). These bits would be followed by the bits from the next VRAM. Thus, at a first instant of time, data bus 136 would have on it the four bits forming pixel 9 next to the four bits forming pixel 1, next to the four bits forming pixel 2. This would continue until the 32 bits forming the 8 pixels 0–7 were on the parallel leads of data bus 136. These bits would be supplied to the graphics display and the shift registers would all shift one position providing the bus with pixel information for the next 8 pixels, namely pixels 8 through 15. This shifting would then continue until the entire row in the VRAMs was shifted out and then a new row would be selected for loading into the output serial registers.

Up to this point it is assumed that the bit information per pixel is 4 bits. If the pixel information were to be, say 8 bits, then two VRAMs would have to be used per pixel. This would change the bit patterns somewhat. Also, it should be noted that memory sizes and structures continue to vary and the size and structure shown are only for illustrative purposes and this invention can be used with many different memory configurations and with different pixel sizes.

As discussed previously, the serial register 139 for each memory would be 512 bits long thereby transferring 16384 bits to the display for each memory-to-serial register read cycle. These 16384 bits represent data for 2048 display pixels, assuming each pixel contains 8 bits. However, assume each scan line only requires 1280 pixels. Thus, on every line of memory 768 pixels from each row of memory cannot be displayed. This memory is difficult to use for other purposes and thus is effectively wasted.

To solve the problem, the serial output register 139 has been split in half and each half is used to output data from the VR/LM. While it is understood that 32 shift registers 139 are used, the discussion will focus on only one plane of the memory with the understanding that all planes work in the same manner. The two halves of the register 139 are known as half A and half B. Advantageously, the serial register 139 takes from memory an entire row of screen memory and presents that row to the screen pixel-by-pixel in a smooth, even flow.

As discussed above, if this were to occur with a single, unsplit serial register 139, then the information for one entire scan line of the display would have to be moved from memory 132 into the serial register 139 and then shifted onto the screen at the screen clocking rate. This, then, would require each row of memory to contain only one line (or full multiples thereof) of screen information. That is not the case, as we will see, with a split serial register, where bits can be shifted from the A section while other bits are loaded into the B section and shifted to the screen from the B section while other bits are loaded into the A section.

Figure 4:
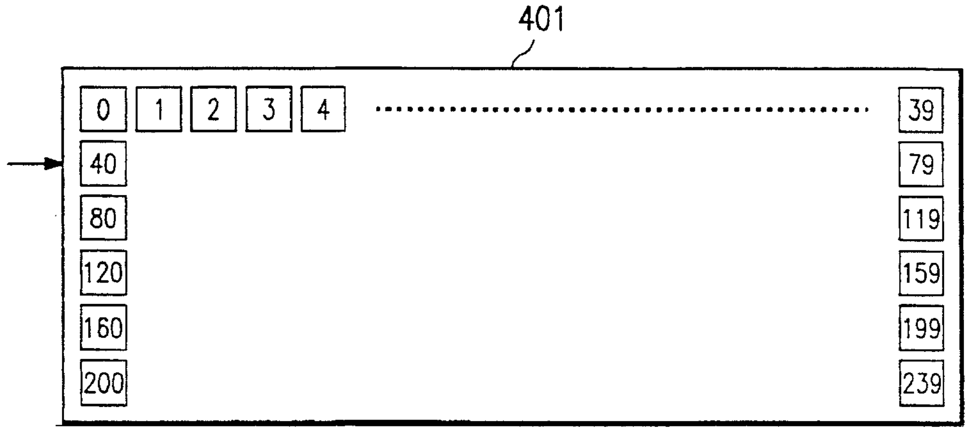
FIG. 4 shows a graphic display for illustrative purposes.

Turning now to FIG. 4, there is shown a graphics screen 401 having 40 pixels across its face and several rows of pixels down. It must be understood that the numbers used here are for illustration only and bear no resemblance to the number of pixels, e.g. 1280, across the face of an example graphics screen. The actual numbers are so high that the operation of the invention will become burdensome if the example cited were to use numbers approaching those actually found. The same holds true for the discussion of memory 501, FIG. 5, which is to follow and system arrangements using real numbers will serve only to obscure the discussion. In fact, as will be seen, memory 501 used for discussion purposes has less column capacity (16), in terms of pixels, than does screen 401. In practice, this would typically be the reverse.

Digressing momentarily, a system having 1280 pixels per line and 1024 lines would be refreshed at the rate of sixty times a second and thus pixels must be displayed at the rate of one every 12.7 ns. Using an 8 bit pixel where two 4 bit VRAMS provide data for one pixel, 4 VRAM sets would be connected to the 32 bit bus. This would require clocking the VRAMS at a rate of once every 50.8 ns which is a frequency of 19.6 MHZ. With data being moved at such high speeds, any small pause (such as to reload the serial register) is noticeable. Moreover, this problem can pertain to clock rates in any one of the clocks in clocks unit 4100.

Figure 5:
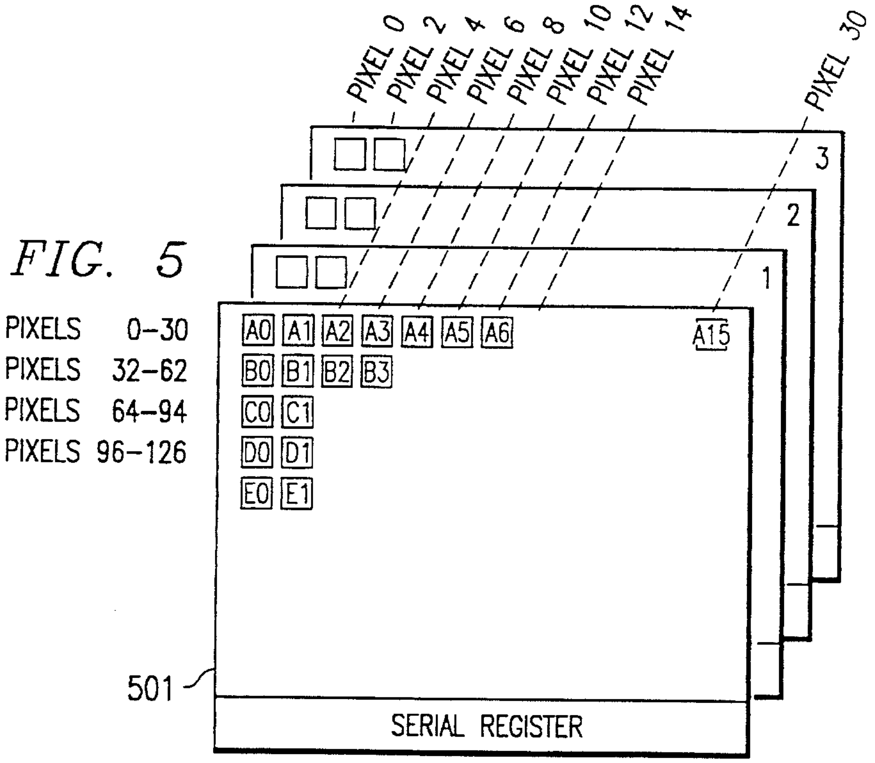
FIG. 5 shows a memory array for illustrative purposes.

Turning now to FIG. 5, memory 501 is shown with each pixel having 4 bits. For purposes herein it is also assumed that only two such memory units are being used, one containing even pixels and one (not shown) containing odd pixels. This would result in use of only 8 bits, or leads, of the bus, four bits from each memory unit. It is also assumed that the memory has only 16 columns, labeled 0 through 15. Thus, row 0 is labeled A0 through A15 while row 1 is labeled B0 through B15. If the discussion is further restricted to the memory unit containing only the even pixels, then it can be thought of that bit A0 represents data for pixel 0 and bit A1 represents data for pixel 2. This follows since the A0 bit in the unseen second VRAM would contain information of pixel 1.

Following this highly impractical, but illustrative, embodiment then would result in information for (even) pixels 0–30 being in row A, information for (even) pixels 32–62 being in row B, etc. as shown in FIG. 5.

Now assume that it is desired to transfer to the screen the pixel information for screen pixels 40–79 (FIG. 4) representing the pixels necessary for the second row of the screen.

To accomplish this task the system sends to the memory the instruction bits which will address the memory at row B, since the information for the pixels 40–79, as discussed above, reside in rows B and C of the memory, FIG. 5.

Figure 6:
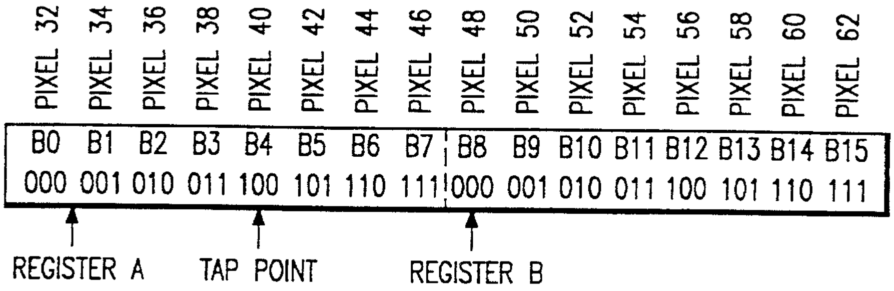
FIGS. 6, 7 & 8 show bits in the serial register at different times.

This operation will result in the serial register being loaded with the pixel information for pixels 32–62 from row B. This is shown in FIG. 6. However, if the entire register were to be shifted to the screen, bits B0 through B3 would also be shifted and this would cause difficulties since these bits belong to pixels 32–38 which (as seen in FIG. 4) are on row 0 of the screen. To avoid this problem, the processor, not shown, which controls the memory transfer keeps track of the proper bit position from which to begin shifting and presents this information to memory as part of the aforementioned instruction. This position is known as the tap point.

In order to control the split register aspect of the operation, it is necessary to know when to reload the first part of the register, i.e., when data is being removed from the second part and data has already been removed from the first part, or when the data in the first part pertains to a prior screen row as can happen immediately after the fly back interval. It is, of course, also necessary to know when to reload the second part of the register, i.e., when data is being read from the first part after data has been read from the second part. To accomplish this function, a counter is used to keep track of the position of the serial register active at a given time. For the counter to operate properly, it must know the beginning point (tap point) in the register of the first data shift. This is necessary, since, as discussed above, the starting point is not necessarily at the beginning of the memory row. Several steps must be taken to calibrate the counter on a row by row basis to control the loading and reloading of the two halves of the serial register.

Control of the serial register is such that when the first half of the register is finished sending data it can be cleared and reloaded so that while the bits are being sent from the second half of the register new data bits can be loaded in the first half. If, in fact, the bits to be sent first were to be in the second half of the register, the B half, then the A half would have to be reloaded immediately. This fact also must be determined. These determinations are made from the address information provided to the memory and are dependent upon the bit positions and number of bits necessary to specify an address.

Figure 9:
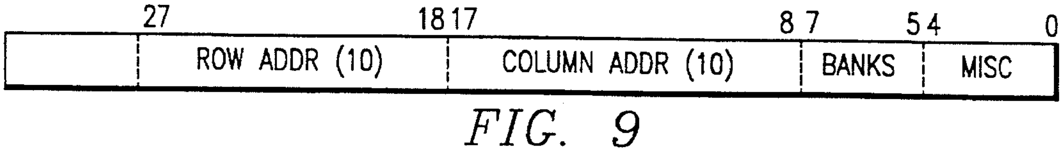
FIGS. 9 and 10 (shown on sheet 1) show two row and column address arrangements for different size memories.
Figure 10:
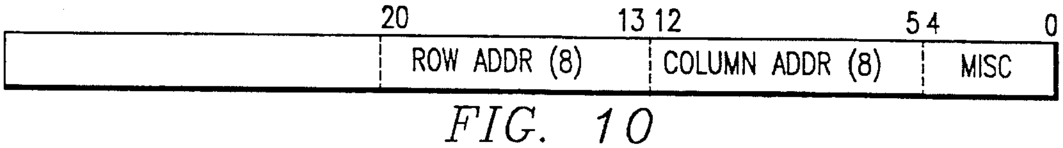

As an example of the problem, some typical address bit configurations are shown in FIGS. 9 and 10. FIG. 9 shows a 10 bit row and column address preceded by 3 bank select bits and 5 miscellaneous address bits. FIG. 10 shows 8 bit row and column address bits preceded only by the miscellaneous address bits.

Figure 11:
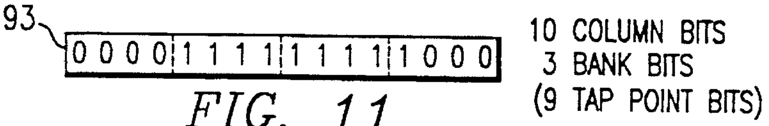
FIGS. 11, 12 and 13 show mask bits for controlling the tap-point of the serial registers in accordance with different address physical configurations.
Figure 12:
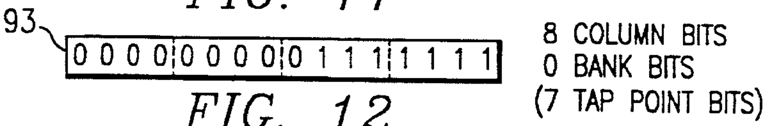
Figure 13:
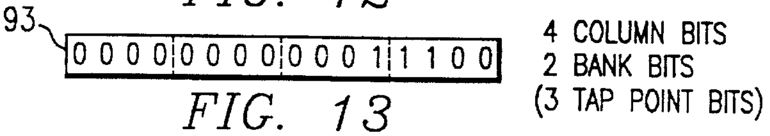

Masks are created by the user to tailor the system configuration. FIG. 11 shows a mask for use with the FIG. 9 address configuration while FIG. 12 shows a mask for use with the FIG. 10 configuration. FIG. 13 shows the mask that is used by the system with three tap point bits (16 possible columns, 8 in each half-shift register) preceded by two bank select bits. These bits were added for the sake of discussion.

Figure 14:
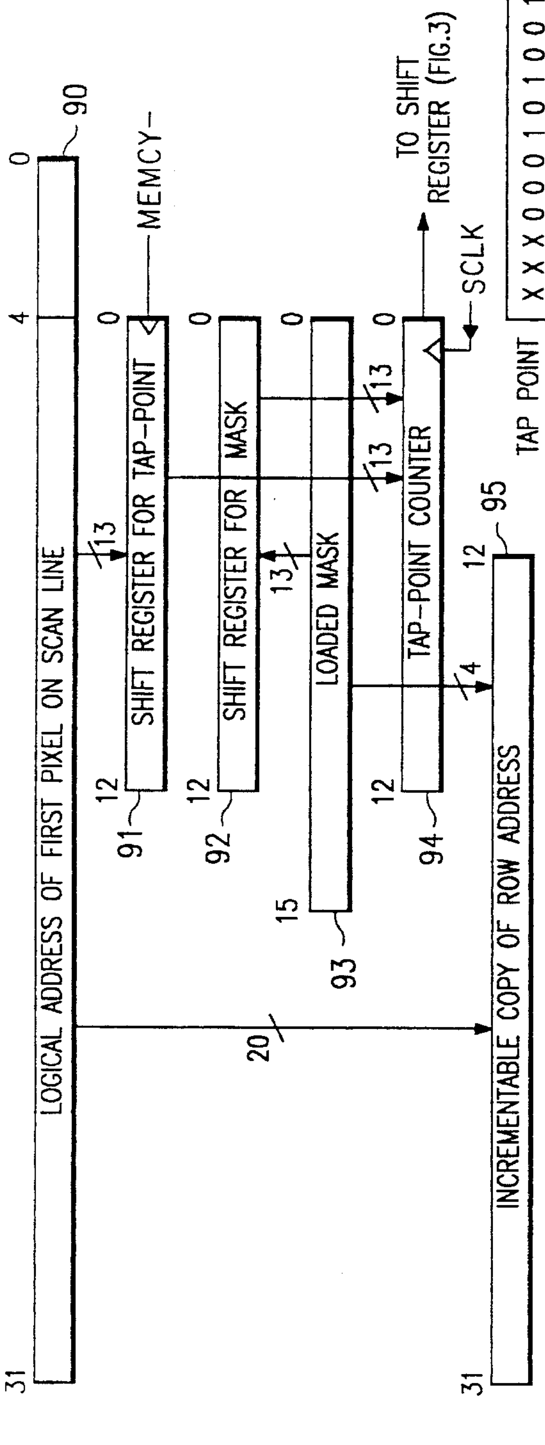
FIG. 14 shows a block diagram of control registers in the graphics coprocessor of FIG. 2 for control of the serial registers.

In FIG. 14, there is a diagram laying out how these masks are to be used. FIGS. 15 through 20 illustrate an example.

Figure 15:
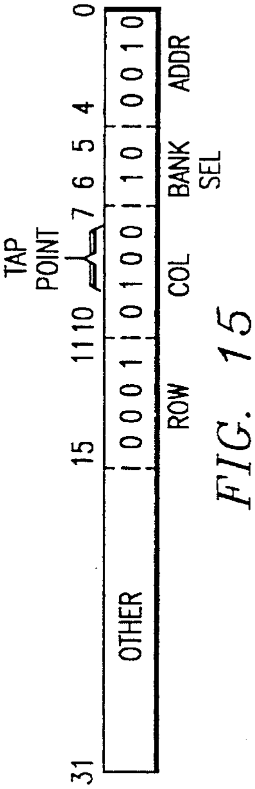
FIGS. 15–21 show bits in the control registers of FIG. 14.
Figure 16:
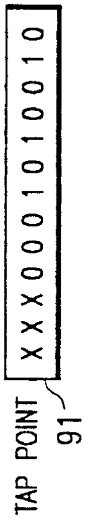

FIG. 15 shows the row and column address bits for row 1, column 4 of the memory which, it will be recalled, is where the first pixel 40 for the selected screen row resides. The bit word depicted in FIG. 15 also has other address bits 0–4, and bank bits 5 . 6. The tap point bits are loaded into tap point register 91. The tap point is defined as the bit position in the register which will be read to the bus first. This tap point is calculated from the address information of FIG. 15. In this example, the first five bits of the address (0–4) can be ignored since they would be constant for all configurations as a design matter. The next thirteen bits of the address are transferred to tap register 91, FIG. 16.

Figure 17:
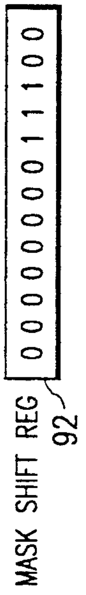
Figure 18:
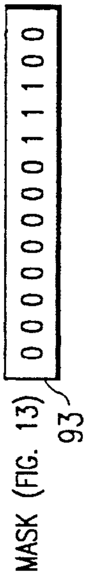
Figure 19:
Figure 20:
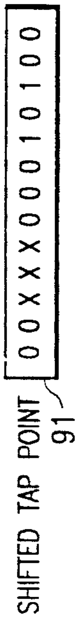

As shown .in FIGS. 17 and 18, and as controlled by FIG. 14, mask 93, which was created for our example system (FIG. 13), is copied into mask shift register 92. This mask serves to adjust the tap point for the possible variation of bank select bits. In this example, there were two such bits and thus the first two bits of the mask are 0's. A clock then shifts registers 92 and 91 to the right until a 1 appears in the right most position of shift register 92 (FIG. 19). This operation serves to remove the bank bits from the tap point, which then becomes 100 as seen from register 91, FIG. 20.

Figure 21:
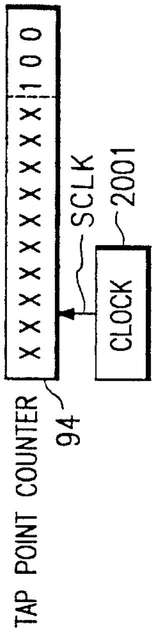

This is then loaded into tap point counter 94 (FIG. 21). The shifted mask 92 (FIG. 19 determines how many bits of counter 94 are significant.) This tap point, which is defined as the position in the serial register to be read first to the data bus, can be seen in FIG. 6, corresponding to pixel 40 controlled by bit B4 in half-register A.

Register A is selected, as opposed to register B, since the left most column bit equals 0 in FIG. 15. Had the left most position of the column address contained a 1, the B half of the serial register would have been selected.

Once the shifted tap point has been selected, clock 2001, operating in conjunction with the memory shift clock SCLK, serves to increment the tap point shift register in conjunction with data being read from the serial register. Thus, when the tap point register contains all 111's it signifies that the data from position 111 of half-register A, FIG. 6, is being read to the bus. This corresponds to pixel 46, memory bit B7. The tap point counter overflows to 000 as shifting begins from half-register B where memory positions B8 to B15 are in turn sent to the graphics display. Note that the register operation just described does not control the actual shifting out of data, but controls the reloading of data into the serial register.

Figure 7:
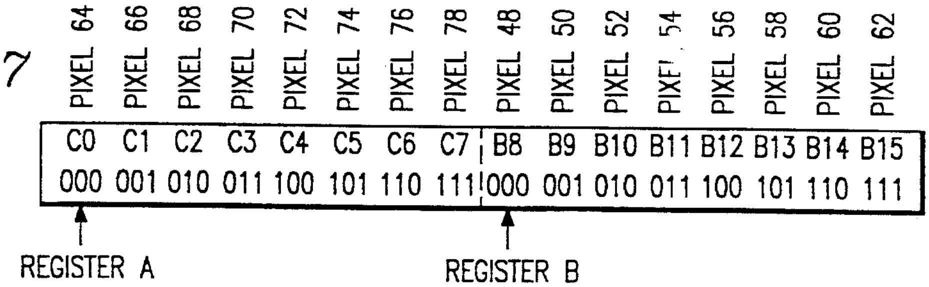

At this time, as shown in FIG. 7, half-register A is cleared and information from memory positions C0 to C7, the next memory row, are loaded into half-register A. This alternate operation will continue until the screen reaches the end of the row, i.e., pixel 79 is sent to the screen. The half-row reload requires an address, which points to the 1st bit in the half row being reloaded. This address comes from "incrementable copy of row address", 95. Register 95 is loaded from register 90 when register 91 is loaded from register 90. It is then incremented to the left-most bit of the column address to point to the next half row. Register 93 is used to determine the bit position for the increment (the bit to the left of the left-most 1). When the address is output, register 93 is also used to ensure that all bits to the right of this point are zero (signifying a zero tap address, pointing to the 1st bit in the shift register). Each time the counter overflows, the address in this register is output, and then incremented.

Figure 8:
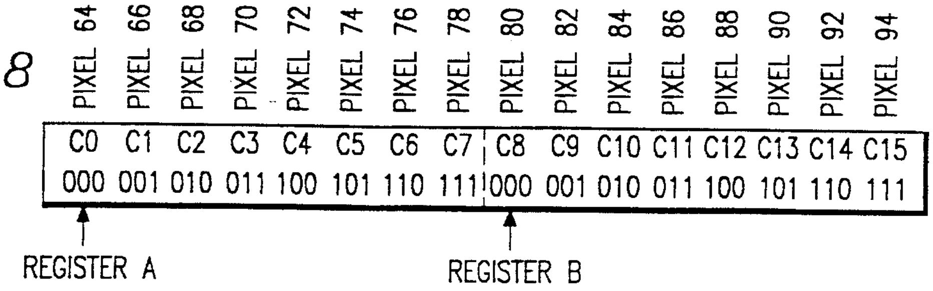

Thus, when the tap point SCLK clock 2001 again reaches 111 and pixel 62, memory location B15, is less than pixel 79 the tap point counter resets to 000 and, as shown in FIG. 8, as memory bits C0 to C7 are transferred from half-register A to the bus. At this time half-register B is loaded with memory bits C8 to C15. However, when the clock again arrives at 111 the fly back interval is also reached and the registers are reset with the next full line to be read to the screen as determined by the processor. At this time the cycle repeats and a new tap point is calculated.

If the new tap point indicates that the first bit to be read is in the B half of the register, which would be the case if pixel row 80 to 119 were to be next, then the A half of the register would appear as shown in FIG. 8 with the tap point at position C8. This would mean that the A half-register must be cleared immediately and loaded with memory bits D0 to D7 in preparation for the tap point counter again reaching 111 and rolling over so as to follow the readout of data from the first half-register A.

Split shift register VRAMs use an SCLK signal between a full shift register transfer cycle and the split transfer cycle. The present work recognizes that these two transfers should occur sequentially during the blanking period when the SCLK signal is disabled. The present embodiment advantageously identifies the interval between the two transfers and passes a signal to the palette SSRT pin in the SSRT mode and not nibble mode so that the circuitry generates an SCLK pulse at that time. This improvement provides a palette and clock generator with additional external control of the shift clock signal SCLK.

Figure 23:
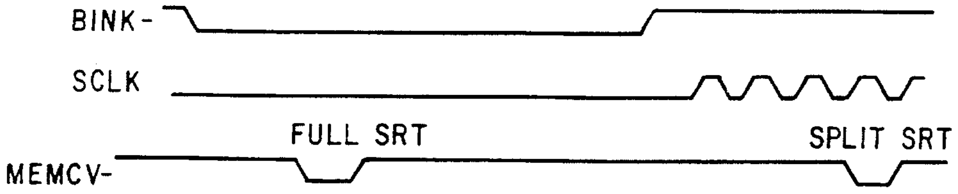
FIG. 23 a waveform diagram of signals in one form of shift register transfer.

In one split shift register application the full reload is performed during blanking as illustrated in FIG. 23. Then after SCLK has started again the split reload is initiated. However, this works provided the split reload happens before there have been enough SCLK pulses to move the serial data stream out of the first half and into the second half of the shift register 140. Often this is the case, but to realize a system which can have totally arbitrary boundaries (e.g. one that can pan horizontally), it is advantageous to avoid the realtime constraints that could be imposed if the first (or another early) SCLK pulse after blanking were to move the pointer out of the reloaded half.

Figure 22:
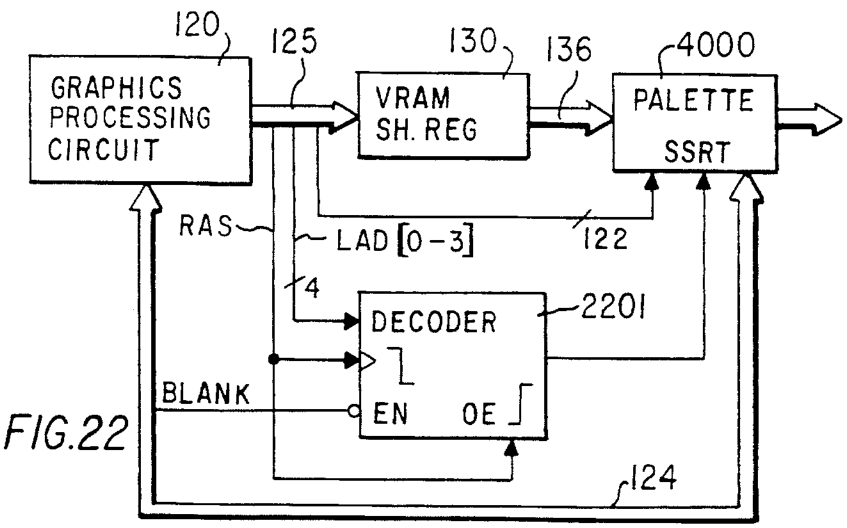
FIG. 22 is a block diagram of an improved circuit for insertion of a pulse during blanking for split shift register transfer.
Figure 24:
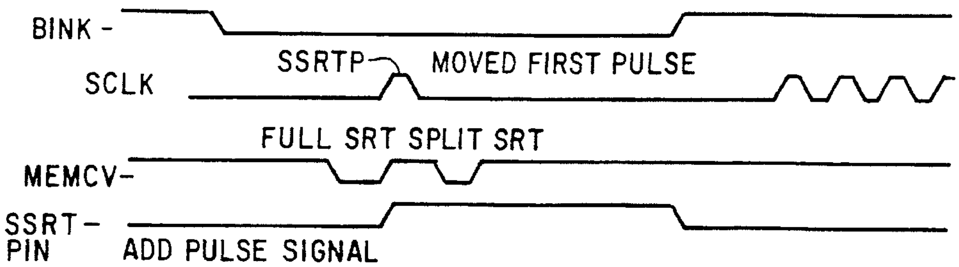
FIG. 24 is a waveform diagram of signals where a pulse is inserted during blanking in split shift register transfer.

FIG. 22 shows logic to identify a period where the extra SCLK pulse is to be advantageously inserted. In split serial register VRAM mode indicated by setting a SSV mode bit for the VRAM active, the TMS34020 GSP 120 generates split serial register transfer cycles for the VRAM. During horizontal blanking, a regular serial register transfer cycle is generated, to initialize the next VRAM row. This is immediately followed by a split serial register transfer cycle as shown in the waveform memcy- of FIG. 24, to configure the VRAM in split mode, and to ensure that the inactive half serial register contains undisplayed data rather than the data that was previously displayed.

For the operations to occur in the proper sequence, the SCLK input to the VRAM is clocked between the rising of TR-/QE- at the end of the normal transfer and the falling edge of RAS- at the beginning of the split transfer to ensure that the tap point presented during the ordinary serial register transfer cycle is not overwritten. A decoder logic circuit 2201 of FIG. 22 provides a signal to inform the video backend logic of palette 4000 when to insert this pulse. The circuit 2201 is suitably incorporated physically into GSP 120, or into VRAM 130 or palette 4000 as an improvement to any of them, or provided as separate logic on printed wiring board 105.

The decoder logic 2201 receives as input the status code output at the beginning of each GSP 120 memory cycle on the TMS34020 LAD bus 205. If 0100 is detected and the SF pin of TMS34020 is low (indicating an ordinary VRAM serial register transfer), the SSRT signal is asserted high on the falling edge of LCLK1 while CAS2- is low. This is coincident with the rising edge of TR-/QE-. SSRT remains asserted until a split serial register transfer cycle occurs. When the logic detects the 0100 status code and the SF pin high (indicating a split VRAM serial register transfer), the SSRT signal is deasserted low on the falling edge of CAS2-. The video backend logic in palette 4000 uses the rising edge of SSRT to insert a single SCLK pulse.

In FIG. 22, a TMS34020 GSP 120 is connected by bus 125 to VRAM 130 and shift register 139 is connected by bus 136 to palette 4000. VRAM 130 and shift register 139 are advantageously implemented as a split shift register VRAM as discussed in FIGS. 1–21, to minimize wasted memory space in the graphics system 100. Palette 4000 is connected to GSP 120 by buses 122 and 124. The SSRT input of palette 4000 is fed by the output of a decoder 2201 which detects a predetermined code on LAD lines 0–3 of LAD 205 of FIG. 2. This decoder is only enabled when the blanking signal is low from GSP 120. The decoder 2201 is clocked by the falling transition of the RAS (Row Address Strobe) signal. The output of the decoder is enabled by the rising transition of the RAS signal to drive the SSRT pin of palette 4000 and cause an insertion of an SCLK pulse as discussed using waveform diagrams FIGS. 23 and 24.

Figure 25:
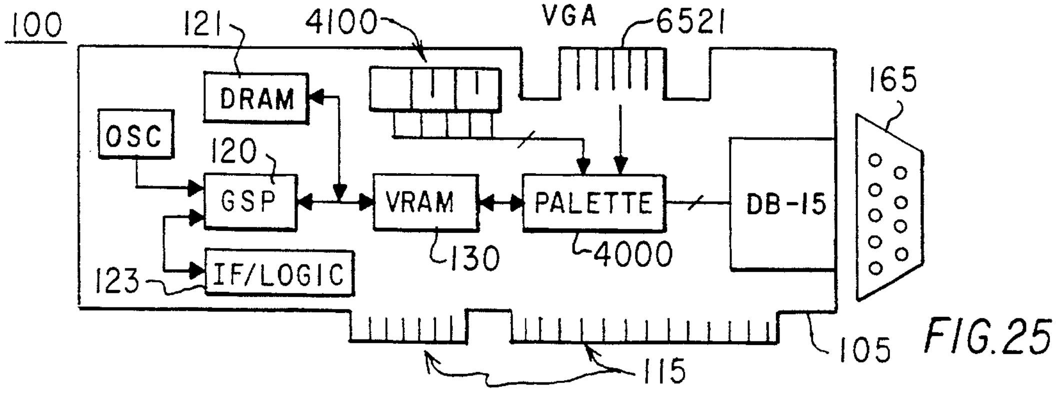
FIG. 25 is a pictorial sketch of a printed wiring board for a computer graphics system of FIG. 1.

In the pictorial sketch of FIG. 25 programmable palette 4000 is provided on a graphics system board 105. The board 105 is also stuffed with a 1 Megabit VRAM 130, a TMS 34020 GSP 120, DRAM 121, and a set of clock oscillators 4100. System board 105 is advantageously provided with opposite bus connectors, one for bus 115 and a feature connector 6521 for VGA pass through respectively. Optional interface logic 123 supplies logic functionality which may be desired outside of the main chips. Board 105 is inserted into the motherboard of a its host computer by the connector for bus 115.

Further in system board 105, a connector 165 supplies NTSC-standard composite video output to a color display device 170 of FIG. 1. Sync generation is incorporated on one of the color output channels, e.g. Green.

Figure 26:
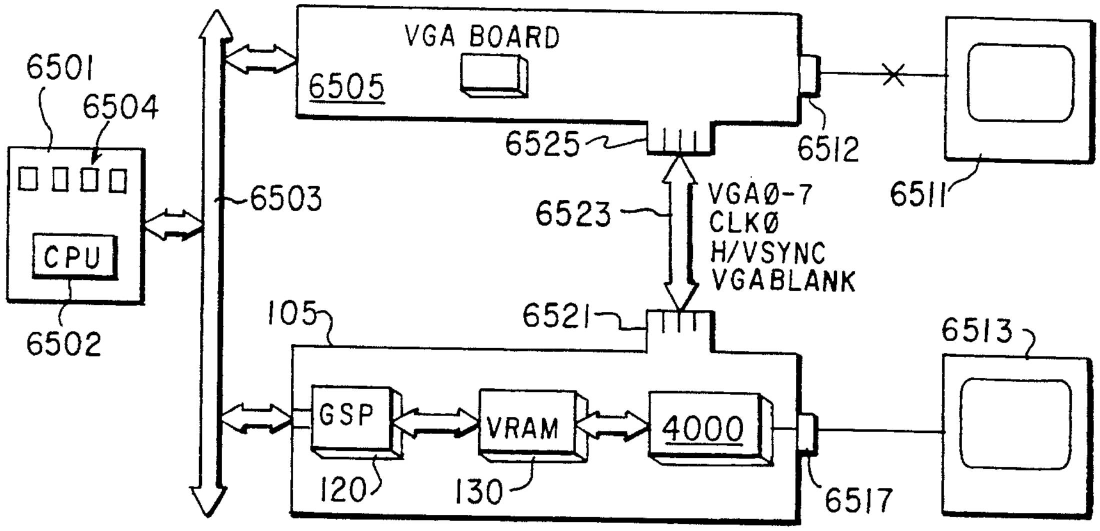

VGA pass through mode provides VGA and non-VGA displays with only one monitor. In FIG. 26 a computer has a motherboard 6501 with a microcomputer chip 6502 and memory chips 6504 mounted thereon. Motherboard 6501 is connected to a bus 6503. A VGA-compatible graphics board 6505 is connected to the motherboard 6501 by bus 6503. If only VGA were to be used, a monitor 6511 would be connected to a DB-15 video connector 6512 on board 6505. Board 6505 has graphics circuitry mounted on it, and produces color code signals according to the VGA standard. The circuitry is controlled by the microcomputer chip on motherboard 6501.

To provide advanced non-VGA displays, a board 105 of FIG. 1 is connected to bus 6503. Board 105 has graphics processor 120 and is responsive to control by the microprocessor 6502 such as an 80386 on motherboard 6501. A video memory 130 is mounted on printed wiring board 105 and is connected to the graphics processor 120 to produce color code signals on another bus 136 according to a second graphics standard such as the Texas Instruments graphics architecture (TIGA), for palette 4000 connected by printed wiring on board 105 to the VRAM 130. A feature connector 6521 on board 105 is connected by a VGA bus 6523 to a feature connector 6525 on graphics board 6505. Feature connector 6525 provides color code signals according to the VGA standard. Feature connector 6521 on board 105 inputs the VGA color code signals.

By virtue of VGA pass-through, monitor 6511 can be dispensed with, and monitor 6513 is connected to DB-15 video connector 6527 to display both VGA graphics and TIGA graphics as user selects.

Figure 31:
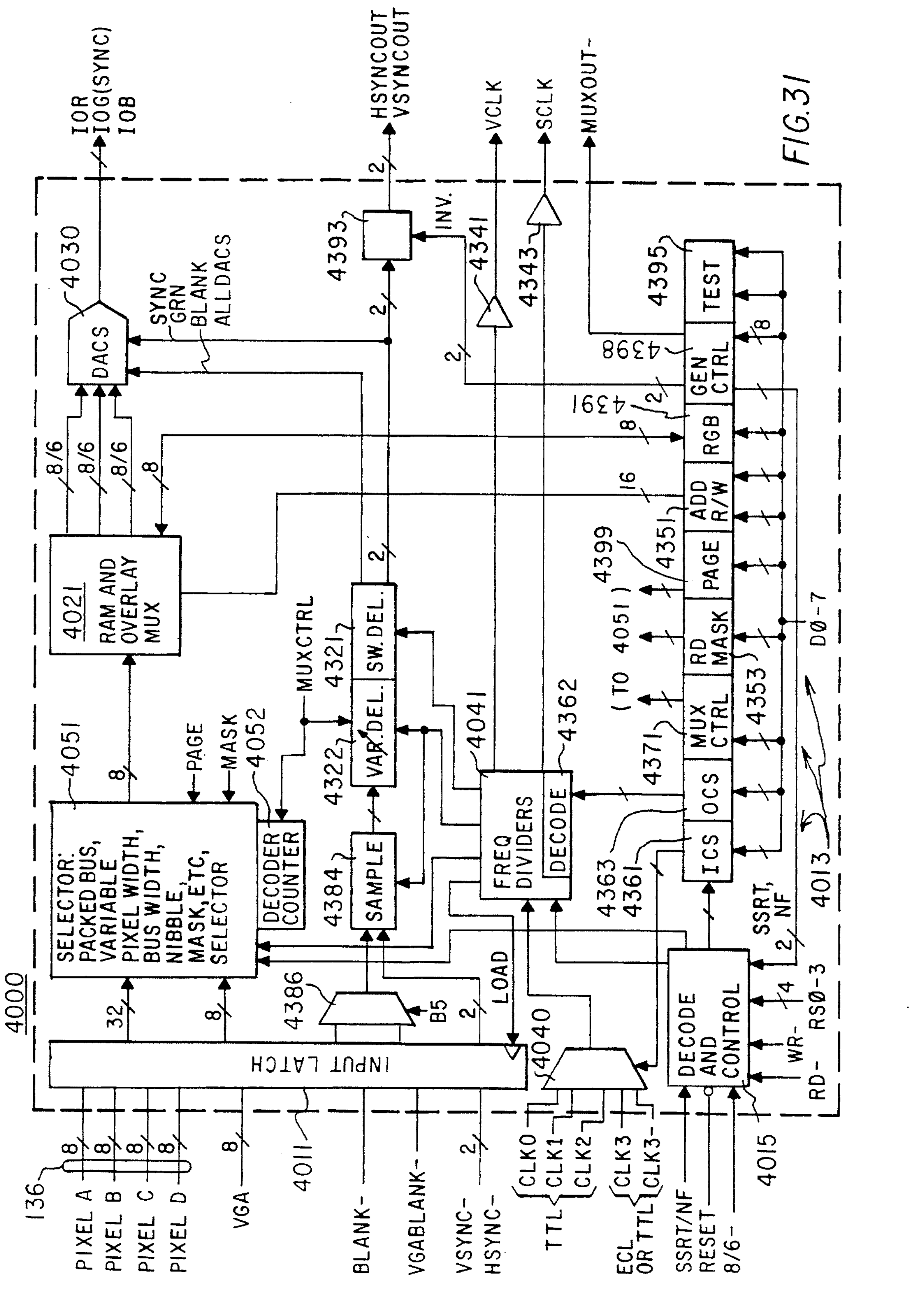
FIG. 31 is a block diagram of a palette device emphasizing clock and video control and other features.

Palette 4000 has an input register 4011 of FIG. 31 with a first area connected to the video memory 130 of FIG. 26 to enter a first set of color code bits according to TIGA architecture. Input register 4011 has a second area connected to the feature connector 6521 to enter a second set of color code bits according to the VGA standard. Look-up table memory 4021 of FIG. 31 supplies color data words in response to color codes from the input register 4011. Selector circuit 4051 is connected between the input register 4011 and the look-up table memory 4021. The selector circuit 4051 is connected via a control register 4371 to graphics processor 120 via bus 122 and is thereby controllable to transfer selected color codes on the selected bus 136 or 6523 according to the selected first or second graphics standard to the look-up table memory 4021.

Because of the way the hardware and software of a typical 80386 based computer such as an IBM-compatible PC (personal computer) works, boot-up operations shortly after the PC is powered up look for the VGA graphics board 6505 of FIG. 26, which is provided as a standard board in an IBM-compatible PC. If the VGA board 6505 is connected to an IBM monitor 6511, a separate monitor 6513 is needed to connect to board 105. During bootup, the PC CPU would find the VGA hardware 6505 and do the start-up sequence that would put text on the monitor 6511. Then when a high resolution graphics is requested, the system would turn off the VGA monitor 6511 or not utilize it and then enable monitor 6513. Since each monitor 6511 and 6513 can be the same kind of device, it desirable in many cases to use a single monitor. If both boards 6505 and 105 are to be used with only one monitor, the VGA pass through mode allows viewing VGA data such as the initially displayed prompt. VGA pass through advantageously obviates any need to implement VGA itself on palette 4000 or anywhere on board 105. VGA board 6505 responds to the CPU on motherboard 6501 during boot-up, provides the initial text and initial prompt directly to monitor 6513 by virtue of the VGA pass through mode provided in palette 4000, whereupon a switch can be made to the high resolution mode provided by board 105. Thus, there is no need for separate monitors for the VGA board 6505 and for high resolution board 105. Board 105 needs no VGA power up initializing software or other duplication of VGA.

In addition, the VGA pass through mode allows VGA compatible application software to be executed by CPU 6502 and VGA graphics created by board 6505 or on the motherboard itself, whereupon the VGA graphics are passed through board 105 in the VGA pass-through mode. When high resolution mode is called for, the graphics are controlled by the CPU on board 6501 but set up by graphics processor 120 (such as TMS 34010 or 34020 GSP from Texas Instruments Incorporated using the TIGA TI Graphics Architecture), passed through the VRAM 130 and palette 4000 to monitor 6513.

The pass-through improvement does not depend on particular characteristics of VGA or TIGA. Accordingly, any two or more graphics architectures, standards or methods can be accommodated.

Both a 8/6- DAC width selection feature and the VGA pass through feature work advantageously together. VGA has a basic 6 bit graphics width and a wider 8 bit feature. In VGA the 6 bits are in the least significant end of each byte. When the palette RAM 4021 is loaded with color data words (as contrasted with accessing RAM 4021 with VRAM color codes which in VGA need to be in the least significant 6 bits of each byte when the basic 6 bits are used), the data for each color data word arrives at the palette in the least significant 6 bits. However, the output should be made to be what would appear if the least significant 6 bits were loaded in the most significant six bit positions of the three bytes in each color data word. The 8 bit/6 bit select forces the 6 least significant RAM 4021 bits to drive the most significant inputs of the DACs. Unlike the 8/6 select for initially loading the locations in RAM 4021, the VGA pass through mode for its part advantageously bypasses the internal multiplexing to allow 6 VGA color code VRAM bits to go straight to the RAM 4021 address input decoders to access the color data words. One set of features avoids interference to VGA bits by VGA pass-through for palette access, and also causes the DACs to produce their highest output possible for a VGA signal (8/6 select feature) for best signal-to-noise ratio.

Figure 27:
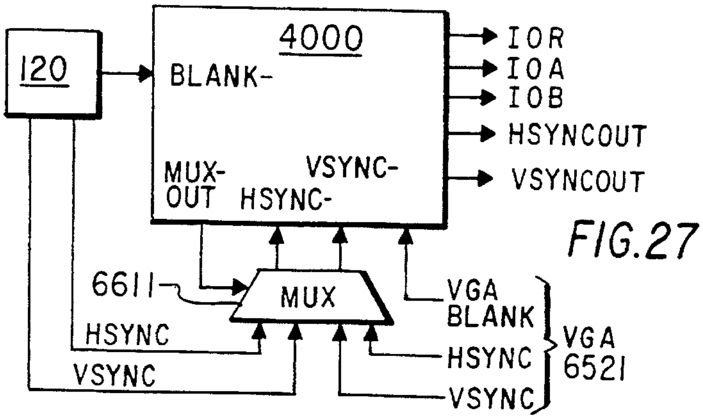
FIG. 27 is a block diagram of sync multiplexing for a palette device.

On boot-up, the palette 4000 defaults to the CLK0 clock input which is connected via cable 6523 to the VGA feature connector 6525 so that palette 4000 derives its dot clock from the VGA board 6505 and is synchronized to the VGA pixels as well. Cable 6523 not only sends pixels on lines VGAO-7 but also sends VGA horizontal and vertical sync which are selected by a multiplexer 6611 of FIG. 27 and fed to HSYNC and VSYNC inputs of palette 4000. Also the VGA blanking signal is supplied by cable 6523. Advantageously, the function of multiplexer 6611 is implemented implicitly by tri-state buffers on the VGA board 6505 and in graphics processor 120 already, whereas both of the blank signals BLANK- and VGABLANK- are brought on-chip in the preferred embodiment palette device 4000 for selection because of their often-more-critical timing.

Figure 28:
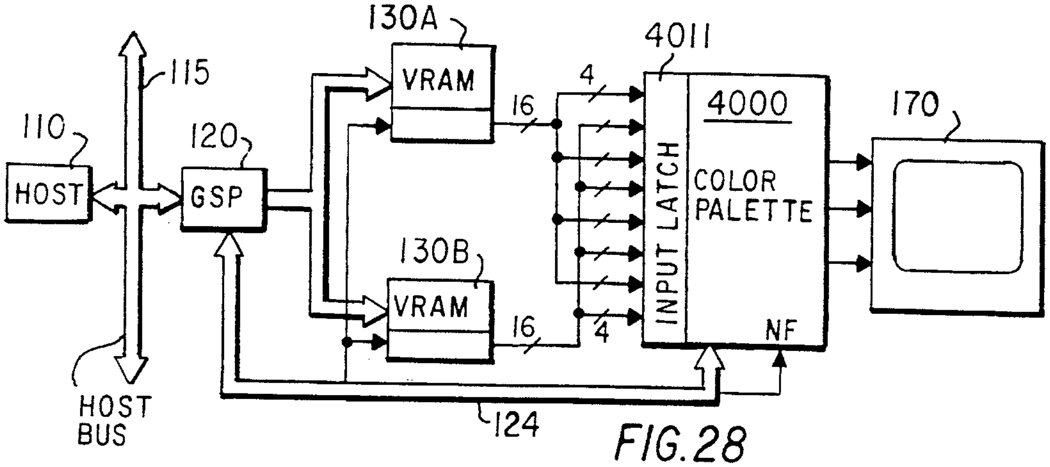
FIG. 28 is a block diagram of a computer graphics system using two video RAMs in a nibble mode.

Palette device 4000 has a nibble mode accommodating the improved computer graphics system of FIG. 28. In FIG. 28 host computer 110 supplies data via host bus 115 to GSP 120. GSP 120 controls two VRAMs 130A and 130B. VRAM 130A has 4 VRAM sections with four-bit nibble-wide shift registers 139A (not shown) operating in parallel to supply 16 bits of output connected to the high four nibbles of each byte of a 4 byte-wide input latch 4011 in palette 4000 which feeds monitor 170. VRAM 130B also has 4 VRAM sections each with nibble-wide output and has its 16 bits of output connected to the low four nibbles respectively of the four bytes of input latch 4011. In nibble mode, palette 4000 can switch between VRAM 130A and VRAM 130B to switch between two images for example. Nibble flag NF input controls the switch because a high at NF selects the four high nibbles for input and a low at NF selects the four low nibbles for input. Advantageously, the same pair of VRAMs 130A and 130B in the same system but loaded with different nibbles can be used to produce 8 bit color codes for one image instead of 4 bit color codes for two images. To accomplish this latter two image operation, the control register 4371 is loaded with mode bits calling for the latch 4011 to deliver color codes in four 8-bit bytes, and the nibble mode bit is zeroed in another control register 4398 as described in connection with Table 6 hereinbelow.

In an alternative nibble embodiment, the high and low nibbles are entered in opposite halves of the input latch 4011. A selector circuit is provided to have modes which select either the high or low nibble or to combine nibbles from the high and low halves when desired. In either the preferred high-low-high-low-high-low-high-low embodiment or the alternative high-high-high-high-low-low-low-low embodiment or in any other embodiment mixture of nibbles, the palette 4000 advantageously provides a nibble circuit responsive to a high-low state of a nibble input and connected between the input latch 4011 and the look-up table memory 4021 to pass a high nibble from plural bytes in the input latch to the look-up table memory or to pass a low nibble from plural bytes in the latch to the look-up table memory, depending on the high or low state of the nibble input.

In the preferred embodiment of palette 4000, the high/low nibble NF input of FIG. 28 is combined in functionality with the SSRT input of FIG. 22. FIG. 31 shows these inputs combined as programmable nibble select pin SSRT/NF the function of which is established by control register 4398, see Table 6. Multiple functionality for one pin means that an extra pin does not have to be included, and thus increases the functionality of the palette 4000 given a maximum number of pins allowed for application reasons for the package.

These functions SSRT and nibble mode are able to be regarded as mutually exclusive in the present embodiment because SSRT is useful at resolutions like 1280×1024 pixels and nibble flag is useful at resolutions like 1K×768. The first time that SSRT pulse insertion makes sense are higher resolutions than those where nibble flag is used. These settle out at different resolutions because 1280 is the first line resolution which not a power of two. This means that if a VRAM constructed to store a scan line 2048 pixels wide is used, then VRAM space might not be efficiently used unless split shift register transfer is employed as in FIGS. 1–24. The end of line 0 coincides with the beginning of line 1 and the total image is compressed into the VRAM. So out of 2048 the first 1280 are line 1, the next 768 completes that 2048, and the balance are on the next line, and the tap point is different from line to line.

Nibble mode is not limited to low resolutions, but is particularly useful for low-end systems with 4 bits per pixel distributed across a wider (e.g. 32 bit) data path. As an option in such a low-end system, the user would find it desirable to add a module that provides another additional 4 bits per pixel through that 32 bit data path. The nibble flag allows one to plug in an additional module from a low-end system as in FIG. 28 to provide either or both a switchable 2-image nibble pixel capability or an 8-bit per pixel capability by adding VRAM 130B and not changing connections to the palette from the VRAM 130A already present. Thus there is a practical and technological dividing line that allows a combination of the two functions as if they were mutually exclusive.

Figure 29:
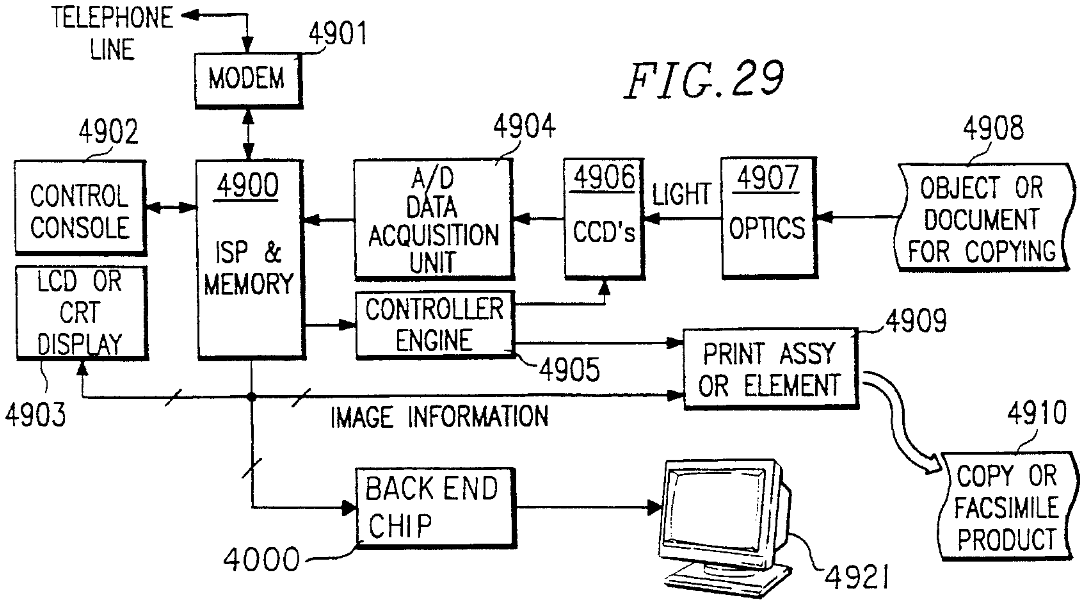
FIG. 29 is a block diagram of a combined facsimile and photocopying printer system.
Figure 30:
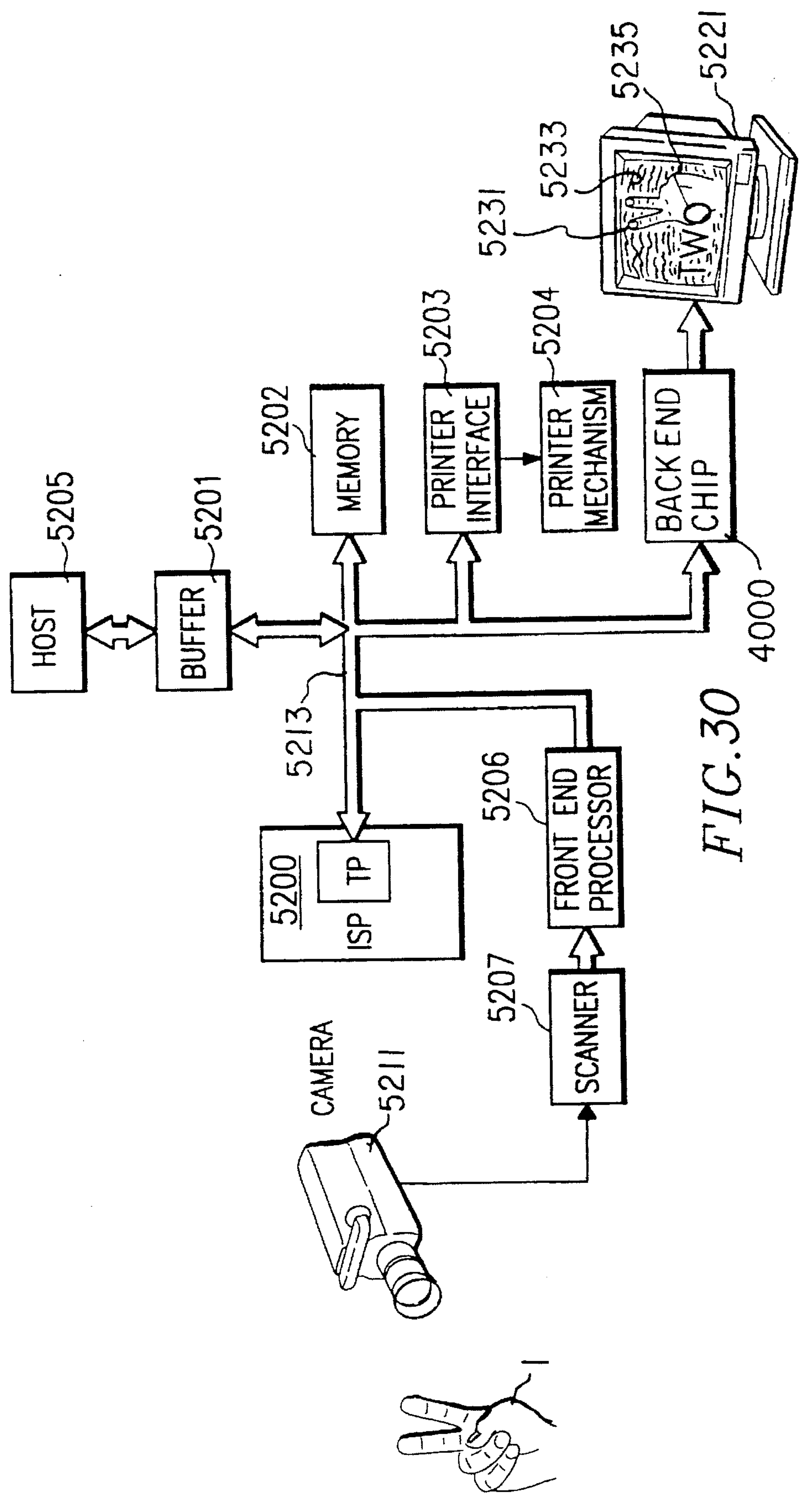
FIG. 30 is a block diagram of a computer graphics and image recognition system with printer and video display.

FIGS. 29 and 30 show various implementations of an image system processor with various applications. For example, FIG. 29 shows a personal desk top imaging computer which has multiple input and output devices. This system acts as a personal computer or workstation, a facsimile system, a printer system, and OCR (optical character recognition system, and a general image recognition system, all in one. As shown, an object or document for copying 4908 is imaged or sensed with optics 4907 and charge-coupled device image sensor CCD 4906. CCD 4906 acts as an example of a light sensing device adapted to produce an electrical input signal in response to an image presented to the light sensing device. This sensed information is then converted from analog to digital information with A/D data acquisition unit 4904 which provides sensed digital information for the ISP-and-memory 4900 imaging system processor of patent application Ser. No. 08/263,501 filed Jun. 21, 1994, a continuation of Ser. No. 08/135,754 filed Oct. 12, 1993 and now abandoned, a continuation of Ser. No. 07/933,865 filed Aug. 21, 1992 and now abandoned, a continuation of Ser. No. 435,591 filed Nov. 17, 1989 and now abandoned, entitled "Multiprocessor with Crossbar Link of Processors and Memories", filed Nov. 17, 1989 and incorporated herein by reference. The ISP-and-memory 4900 is one of many possible examples of a processing circuit connected to the light sensing device to generate a display control signal and color codes representing color information in response to the image.

Controller engine 4905 provides the necessary timing signals to both CCD unit 4906 and print assembly 4909. This print assembly provides documents 4910. Another input or output capability is a telephone line shown by modem 4901 providing communication to other units. Modem 4901 is connected to ISP-and-memory 4900 to couple color information in color data words to a communications path such as the telephone line or a radio link or to another computer or other electronic device. Control console 4902 suitably consists of a keyboard, mouse or other imaging devices previously described. LCD or CRT display 4903 would be used for providing information to the user. LCD Liquid Crystal Display 4903, with ISP-and-memory 4900 and print assembly 4909 are connected by an image information bus, which contains data of images which have been processed. Palette device 4000 is fed by ISP-and-memory 4900 and in turn supplies a display output for a color display device 4921, such as a raster-scanned CRT monitor.

FIG. 30 describes an application of an ISP-and-memory 5200 in a network configuration with a host 5205 which provides image information collected off-line either remotely or in some central office and then distributed to buffer 5201 which is then used by the imaging PC configuration to provide information to the image system processor 5200. An alternative method of obtaining information is via selectable camera 5211 or a scanner 5207 working in conjunction with front end processor 5206. This version of an imaging system advantageously permits resource sharing by networking image collection devices. A printer port also is provided via printer interface 5203 and its connection to printer mechanism 5204 which allow the user to print compound documents which contain textual and graphic information in addition to images or enhanced images via the image system processor 5200. Memory 5202 supplements the memory in ISP 5200. Palette device 4000 is connected to a system bus 5213 and in turn provides analog color signals to a color display device 5221. While this device 5221 is shown as a CRT monitor, it can also be any color display device such as a color printer, that is improved by look-up of color data words in response to color codes.

In operation the camera 5211 senses an image of hand H showing two upstretched fingers communicating the number two, or V for victory. Front end processor 5206 and ISP 5200 run image sharpening algorithms and image recognition routines on the sharpened image. The system displays a color image 5231 of the upraised hand H, with an attractive multi-color graphics background 5233 as well as an alphabetic overlay of the number TWO 5235 which has been recognized by the system.

The compact structure of the image processing system, where all of the parallel processing and memory interaction is available on a single chip coupled with a wide flexibility of processor memory configurations and operational modes, all chip controlled, contributes to the ability of the imaging system to accept image data input as well as ASCII input and to allow the two types of data to be simultaneously utilized. Palette 4000 further enhances the flexibility and functionality of the image processing system.

The user can utilize spreadsheets and other information obtaining information both from a keyboard or other traditional manner in ASCII code as well as from a visual or video source such as camera 5211 or video recorder device or any other type of video input using an imaging code input. The video input can be recorded on tape, on disc or on any other media and stored in the same manner as information is currently stored for presentation to a computer.

Some of the features that an imaging system can have are 1) acquiring images from cameras, scanner and other sensors; 2) understanding the information or objects in a document; 3) extracting pertinent information from a document or picture; 4) navigating through a data base combining images as well as textual documents; 5) providing advanced imaging interfaces, such as gesture recognition.

The system is useful to create instant data bases since the information put into the system can be read and the informational content abstracted immediately without further processing by other systems. This creates a data base that can be accessed simply by a match of particular words, none of which had been identified prior to the storage. This can be extended beyond words to geometric shapes, pictures and can be useful in many applications. for example, a system can be designed to scan a catalog, or a newspaper, to find a particular object, such as all of the trees or all of the red cars or all trucks over a certain size on a highway. Conceptually then, a data base is formed by words, objects, and shapes which the image processor abstracts and makes useful to the user.

One use of such a system with imaging capability is that both still and moving pictures and video can be integrated into a system or into any document, simply by having the picture scanned by the system. The information is then abstracted and the output made available to the imaging system for further processing under control of the user.

One of the reasons why so much imaging capability is available under the system shown is that the single chip 5200 contains several processors working in parallel together with several memories, all accessible under a crossbar switch which allows for substantially instantaneous rearrangement of the system. This gives a degree of power and flexibility not heretofore known. This then allows for a vast increase in the amount of imaging processing capability which can be utilized in conjunction with other processing capability to provide the type of services not known before. Some example of this would be restoration or photographs and other images, or the cleaning of facsimile documents so that extraneous material in the background is removed yielding a received image as clear or clearer than the sending image. This entire system can be packaged in a relatively small package mainly because of the processing capability that is combined into one operational unit. Bandwidth limitations and other physical limitations such as wiring connections, are eliminated.

An expansion of the concept would be to have the imaging system built into a small unit which can be mounted on a wrist and the large video display replaced by a small flat panel display so that the user can wave a finger over top of the display for input as shown in FIG. 30. The imaging system, as previously discussed, recognizes the various movements and translates the movements into an input. This effectively removes the problems of keyboards and other mechanical input devices and replaces them with a visual image as an input. The input in this case could also be a display, serving a dual purpose. This then makes optical character recognition an even more important tool than presently utilized.

In the present improved backend chip 4000 the architecture is free of horizontal frequency clock distribution. Applications in CAD/CAM workstations, image, and video processing are suited to this architecture.

In FIG. 31, programmable color palette chip 4000 has an input latch 4011 connected to a 32 bit wide set of input pins P0–P31 and to low active HSYNC-, VSYNC- and BLANK- inputs from bus 124. A register map 4013 has inputs for read and write strobes (RD-, WR-), four register select inputs RS0-RS3 to a decode and control circuit 4015 and data pins D0-7 to bus 122 for loading or programming palette chip 4000.

A circuit 4015 configures the palette 4000 on power-up and return from RESET and further has a 8/6-select pin. The 8/6- pin is used to select an 8 or 6 bit wide data path to a 256×24 color palette RAM 4021. With the 8/6- input held low, data on the lowest 6 bits of the data bus are internally shifted up by 2 bits to occupy the upper 6 bits, and the bottom 2 bits are then zeroed. This operation utilizes the maximum range of DACs (digital-to-analog converters) 4031, 4033 and 4035.

A clock selector circuit 4040 has five clock inputs CLK0-3 and CLK3- from dot clocks 4100 of FIG. 25, and is programmed by input clock selection register ICS 4361. Clock selector circuit 4040 supplies clock pulses to programmable frequency dividers also called clock control block 4041 which is programmed by decode from an output clock selection register OCS 4363. Two buffered outputs 4341 and 4343 for shift clock SCLK and video clock VCLK are provided by the clock selector circuit 4041.

The clock source used at power-up is specified by input pins and can also be overridden by software selection afterwards. A dot clock frequency is the pixel rate to monitor 170.

Above about 100 MHz. ECL oscillators are more readily available than TTL oscillators at present. Thus palette 4000 preferably can receive either a single-ended TTL input or a differential input which is the standard mode of input for ECL oscillators which provide two signals which are the inverse of each other in order to achieve a common mode rejection. This utilizes two pins CLK3 and CLK3-. So there are two pins being driven to obtain 135 MHz. dot clock rate for example. By programming ICS 4361, pins CLK3 and CLK3- can also be configured single ended TTL for enhanced clock input flexibility.

Since different screen resolutions call for dot clock rates which are not multiples of each other, the present selection circuitry offers an advantage over an alternative embodiment of frequency divider circuitry alone for generating different dot clock frequencies. The use of multiple oscillators and a selector circuit 4040 also is believed to offer a more stable clock than the alternative embodiment of a phase lock loop that takes an input oscillator frequency and multiplies it to a higher frequency level. However, now in the future, PLL technology can offer more stability for video purposes in the higher frequency level so obtained, and thus is an alternative embodiment.

In the embodiment of FIGS. 25 and 31, multiple desired frequencies are selected. Each frequency corresponds to a desired resolution of the monitor as one type of video display 170. Thus a 640×480 resolution calls for 25 MHz. oscillator. A 1024×768 resolution is obtained with a 64 MHz. oscillator. In other words, the monitor is provided with a dot clock rate of 64 MHz. to obtain the latter resolution.

Present-day resolutions from 320×200 up to 1600×1200 and future improvements are effectively supported by palette device 4000. The clock selection feature of the palette 4000 enables it to be programmed for use in improving any of a wide variety of systems of different resolutions, enhancing its breadth of application.

For example, medical imaging technology demands high resolution and processor speed has a lower importance. A tradeoff is involved in that high resolution implies many pixels and assumes a great deal of processor capability to generate them. On the other hand, CAD/CAM applications (computer aided design and computer aided manufacturing) require fast draw rates and lower resolutions are acceptable. To support a variety of hardware and software applications, palette 4000 desirably supports a variety of resolutions. Each of those resolutions implies a specific input dot clock frequency.

Multiplexing circuitry MUX 4051 advantageously configures the palette 4000 to the amount of RAM available. For example, if only 512K of memory were available, a 1024 by 768 mode with 4 bit-planes can be implemented using a 16-bit wide pixel bus connected to inputs P0–15. If at a later date a further 512K of memory were added, the other 16 bits P16–31 are used, and a 1024×768 mode with 8 bit-planes is implemented without any increase in pixel bus speed.

The shift clock SCLK and video clock VCLK are programmably divided from the dot clock by ratios as shown in Table 3*b*. The divide ratio from dot clock to shift clock is equal to the number of pixels per bus load because the shift clock related pulse LOAD enters multiple pixels simultaneously into input latch 4011 while the dot clock controls the faster multiplexed transfer by circuit 4051 of color codes pixel-by-pixel to palette RAM 4021.

The register map 4013 includes input clock select register 4361, output clock select register 4363, mux control register 4371, read mask register 4353, page register 4399, RAM address registers 4351 for read and write mode, color palette data holding register 4391 for entering R,G,B bytes into RAM 4021, a general control register 4398 that, among other things, configures logic 4393 for sync output, and test registers 4395 for accumulation values and analog comparisons.

FIG. 31 also shows a blanking sampling circuit 4384. A selector circuit 4386 selects VGABLANK- or BLANK-. Blanking for VGA is given a fixed switch-selected delay in circuit 4321. Blanking BLANK- passes through a 0–32 dot clock period mode dependent variable delay circuit 4322 followed by the delay in circuit 4321. The sync signals VSYNC- and HSYNC- are delayed by a similar mode-dependent delay followed by a fixed switch-selected delay in circuit 4322, 4321 which feeds sync logic 4393 to the HSYNCOUT and VSYNCOUT outputs. p The TLC34075 Graphics Interlace Chip is designed to provide lower system cost with a higher level of integration by Incorporating all the high speed turning, synchronizing, and multiplexing logic usually associated with graphics systems into one device thus greatly reducing chip count. Since all high speed signals (excluding clock source) are contained on-chip, RF Noise considerations are simplified. Maximum flexibility is provided through the pixel multiplexing scheme which allows for 32-, 16-, 8-, and 4-bit pixel busses to be accommodated without any circuit modification, this enables the system to be easily reconfined for varying amounts of available video RAM. Data can be split into 1, 2, 4, or 8 bit-planes. The device is software compatible with the IMSG 176/8 and Bt476/8 color palettes. See FIG. 32.

The device features a separate VGA bus which allows data from the feature connector of most VGA supported Personal Computers, to be led directly into the palette without the need for external data multiplexing. This allows a replacement graphics board to remain 'downwards compatible' by utilizing the existing graphics circuitry often located on the motherboard.

Also provided is a True Color mode in which 24 (3 by 8) bits of color information are transferred directly from the pixel port to the DACs. In this mode of operation, an overlay function is provided using the 8 remaining bits of the pixel bus.

The TLC34075 has a 256 by 24 color lookup table with triple 8-bit video D/A converters capable of directly driving a doubly terminated 75-Ω line. Sync generation is incorporated on the Green output channel. Hsync and Vsync are fed through the device and optionally inverted to indicate screen resolution to the monitor. A palette page register is used to provide the additional bits of palette address when 1, 2, or 4 bit-planes are used. This allows the screen colors to be changed with only one MPU write cycle.

Clocking is provided through one of four inputs (3 TTL and 1 ECL/TTL compatible), and is software selectable. The Video and Shift Clock outputs provide a software selected divide ratio of the chosen clock input.

The TLC34075 can be connected directly to the serial port of VRAM devices, eliminating the need for any discrete logic. Also provided is support for Split Shift Register Transfers.

CIRCUIT DESCRIPTION

MPU Interface

The processor interface is controlled via read and write strobes (RD-, WR-), four register select pins (RS0–RS3), and the 8/6- select pin. The 8/6- pin is used to steel between an 8- or 6-bit wide data path to the color palette RAM, with the 8/6- pin held low, data on the lowest 6 bits of the data bus are internally shifted up by 2 bits to occupy the upper 6 bits at the Output MUX, and the bottom 2 bits are then zeroed. This operation is carried out in order to utilize the maximum range of the DACs.

The internal register map is shown in table 1. The MPU Interface operates asynchronously, with data transfers being synchronized by internal logic. All the register locations support read and write operations.

TABLE 1

Internal Register Map.

| RS3 | RS2 | RS1 | RS0 | REGISTER ADDRESSED by MPU |
|---|---|---|---|---|
| 0 | 0 | 0 | 0 | Palette address register - write mode |
| 0 | 0 | 0 | 1 | Color palette holding register |
| 0 | 0 | 1 | 0 | Pixel read mask |
| 0 | 0 | 1 | 1 | Palette address register - read mode |
| 0 | 1 | 0 | 0 | Reserved |
| 0 | 1 | 0 | 1 | Reserved |
| 0 | 1 | 1 | 0 | Reserved |
| 0 | 1 | 1 | 1 | Reserved |
| 1 | 0 | 0 | 0 | General control register |
| 1 | 0 | 0 | 1 | Input clock selection register |
| 1 | 0 | 1 | 0 | Output clock, selection register |
| 1 | 0 | 1 | 1 | MUX control register |
| 1 | 1 | 0 | 0 | Palette Page register |
| 1 | 1 | 0 | 1 | Reserved |
| 1 | 1 | 1 | 0 | Test register |
| 1 | 1 | 1 | 1 | Reset state |

Color Palette

The color palette is addressed by one internal 8-bit registers for reading/writing data from/to the RAM. These registers are automatically incremented following a RAM transfer allowing the entire palette to be read/written with only one access of the address register. When the address register increments beyond the last location in RAM It is reset to the first location (address 0). All read end write accesses to the RAM are asynchronous to SCLK, VCLK or Dot Clock but performed within one Dot Clock end so do not cause any noticeable disturbance on the display.

The color RAM is 24 bit wide for each location end 8 bit wide for each color. Since all the MPU access is 8 bit wide, the data stored in the color palette will be 8 bits even when 6 bit mode is chosen (8/6- =0). If 6 bit mode is chosen, the 2 MSB's in the color palette will have the values being written. However, if they are read back in the 6 bit mode, the 2 MSB's will be 0's. The Output MUX attar the color palette will shift the 6 LSB bits to the 6 MSB positions and fill the 2 LSBs with 0's, then feed them to the DAC. The Test Register and the One's Accumulation Register will both take data before the Output MUX to give the user the maximum flexibility.

The Color Palette Access is described in the following 2 sections.

Writing To Color Palette RAM

To load the color palette, the MPU must first write to the address register (write mode) with the address where the modification is to start. This is then followed by three successive writes to the palette holding register with 8 bits of red, green, and blue data. After the blue write cycle, the three bytes of color will concatenated into a 24-bit word and are written to the RAM location specified by the address register. The address register then increments to the next location which the MPU my modify by simply writing another sequence of red, green, and blue data. A block of color values in consecutive locations may be written to by writing the start address and performing continuous Red, Green, and Blue write cycles until the entire block has been written.

Reading From Color Palette RAM

Reading from the palette is performed by writing to the address register (read mode) with the location to be read, this then initiates a transfer from the palette RAM into the holding register, followed by an increment of the address register. Three successive MPU reads from the holding register will produce red, green, and blue color data (6 or 8 bits depending on the 8/6- mode) for the specified location. Following the blue read cycle, the contents of the color palette RAM at the address specified by the address register are copied into the holding register and address register is again incremented. As with writing to the palette, a block of color values to consecutive locations may be read by writing the start address and performing continuous Red, Green, and Blue read cycles until the entire block has been read.

Palette Page Register

The palette page register appears as an 8-bit register on the register map (see Table 1). Its purpose is to provide high speed color changing by removing the need for palette reloading. When using 1, 2 or 4 bit planes the additional planes are provided from the page register, e.g. when using 4 bit-planes, the pixel inputs would specify the lower 4 bits of the palette address with the upper 4 bits being specified from the page register. This gives the user the capability of selecting from 16 'palette pages' with only one chip access, thus allowing all the screen colors to be changed at the line frequency. A bit-to-bit correspondance is used, therefore in the above configuration, page register bits 7 through 4 would map onto palette address bits 7 through 4 respectively. This is illustrated below.

NOTE: The additional bits from the page register are inserted before the read mask and are hence subject to masking.

TABLE 2

Allocation of Palette Page Register Bits.

| No. Bit Planes | msb | Palette Address Bits | | | | | | lsb |
|---|---|---|---|---|---|---|---|---|
| 8 | M | M | M | M | M | M | M | M |
| 4 | P7 | P6 | P5 | P4 | M | M | M | M |
| 2 | P7 | P6 | P5 | P4 | P3 | P2 | M | M |
| 1 | P7 | P6 | P5 | P4 | P3 | P2 | P1 | M |

Pn = n bit from page register
M = bit from pixel port

Input/Output Clock Selection & Generation

The TLC34075 provides maximum five clock inputs. Three of them am dedicated to TTL inputs. The diner two can be selected as either one ECL Input or two extra TTL inputs. The TTL inputs can be used for video rates up to 80 MHz, above which an ECL clock source can be used, although the ECL clock may also be used at lower frequencies. The dual mode clock input (ECL/TTL) is primarily an ECL input but can be used as a TTL compatible input of the Input Clock Selection Register is so programmed. The clock source used at power-up is CLK0, an alternative source can be selected by software during normal operation. This chosen clock input is used unmodified as the Dot Clock (representing pixel rate to the monitor). The device does however allow for user programming of SCLK and VCLK outputs (shift and video clocks) by using Output Clock Selection register. The Input/Output Clock Selection registers are shown in Table 3*a* & 3*b*.

SCLK is designed to directly drive the VRAMs and VCLK is designed to work with the video control signals like BLANK and SYNC's. While SCLK and VCLK are designed as general purpose shift clock and video clock, they are also considered to work with TMS340x0 GSP family directly. So, while SCLK and VCLK can be selected independently, there is still a relationship between the two as discussed in the following descriptions. The system consideration has been covered in the design and leave maximum freedom to users.

Figure 33:
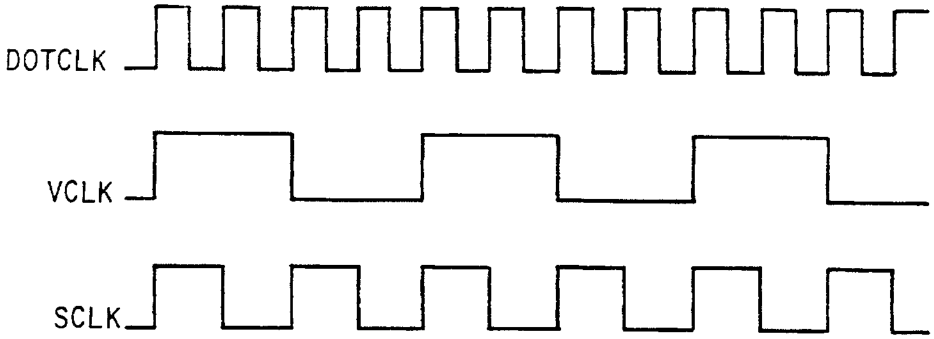
FIG. 33 is a waveform diagram of dot clock (pixel clock), video clock VCLK and shift clock SCLK waveforms in one operating mode of the palette device of FIGS. 31 and 32.

Internally both SCLK and VCLK are generated from a common clock counter which is counted at the rising edge of the DOTCLK. When VCLK is enabled. It's in phase with SCLK as exemplified in FIG. 33.

TABLE 3a

Input Clock Selection Register Format

| Input Clock Selection Register Bits (1) | | | | |
|---|---|---|---|---|
| 3 | 2 | 1 | 0 | Function (2) |
| 0 | 0 | 0 | 0 | Select CLK0 as clock source* |
| 0 | 0 | 0 | 1 | Select CLK1 as clock source |
| 0 | 0 | 1 | 0 | Select CLK2 as clock source |
| 0 | 0 | 1 | 1 | Select CLK3 as TTL clock source |

TABLE 3a-continued

Input Clock Selection Register Format

| Input Clock Selection Register Bits (1) | | | | |
|---|---|---|---|---|
| 3 | 2 | 1 | 0 | Function (2) |
| 0 | 1 | 0 | 0 | Select CLK3− as TTL clock source |
| 1 | 0 | 0 | 0 | Select CLK3 & CLK3− as ECL clock source |

*CLK0 is chosen at power-up as are required for VGA pass-through.
NOTE 1: Register bits 4, 5, 6 & 7 have 'Don't Care' conditions.
NOTE 2: When the clocks are selected from one mode to the other, a minimum 30 ns is needed before the new clocks are stablized and running.

TABLE 3b

Output Clock Selection Register Format

| | Output Clock Selection Register Bits (1) | | | | | | |
|---|---|---|---|---|---|---|---|
| | 5 | 4 | 3 | 2 | 1 | 0 | Function (2) |
| * | 0 | 0 | 0 | x | x | x | VCLK/1 output ratio |
| * | 0 | 0 | 1 | x | x | x | VCLK/2 output ratio |
| * | 0 | 1 | 0 | x | x | x | VCLK/4 output ratio |
| * | 0 | 1 | 1 | x | x | x | VCLK/8 output ratio |
| * | 1 | 0 | 0 | x | x | x | VCLK/16 output ratio |
| * | 1 | 0 | 1 | x | x | x | VCLK/32 output ratio |
| * | 1 | 1 | x | x | x | x | VCLK output held at Logic 1* |
| | x | x | x | 0 | 0 | 0 | SCLK/1 output ratio |
| | x | x | x | 0 | 0 | 1 | SCLK/2 output ratio |
| | x | x | x | 0 | 1 | 0 | SCLK/4 output ratio |
| | x | x | x | 0 | 1 | 1 | SCLK/8 output ratio |
| | x | x | x | 1 | 0 | 0 | SCLK/16 output ratio |
| | x | x | x | 1 | 0 | 1 | SCLK/32 output ratio |
| * | x | x | x | 1 | 1 | x | SCLK output switched off and held low* |

*These lines indicate the power-up conditions as are required for VGA pass-through.
NOTE 1: Register bits 6 & 7 have 'Don't Care' conditions.
NOTE 2: When the clocks are selected from one mode to the other, a minimum 30 ns is needed before the now clocks are stabilized and running.

SCLK

Data are latched inside the device on the rising 'LOAD' (which is basically the same as SGLK but not disabled during BLANK active period). Therefore, SCLK is set as a function of the Pixel Bus width and the number of Bit Planes. SCLK can be selected as divisions of 1, 2, 4, 8, 16, or 32 of the Dot Clock. If SCLK is not used, the output is switched off and held low to protect against VRAM 'lock-up' due to invalid SCLK frequencies. SCLK is also held low during the BLANK active period. The control timing has been designed to bring the first pixel data ready from VRAM when BLANK is disabled and ready for the display. When the split shift register operation is used, the SCLK is also being taken care of by working with SSRT input.

The default setup is 1:1, as used in mode 0.

Figure 34:
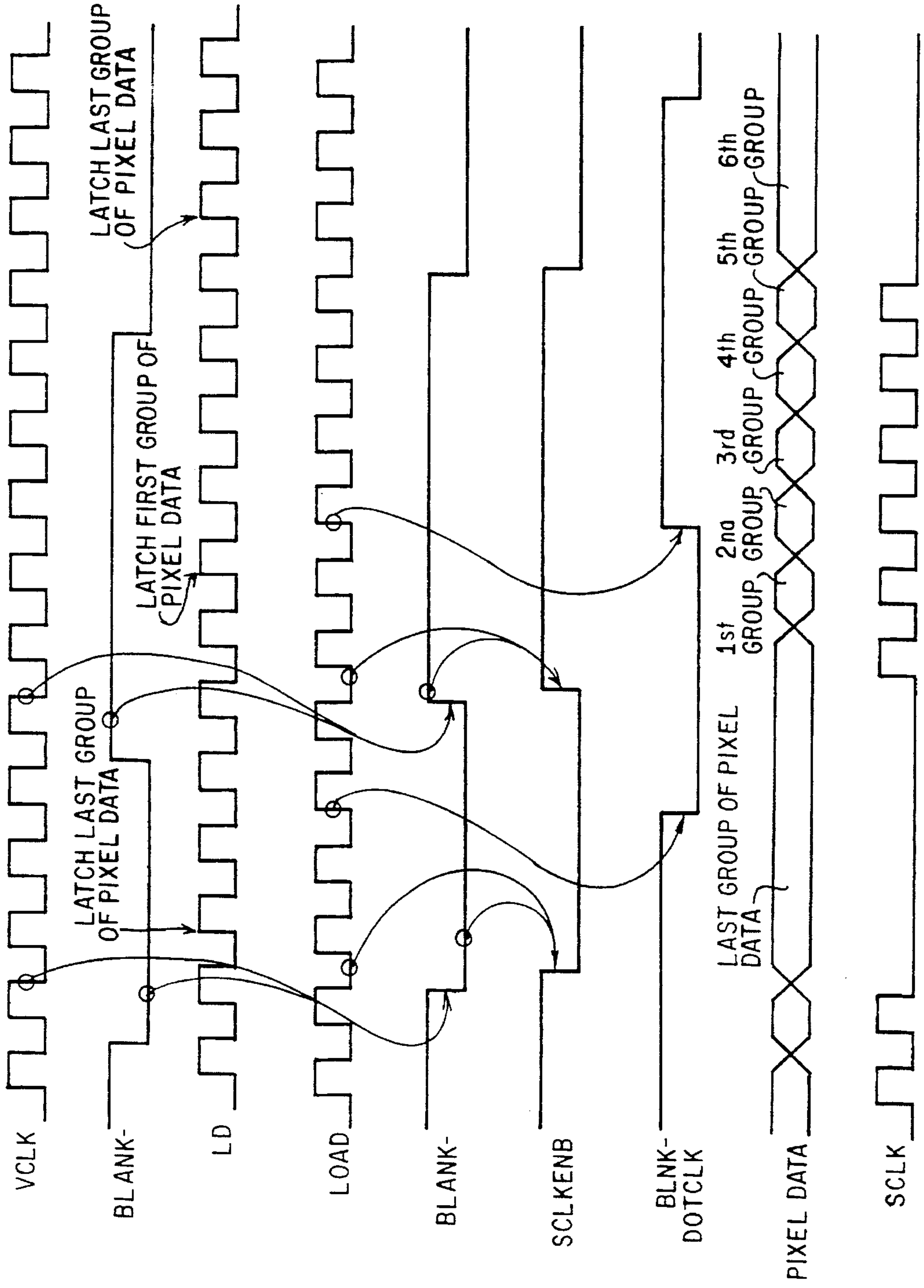
FIG. 34 is a waveform diagram for the palette device of FIGS. 31 and 32 when SSRT pulse insertion is disabled and SCLK frequency equals VCLK frequency.
Figure 35:
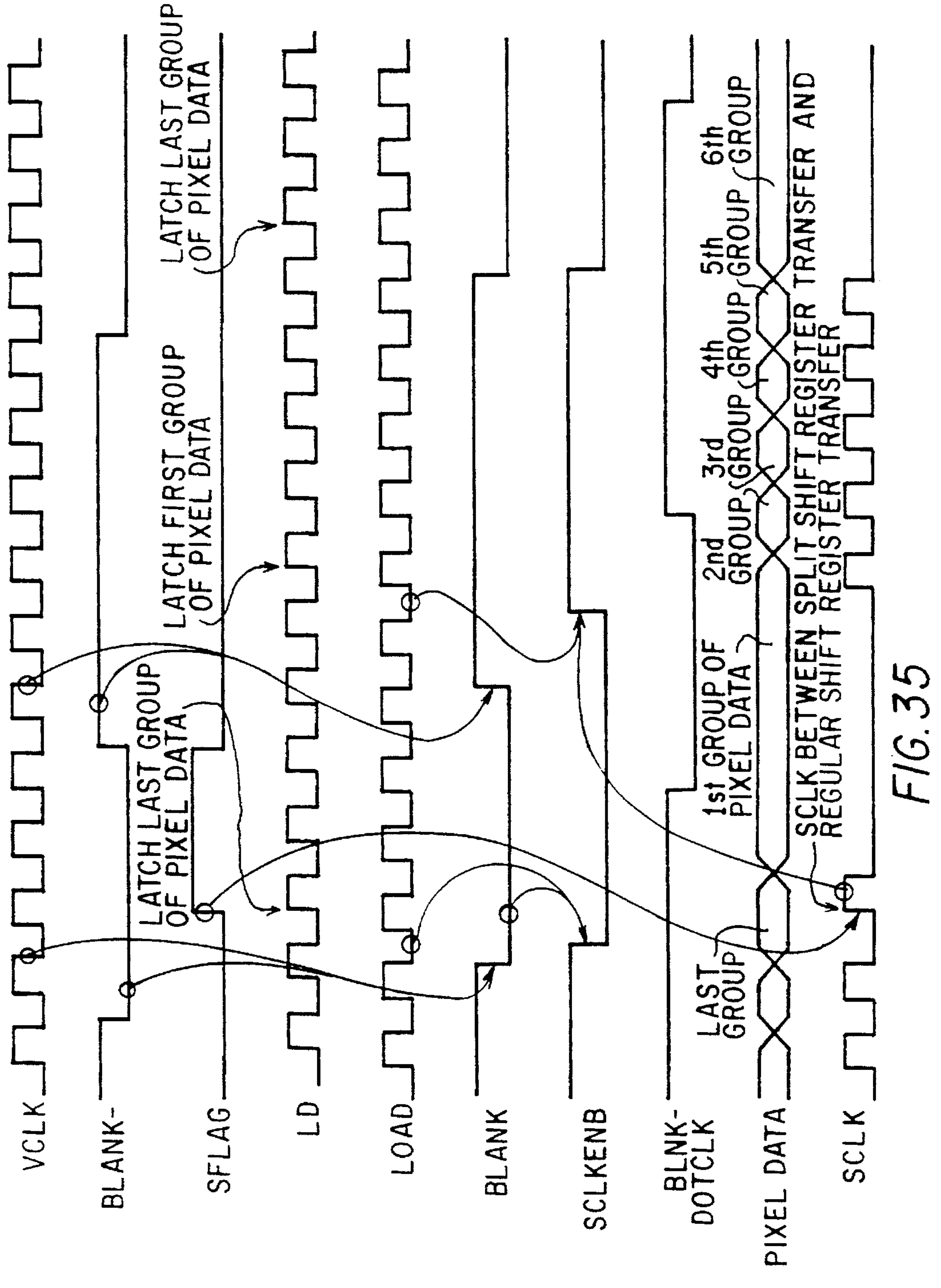
FIG. 35 is a waveform diagram for the palette device of FIGS. 31 and 32 when SSRT pulse insertion is enabled and SCLK frequency equals VCLK frequency.
Figure 36:
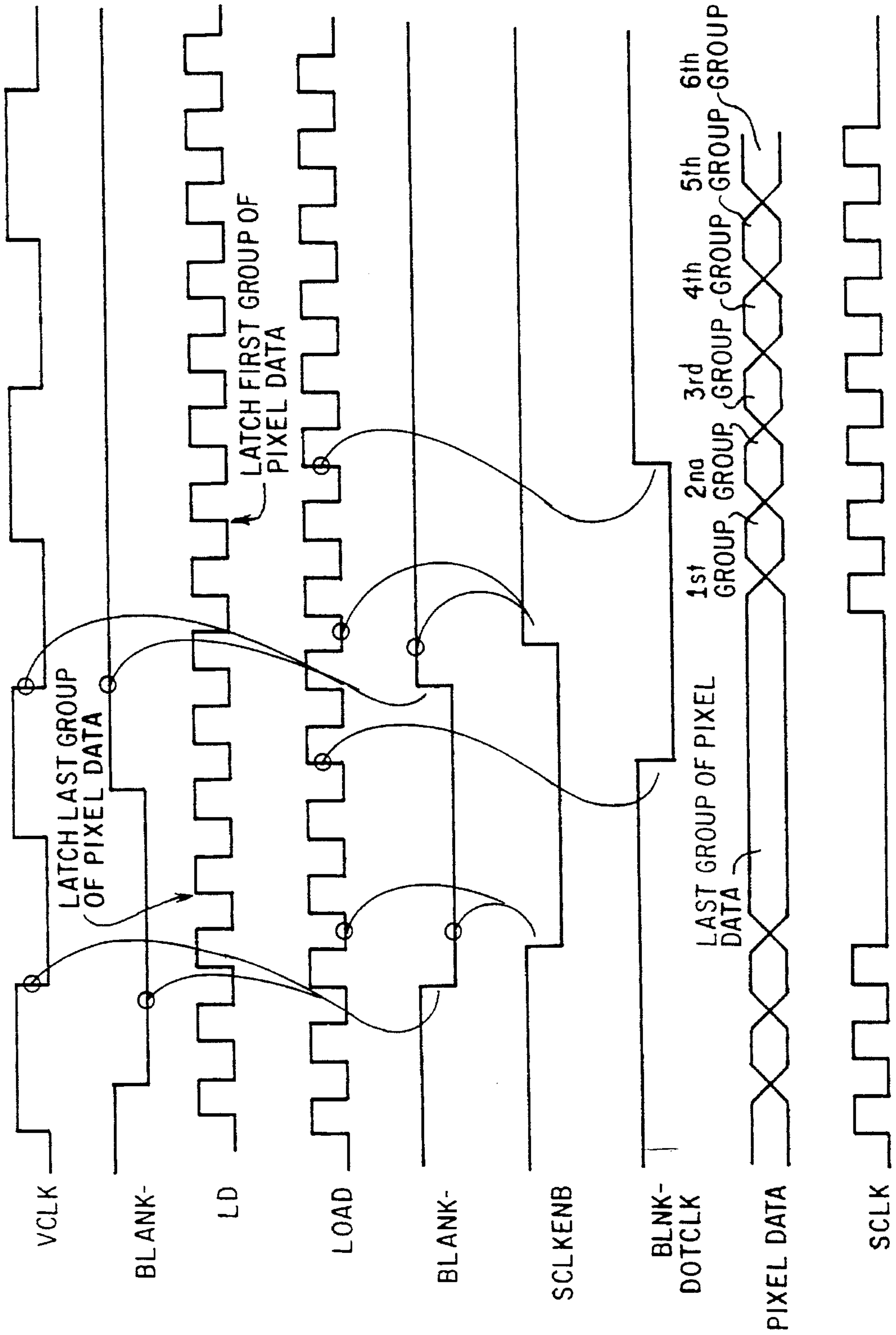
FIG. 36 is a waveform diagram for the palette device of FIGS. 31 and 32 when SSRT pulse insertion is disabled and SCLK frequency is four times VCLK frequency.

Refer to FIG. 34 for the following timing explanation.

The failing edge of VCLK is used internally by TLC34075 to sample and latch the BLANK- input. When BLANK- becomes active, the SCLK will be disabled as soon as possible. In otherwords, if the last SCLK is at the high level while the sampled BLANK- is low, that SCLK will be allowed to finish its cycle to low level, then SCLK signal will be held low until the sampled BLANK- goes back high to enable it again. The shirt register of VRAM is supposed to be updated during BLANK- active period and the first SCLK will be used to clock the first pixel data valid from VRAM. The internal pipeline delay of BLANK- input is designed to be aligned with data at the DAC output to monitors. The logic described above works with the situations when the SCLK period is shorter than, equal to and longer than VCLK period.

Figure 37:
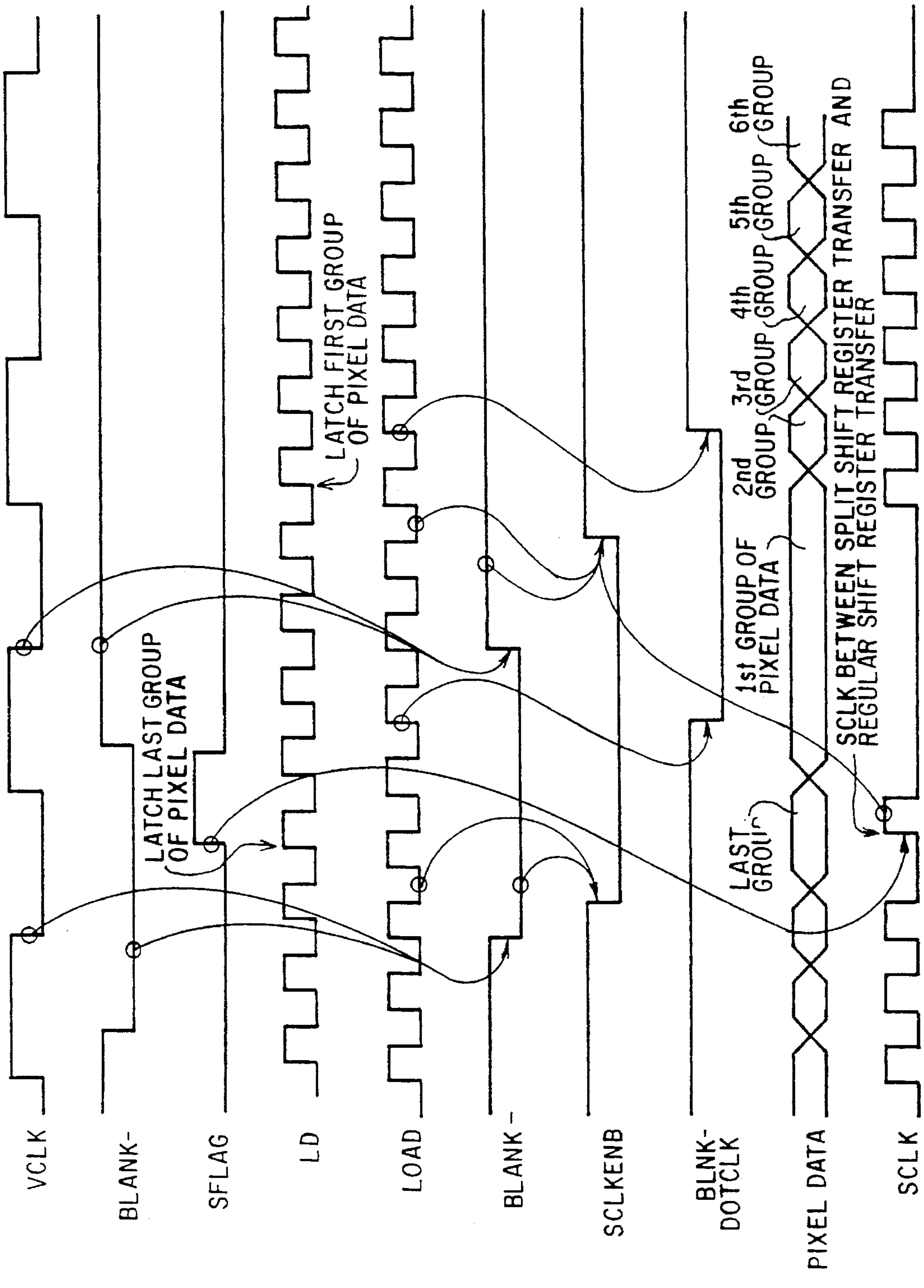
FIG. 37 is a waveform diagram for the palette device of FIGS. 31 and 32 when SSRT pulse insertion is enabled and SCLK frequency is four times VCLK frequency.

FIG. 37 shows the case when SSRT (Split Shift Register Transfer) function is enabled. One SCLK with minimum 15 ns pulse is generated from the rising edge at the SFLAG input with specified delay. This is designed to meet the VRAM timing requirement, and this SCLK will replace the first SCLK in the regular shift register transfer case as described above. Please see below for the detailed explanation of SSRT function.

VCLK

VCLK can be selected as divisions of 2, 4, 8, or 16 of the Dot Clock, and can also be held at logic 1. The default setup is VCLK held at logic 1 since it is not used in VGA pass-through mode.

VCLK is mainly used to generate the control signals (BLANK-, HSYNC- & VSYNC,-) by GSP or some custom designed control logics. As we can see from FIGS. 34–37, since the control signals are sampled by VCLK, VCLK has to be enabled.

FIG. 34 shows: SCLK/VCLK control timing (when SSRT is disabled, SCLK freq=VCLK freq)

Either the SSRT function is disabled (Gen. Ctrl. Reg. bit 2=0) or the SFLAG input is low if SSRT function is enabled (GCR bit 2=1). (SCLK freq=VCLK freq)

SCLK/VCLK and TMS340x0

While the SCLK and VCLK of TLC34075 are designed for all the graphics systems, they are also tightly coupled with TMS340x0 Graphics System Processors. All the timings working with TMS340x0 have been considered. There are a few points need to be explained for the convenience of the user's applications.

VLCK

All the control signals (e.g. BLANK-. HSYNC- & VSYNC-) in the TMS340x0 are triggered and generated from the falling edge of the VCLK. The fact that TLC34075 uses the falling edge to sample and latch BLANK- input will then give users maximum freedom to choose the frequency of VCLK and Interconnect TLC34075 with 340x0 GSP without glue logics. The minimum VCLK frequency is selected longer the minimum VCLK period required by TMS340x0.

In TMS340x0, the same falling edge of VCLK which generates BLANK- also makes a request for screen refresh at the same time. If the VCLK period has been selected longer than 16 TQ's (TQ is the period of TMS340x0 CLKIN), it's possible that the last SCLK could be falsely used to transfer the VRAM data from memory to shift register along with the last pixel transfer. The first SCLK for the next scan line will then shift the first pixel data out of the pipe and the screen will then falsely start from the second pixel.

SCLK and SFLAG

SCLK works nicely with current −10 end slower VRAM's. Under the split shift register transfer situation, one SCLK is generated between the regular shift register transfer and the split shift register transfer to ensure the appropriate operation. SFLAG is designed for this purpose. SFLAG can be generated from a PAL and be triggered by the rising edge of TR-/QE- signal or the rising edge of RAS- signal of the first regular shift register transfer cycle. TR-/QE- can be used If the minimum delay time from VRAM TRG- high to SCLK high can met by the PAL delay, otherwise RAS- can be used.

Multiplexing Scheme

The TLC34075 offers a highly versatile multiplexing scheme as illustrated in tables 4 & 5. The use of the on-chip multiplexing allows the system to be reconfigured to the mount of RAM available, for example, of only 256K Bytes of memory was available, an 800 by 600 mode with 4 bit-planes could be implemented using an 8-bit wide pixel bus. If at a later date a further 256K Bytes was added to another 8 bits of the pixel bus, the user could have the option of using 8 bit-planes at the same resolution or 4 bit planes at a 1024 by 768 resolution. When a further 512K Bytes is added to the remaining 16 bits of the pixel bus, the user could have the of option of 8 bit-planes at 1024 by 768 or 4 bit-planes at 1280 by 1024. All of the above could be achieved without any hardware modification and without any increase in the speed of the pixel bus.

The Input MUX can take data as fast as 80 Mhz. This applies to all the modes including VGA pass-through mode.

VGA Pass-Through Mode

Mode 0 is, the VGA pass-through mode, is used to emulate the VGA modes of most Personal Computers. The advantage of this mode is that it can take data presented on the feature connector of most VGA compatible PC systems into the device on a separate bus thus requiring no external multiplexing. This feature is particularly useful in systems where the existing graphics circuitry is on the motherboard; in this instance it enables a drop in graphics card to be implemented which will maintain compatibility with all existing software by using the on-board VGA circuitry but routing the emerging bit-plane data through the TLC34075. This is the default mode at power-up. When this VGA Pass-Through Mode is selected after powered up, the clock selection register, the general control register and the pixel read mask register will also be set like power-up default states automatically.

Since this mode is designed with the feature connector philosophy, all the timing is referred to CLK0 which is being used as default for VGA pass through mode, while for all the other normal modes, CLK0-3 are just the OSC sources to generate DOTCLK, VCLK, and SCLK, all the data and control timing is referred to SCLK instead.

Multiplexing Modes

Other then the VGA pass-through, there are 4 multiplexing modes available which are all referred as NORMAL mode in the spec. In each mode, a pixel bus width of 8, 16 or 32 bits may be used, modes 1,2, and 3, additionally support a pixel bus width of 4 bits. Data should always be presented on the most significant bits of the pixel bus. i.e. When 16 bits are used, the pixel data are presented on P31–P16, 8 bits on P31–P24, and 4 bits on P31–P28. All the unused PBUS pins need to be connected to GND.

Mode 1 uses a single bit plane to address the color palette. The pixel port bit is fed into bit 0 of the palette address, with the 7 high order address bits being defined by the palette page register. This mode has uses in high resolution monochrome applications such as Desktop Publishing. This mode allows the maximum amount of multiplexing with a 32:1 ratio thus giving a pixel bus rate of only 4 MHz at a screen resolution of 1280 by 1024. Although only a single bit is used, alteration of the palette page register at the line frequency would allow 256 different colors to be displayed simultaneously with 2 colors per line.

Mode 2 uses 2 bit-planes to address the color palette. The 2 bits are fed into the low order address bits of the palette with the 6 high order address bits being defined by the palette page register. This mode allows a maximum divide ratio of 16:1 on the pixel bus and is essentially a 4 color alternative to mode 1.

Mode 3 uses 4 bit-planes to address the color palette. The 4 bits are fed into the low order address bits of the palette with the 4 high order address bits being defined by the palette page register. This mode provides 16 pages of 16 colors and can be used at SCLK divide ratios of /1 to /8 Mode 4 uses 8 bit-planes to address the color palette. Since all 8 bits of palette address are specified form the pixel port, the page register is not used. This mode allows Dot Clock-to-SCLK ratios of 1:1 (8-bit bus), 2:1 (16-bit bus) or 4:1 (32-bit bus). Therefore in a 32-bit configuration, a 1024 by 768 pixel screen can be implemented with an external data rate of only 16 MHz.

True Color Mode

Mode 5 is 'True Color Mode' in which 24 bits of data are transferred from the pixel port directly to the DACs but with the same amour of pipeline delay as the overlay data and the control signals (BLANK- and SYNCs). In this mode, overlay is provided by utilizing the remaining 8 bits of the pixel bus to address the palette RAM which results in a 24-bit RAM output that is then used as overlay information to the DACs. When all the overlay Inputs (P7–P0) are m logic 0, no overlay information is displayed, whereas when a non-zero value is Input, the color palette RAM is addressed and the resulting data is then fed through to the DACs, receiving priority over the True Color data.

The true color mode data input works in the 8 bit mode. In other words, if only 6 bits will be used, the 2 MSB inputs for each color need to be tied to GND. However, the palette, which is used by overlay input, is still governed by 8/6- input pin and Output MUX will select 8-bits data or 6-bits data accordingly.

For the colors passed through, P8–P15 pass RED data, P16–P23 pass GREEN data, and P24–P31 pass BLUE data.

Special Nibble Mode

Mode 6 is 'Special Nibble Mode' which is enabled when the SNM bit (bit 3) is set and the SSRT bit (bit 2) is reset in the General Control Register. When Special Nibble Mode is enabled, the MUX Control Register setup is ignored and it takes precedence over the other modes. The SFLAG/NFLAG Input is then being used as a nibble flag to indicate which nibble of each byte holds the pixel data. Conceptually this Special Nibble Mode initiates an additional variation of the 4 bit pixel mode with a 16 bit bus width (while all 32 Inputs P0 through P31 are connected as 4 bytes), but in this case the 16 bit data bus is found on the lower/upper nibble of each of the 4 bytes. This will be further described below. Since this mode uses 4 bit-planes for each pixel, they are ted into the low order address bits of the palette with the 4 high order address bits being defined by the palette page register.

Multiplex Control Register

The multiplexer is controlled via an 8-bit register in the register map (Table 1). The bit fields of the register are as follows:

TABLE 4

Mode and Bus Width Selection.

| MODE | MUX CONTROL REGISTER BITS (1) 5 | 4 | 3 | 2 | 1 | 0 | DATA BITS PER PIXEL (2) | PIXEL BUS WIDTH | SCLK DIVIDE RATIO (3) | OV'LAY BITS per PIXEL (4) | PIXEL BUS PHYSICAL CONNECTION (5) | SPECIAL NIBBLE MODE? | TABLE REF. (6) |
|---|---|---|---|---|---|---|---|---|---|---|---|---|---|
| 0 | 1 | 0 | 1 | 1 | 0 | 1 | 8 | 8 | 1 | | 8 | NO | a |
| 1 | 0 | 1 | 0 | 0 | 0 | 0 | 1 | 4 | 4 | | 4 | NO | b |
| 1 | 0 | 1 | 0 | 0 | 0 | 1 | 1 | 8 | 8 | | 8 | NO | c |
| 1 | 0 | 1 | 0 | 0 | 1 | 0 | 1 | 16 | 16 | | 16 | NO | d |
| 1 | 0 | 1 | 0 | 0 | 1 | 1 | 1 | 32 | 32 | | 32 | NO | e |
| 2 | 0 | 1 | 0 | 1 | 0 | 0 | 2 | 4 | 2 | | 4 | NO | f |
| 2 | 0 | 1 | 0 | 1 | 0 | 1 | 2 | 8 | 4 | | 8 | NO | g |
| 2 | 0 | 1 | 0 | 1 | 1 | 0 | 2 | 16 | 8 | | 16 | NO | h |
| 2 | 0 | 1 | 0 | 1 | 1 | 1 | 2 | 32 | 16 | | 32 | NO | i |
| 3 | 0 | 1 | 1 | 0 | 0 | 0 | 4 | 4 | 1 | | 4 | NO | j |
| 3 | 0 | 1 | 1 | 0 | 0 | 1 | 4 | 8 | 2 | | 8 | NO | k |
| 3 | 0 | 1 | 1 | 0 | 1 | 0 | 4 | 16 | 4 | | 16 | NO | l |
| 3 | 0 | 1 | 1 | 0 | 1 | 1 | 4 | 32 | 8 | | 32 | NO | m |
| 4 | 0 | 1 | 1 | 1 | 0 | 0 | 8 | 8 | 1 | | 8 | NO | n |
| 4 | 0 | 1 | 1 | 1 | 0 | 1 | 8 | 16 | 2 | | 16 | NO | o |
| 4 | 0 | 1 | 1 | 1 | 1 | 0 | 8 | 32 | 4 | | 32 | NO | p |
| 5 | 0 | 0 | 1 | 1 | 0 | 1 | 24 | 32 | 1 | 8 | 32 | NO | q |
| 6 | 0 | 1 | 1 | 1 | 1 | 1 | 4 | 16 | 4 | | 32 | YES | r |

TABLE 4-continued

| Mode and Bus Width Selection. | | | | | | | | | | | | | |
|---|---|---|---|---|---|---|---|---|---|---|---|---|---|
| | MUX CONTROL REGISTER BITS (1) | | | | | | DATA BITS PER PIXEL | PIXEL BUS | SCLK DIVIDE | OV'LAY BITS per | PIXEL BUS PHYSICAL | SPECIAL NIBBLE | TABLE |
| MODE | 5 | 4 | 3 | 2 | 1 | 0 | (2) | WIDTH | RATIO (3) | PIXEL (4) | CONNECTION (5) | MODE? | REF. (6) |

NOTE 1: Register bits 6 & 7 have 'Don't Care' conditions.
NOTE 2: 'DATA BITS per PIXEL' are the number of bis of pixel port information used as color data for each displayed pixel, often referred to as the number of bit planes. Thismay be color palette address data (modes 0–4, 6) or DAC data (mode 5).
NOTE 3: 'SLCK DIVIDE RATIO' is the number used for Output Clock Selection register. It indicates the PIXELS per BUS LOAD which are the number of pixels that are generated from each SCLK, e.g. with a 32-bit pixel bus and 8 bit planes. 4 pixels will be generated every Bus Load (or SCLK).
NOTE 4: Overlay is implemented in true color mode with the remaining 8 bits of the pixel bus.
NOTE 5: Normally the 'PIXEL BUS PHYSICAL CONNECTION' equals the 'PIXEL BUS WIDTH'. The only exception is the Special Nibble Mode. Please refer to Table 5 and Section 1.9 for more details.
NOTE 6: This column is a reference to a column of table 5, where the actual manipulation of pixel information is illustrated. See below.

Table 4 is designed for input MUX control. Even though it provides 'SCLK divide ratio' which is used for input MUX control end is also provided for users' Information. The SCLK output depends on the bits programmed in Output Clock Selection Register as shown in Table 3.

The use of Pixel and Overlay Busses to the above modes of operation is Illustrated in table 5. The table shows what data is extracted from the pixel information at each stage. Operation is bound to one column of the table (see reference from table 4). On each rising SCLK, data is internally latched from the pixel input port, this also initiates the first row of table 5. Successive rows are executed on each pixel clock. Once the column has been completed, SCLK will activate another bus load and hence repeat the column.

SCLK rate as slow as possible, the maximum pixel bus width should then be used, which is 32 and SCLK divide ratio can then be /4 from DOTCLK. From Table 4 we know we should write 1E (HEX) to the MUX Control Register. We then find out configuration p should be used in Table 5, which tells us the P0–P7 should be connected to the earliest displayed pixel plane, followed by P8–P15, P16–P23, and then P24–P31 is the latest displayed pixel plane. In order to set SCLK, the Output Clock Selection Register also needs to be programmed. In this case, 12 (HEX) should be used (assume VCLK is also programmed as DOTCLK/4). There is one more thing to check is to make sure the Special Nibble Mode is disabled.

TABLE 5

Port Data to Pixel Distribution. (2)

| a | b | c | d | e | f | g |
|---|---|---|---|---|---|---|
| VGA7 . . . VGA0 | P0<br>P1<br>P2<br>P3 | P0<br>P1<br>P2<br>.<br>.<br>.<br>P7 | P0<br>P1<br>P2<br>.<br>.<br>.<br>P15 | P0<br>P1<br>P2<br>.<br>.<br>.<br>P31 | P0, P1<br>P2, P3 | P0, P1<br>P2, P3<br>P4, P5<br>P6, P7 |

| h | i | j | k | l | m | n |
|---|---|---|---|---|---|---|
| P0, P1<br>P2, P3<br>.<br>.<br>.<br>P14, P15 | P0, P1<br>P2, P3<br>.<br>.<br>.<br>P30, P31 | P0, . . . , P3 | P0, . . . , P3<br>P4, . . . , P7 | P0, . . . , P3<br>P4, . . . , P7<br>P8, . . . , P11<br>P12, . . . , P15 | P0, . . . , P3<br>P4, . . . , P7<br>P8, . . . , P11<br>.<br>.<br>.<br>P28, . . . , P31 | P0, . . . , P7 |

| o | p | q[1] | r | | | |
|---|---|---|---|---|---|---|
| P0, . . . , P7<br>P8, . . . , P15 | P0, . . . , P7<br>P8, . . . , P15<br>P16, . . . , P23<br>P24, . . . , P31 | P8, . . . , P31 | NFLAG=0<br>P0, . . . , P3<br>P8, . . . , P11<br>P16, . . . , P19<br>P24, . . . , P27 | NFLAG=1<br>P4, . . . , P7<br>P12, . . . , P15<br>P20, . . . , P23<br>P28, . . . , P31 | | |

NOTE 1: In this mode of operation the port pins P0–P7 are used to generate overlay data. This operation can be disabled by either grounding the pixel inputs P0–P7 or by clearing the read mask (see §1.4.5). For the colors, passed-through. P8–P15 will be passed to the RED DAC, P16–P23 to the GREEN DAC and P24–P31 to the BLUE DAC.
NOTE 2: The low number is the LSB and the high number is the MSB. E.G. in the configuration o (MUX Control Register = 1D (HEX)). P8 is the LSB and P15 is the MSB in the 2nd channel, and to address palette RAM location 21 (HEX). P8 and P13 need to be high. The input data are sampled from low-numbered channels to high-numbered channels. E.G. if configuration p is programmed (MUX selection register = 1E (HEX)), channel P0–P7 will be sampled first, followed by P8–P15, P16–P23, and the last channel sampled will be P24–P31. Same rule applies to VGA0–7.

As an example how to use Table 4 & 5, if the user wants to design a system with 8 data bit per pixel, and wants to use When MUX Control Register is loaded with 2D (HEX), It's VGA mode and TLC34075 enters its VGA default condition which is the same condition as power-up. Please refer to the description of reset for more details.

Read Masking

The read mask register is used to enable or disable a bit-plane from addressing the color palette RAM. Each palette address bit is logically ANDed with the corresponding bit from the read mask register before addressing the palette.

This function is performed after the addition of the page register bits and therefore a zeroing of the AND mask will result to one unique palette location and will not be affected by accesses of the palette page register.

Reset

There are 3 ways to reset TLC34075:

A. Power-up reset

B. Hardware reset

C. Software reset

Power-up Reset

There is a POR (POwer-up Reset) logics built in TLC34075. This POR works at power-on only. However, it's still recommended to design in the hardware reset circuit to ensure the reset condition at power-up as described below.

Once the voltage is stablized, the default condition for all registers are VGA mode.

Hardware Reset

Any time users write to 'RESET STATE' register [RS3-0=1111 (binary)], the value being written is ignored, but TLC34075 will reset. TLC34075 resets by every 'WR-' rising edge as long as RS3-0 holding 1111 (binary) value.

The more 'WR-' edges, the more reliable TLC34075 gets reset. This scheme burst 'WR-' strobes until power supply voltage stablized, is suggested at power-up if the hardware reset structure being used. The default reset conditions is for VGA mode, and the values for each register are shown below.

Software Reset

Anytime when MUX Control Register selects VGA mode after power-up, all registers are initialized accordingly. Since VGA mode is the default condition at power-up and hardware reset, VGA mode selection in MUX Control Register is naturally viewed as software reset. So, any time MUX Control Register is entered as 2D (HEX), TLC34075 initiates a software reset.

VGA Default Conditions

The condition for each register after reset is shown as follows:

| | |
|---|---|
| MUX Control Register | 2D (HEX) |
| Input Clock Selection Register | 00 (HEX) |
| Output Clock Selection Register | 3F (HEX) |
| Palette Page Register | 00 (HEX) |
| General Control Register | 13 (HEX) |
| Pixel Read Mask Register | FF (HEX) |
| Palette Address Register | xx (HEX) |
| Palette Holding Register | xx (HEX) |
| Test Register | (Pointing to color palette Red value) |

Frame Buffer Interface

The TLC34075 provides 2 clock signals for controlling the frame buffer interface: SCLK and VCLK. SCLK can be used to clock out data from VRAM shift registers directly. Split Shift Register Transfer function is also supported. VCLK is used to clock, and synchronize the control signals like HSYNC-, VSYNC- and BLANK-.

The pixel data presented at the Inputs are latched at the rising edge of SCLK in Normal mode, or the rising edge of CLK0 in VGA mode. Control signals HSYNC-, VSYNC-, and BLANK- are sampled and latched at the falling edge of VCLK in Normal mode, while HSYNC-, VSYNC-, and VGABLANK- am latched at the rising edge of CLKO. Both data and control signals are fined up at the DAC outputs to monitors through internal pipeline delay.

Figure 38:
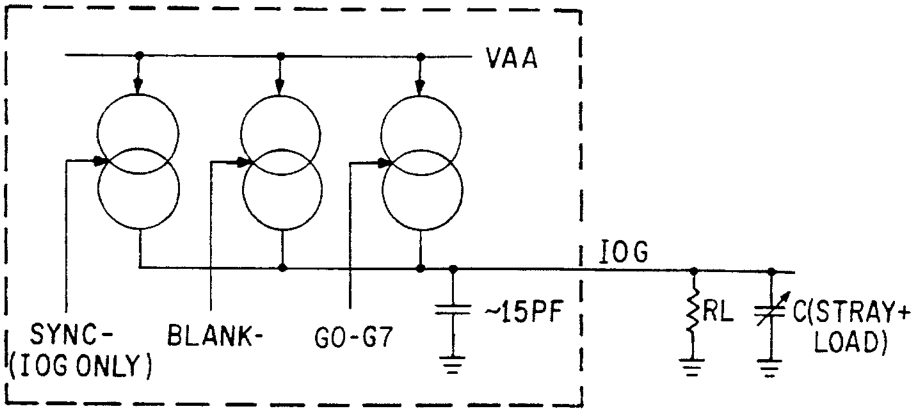
FIG. 38 is a schematic diagram of a digital to analog converter for an analog color signal with added circuits for sync and blanking.
Figure 39:
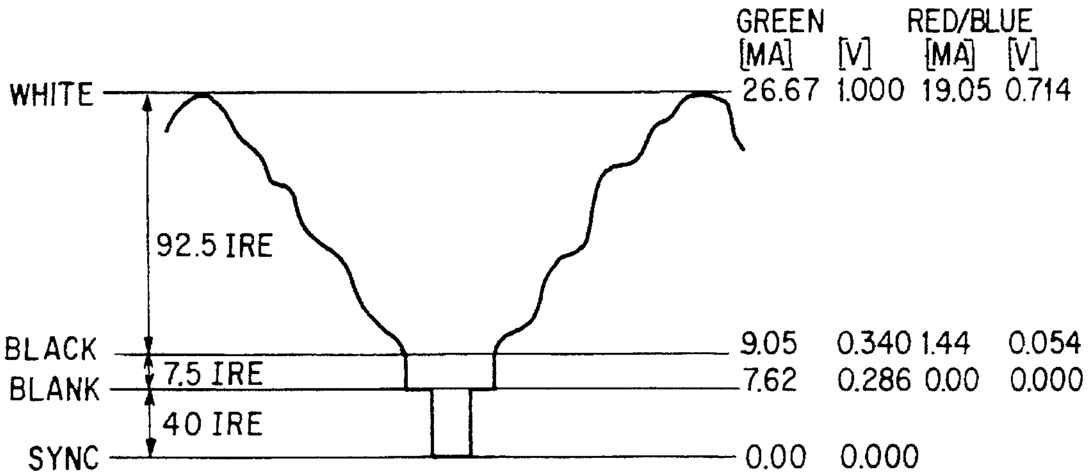
FIGS. 39 and 40 are two waveform diagrams of composite video output including analog video and blanking with front and back porch flanking a sync signal.

The outputs of the DACs are capable of directly driving a 37.5Ω load, as in the case of a doubly terminated 75Ω cable, see FIGS. 38 and 39.

Analog Output Specifications

Figure 40:
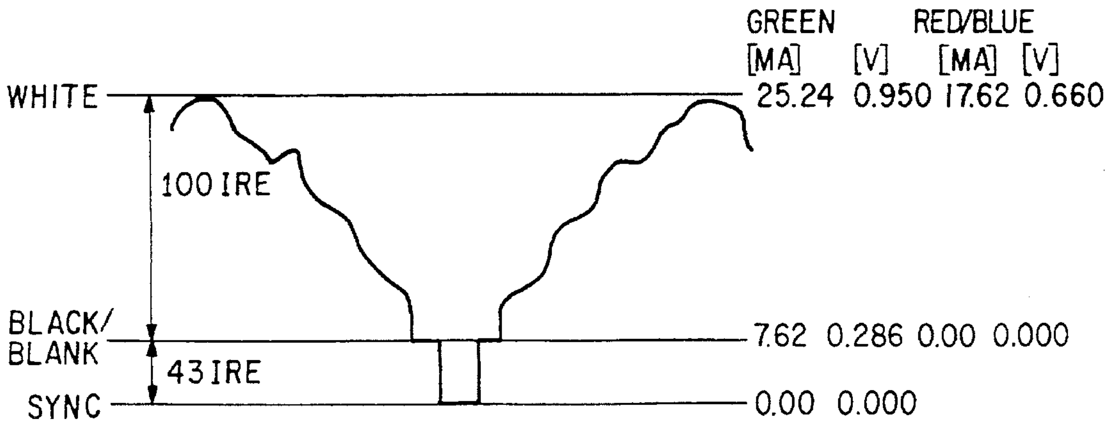

The DAC outputs are controlled by three current sources (only two for IOR & IOB) as shown in FIG. 38 in the normal case, there is 7.5 IRE difference between blank and black levels, which is shown in FIG. 39; of 0 IRE pedestal is wanted. It can be so selected by resetting bit 4 of General Control Register). And the video output is shown in FIG. 40.

A resistor (RSET) is needed to connect FS ADJ pin and GND to control the magnitude of the full scale video signal. The IRE relationships in FIG. 39, 40 are maintained regardless of the full scale output current.

The relationship between RSET and the full scale output current IOG is:

RSET (ohms)=K1 * VREF (v) / IOG (mA)

The full scale output current on IOR nd IOB for a given RSET is:

IOR, IOB (mA)=K2 * VREF (v) / RSET (ohms)

where K1 and K2 are defined as:

| | IOG | | IOR, IOB | |
|---|---|---|---|---|
| Pedestal | 8-bit output | 6-bit output | 8-bit output | 6-bit output |
| 7.5 IRE | K1 = 11,294 | K1 = 11,206 | K2 = 8,067 | K2 = 7.979 |
| 0 IRE | K1 = 10,684 | K1 = 10,600 | K2 = 7,462 | K2 = 7,374 |

Hsync-, Vsync- and Blank-

For the normal mode, HSYNC,- and VSYNC- are passed through true/complement gates then go to the output HSYNCOUT and VSYNCOUT. The polarities of HSYNCOUT and VSYNCOUT can then be programmed through General Control Register. This allows the connected monitor detect the current screen resolution. However, for the VGA mode, the needed polarities to monitors are already provided at the feature connector which HSYNC and VSYNC- are sourced from, so TLC34075 will lust pass them through to HSYNCOUT and VSYNCOUT without polarity change. As described above FIG. 35, 36, the BLANK- input is sampled and latched at the falling edge of VCLK in the normal mode, HSYNC- and VSYNC- inputs are sampled and latched the same way. However, for VGA mode, they are latched at the rising edge of CLKO Input. Please refer to FIG. 8 for all the detailed timings. If Mux Control Register is 2D (HEX), it's VGA mode, CLKO and VGABLANK- inputs will be selected, otherwise, VCLK and BLANK- will be used.

Due to the pin count limitation, HSYNC- and VSYNC- inputs will be used for both VGA and normal modes. If both modes are used on TLC34075, an external MUX to select the set between VGA and normal SYNC's is needed. The MUXOUT- is designed for this purpose.

HSYNC-, VSYNC- and BLANK- all have internal pipeline delays to align the data at the outputs. Due to the sample and latch timing delay, It's possible to have active SCLK's after BLANK- input becomes active. The relationship between VCLK and SCLK, and the internal VCLK sample and latch delay need to be carefully reviewed and programmed. Please see 1.3 and FIG. 35, 36, for more details.

As shown in FIG. 38, active HSYNC- and VSYNC- will turn of the sync current source after pipeline delay. They are not qualified by BLANK- signal. In other words, HSYNC- and VSYNC- should be designed active only during BLANK- active time to ensure the proper operation.

To alter the polarity of the HSYNCOUT and VSYNCOUT outputs in the normal mode, the MPU must set or clear the corresponding bits in General Control Register. Again, these two bits will affect the normal mode only, not the VGA mode. These bits default to 1 which is non-inverting.

SPLIT SHIFT REGISTER TRANSFER VRAMS AND SPECIAL NIBBLE MODE

Split Shift Register Transfer VRAMs

Figure 41:
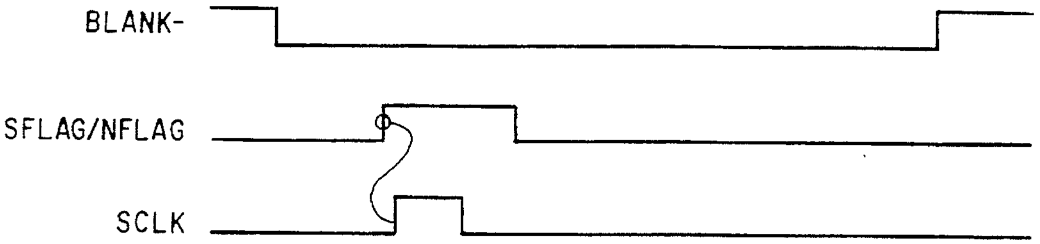
FIG. 41 is a waveform diagram of pulse insertion for split shift register transfer showing timing relationships in FIG. 22.

The TLC34075 has direct support for Split Shift Register Transfer (SSRT') VRAMs. In order to allow the VRAMs to perform a split register transfer, an extra SCLK cycle must be inserted during the blank sequence. This is initiated when the SSRT enable bit (bit 21 in the generated control register being set but the SNM (bit 3) being reset and a rising edge on me SFLAG/NFLAG input pin is detected, a SCLK pulse will be generated within 20 ns and a minimum 15 ns logic high duration is provided to satisfy all of the −15 VRAM requirement. The rising edge of SFLAG/NFLAG input triggers SCLK, but it needs to stay high until the end of the BLANK- active period. It's also user's responsibility to satisfy the delay time of the rising edge of this SCLK from the VRAM TRG- going high by controlling the SFLAG rising timing. The waveform and the relationship of the SCLK. SFLAG input and the BLANK- is shown as follows: in FIG. 41:

If the SSRT function is arrived but SFLAG/NFLAG is held low during BLANK-, the SCLK is running just like if the SSRT function is disabled. The SFLAG/NFLAG input needs to be held low when BLANK- is inactive. Please refer FIGS. 34, 35 for more system details.

Special Nibble Mode

There is a Special Nibble Mode designed in TLC34075. This mode is enabled when the SNM bit (Bit 3) of the General Control Register being set but the SSRT (bit 2) being reset. The SFLAG/NFLAG input is then being used as a nibble flag to indicate which nibble of each byte holds pixel data. Conceptually this Special Nibble Mode initiates an additional variation of the 4 bit pixel mode with a 16 bit bus width (while all 32 inputs P0 through P31 are connected as 4 bytes), but in this case the 16 bit data bus is found on the lower/upper nibble of each of the 4 bytes. The pixel data is distributed as the following table shown:

| SNM = 1, SSRT = 0 | |
|---|---|
| SFLAG/NFLAG = 0 | SFLAG/NFLAG = 1 |
| P0, . . . , P3 | P4, . . . , P7 |
| P8, . . . , P11 | P12, . . . , P15 |
| P16, . . . , P19 | P20, . . . , P23 |
| P24, . . . , P27 | P28, . . . , P31 |

Figure 42:
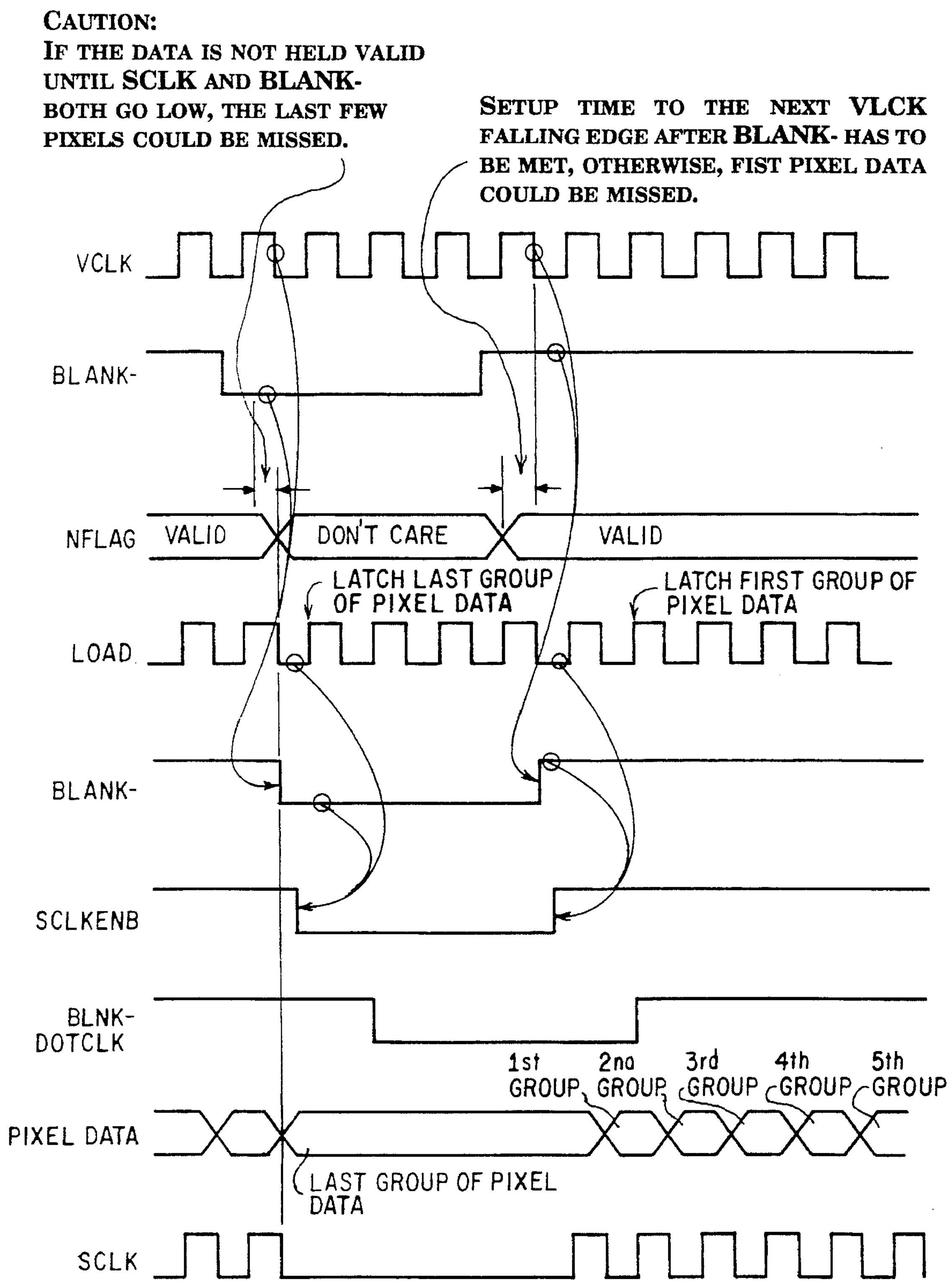
FIG. 42 is a waveform diagram for the palette device of FIGS. 31 and 32 showing timing in a special nibble mode.

The NFLAG is not latched within TLC34075. Therefore it should stay the same level during the whole active display period and only change level during BLANK- active time. Please refer to FIG. 42 which is similar to FIG. 34 except the BLANK- signal timing reference to NFLAG is explained. The NFLAG has to meet the setup time and hold the data long enough to ensure no pixel data are missed.

As users can see, this Special Nibble Mode will operate at line frequency when BLANK- is active. However, the typical application of this mode would be double frame buffers with data of pixel width of 4 bits. So, while one frame buffer is displaying on the monitor, the other frame could be used to accept new picture information. NFLAG is then used to indicate which frame buffer is displaying.

It is noted that SNM and SSRT are mutually exclusive in this example.

The MUX Control Register needs to be setup as Table 4 (see 1.4.5) shown for SCLK divide ration. However, the SNM takes precedence over the other MUX selections. In other words, if MUX Control Register is set up for different mode but SNM is still enabled in General Control Register, the input multiplex circuit will take what ever the SCLK divide ratio MUX Control Register specified and perform the nibble operation.

During SNM, the input MUX circuit will latch all 8-bit inputs but only pass on the specified nibble. The specified nibble will be stored in the 4 LSB's of the next register pipe after the input latch, and the 4 MSB's will be zero'ed in that register. This pipe register is then passed to READ MASK BLOCK. With this structure, Palette Page Register will still function as normal which provides good flexibility to users.

If the General Control Register bit 3=0 & bit 2=0, both SSRT and SNM are disabled, the SFLAG/NFLAG input is then ignored.

MUXOUT - Output Pin

The MUXOUT- pin is a TTL compatible output, it is software programmable and is used to control the external devices. The typical application would be to select the HSYNC- and VSYNC- inputs between the VGA mode and the normal mode (See 1.8). This pin will be set low at power-up or when VGA mode is entered to the MUX Control Register, and it can be set back high if it's so desired. Since this pin follows the status from bit 7 of the General Control Register and involves no other amount Is genetic enough to be programmed for anything after power-up or VGA mode set (2D HEX in Mux Control Register).

General Control Register

The general control register (or control register) is used to control HSYNC- and VSYNC- polarity, split register transfer enabling, special nibble mode, sync Control, one's accumulation clock source and the VGA Pass-through indicator. The bit field definitions are as follows:

TABLE 6

General Control Register Bit Function

| General Control Register Bit | | | | | | | | |
|---|---|---|---|---|---|---|---|---|
| 7 | 6 | 5 | 4 | 3 | 2 | 1 | 0 | Function |
| x | x | x | x | x | x | x | 0 | HSYNCOUT active high |
| x | x | x | x | x | x | x | 1 | HSYNCOUT active low |
| x | x | x | x | x | x | 0 | x | VSYNCOUT active high |
| x | x | x | x | x | x | 1 | x | VSYNCOUT active low |
| x | x | x | x | x | 0 | x | x | Split shift register transfer disable |
| x | x | x | x | 0 | 1 | x | x | Split shift register transfer enable |
| x | x | x | x | 0 | x | x | x | Special Nibble Mode Disable |
| x | x | x | x | 1 | 0 | x | x | Special Nibble Mode Enable |
| x | x | x | 0 | x | x | x | x | 0 IRE Pedestal |
| x | x | x | 1 | x | x | x | x | 7.5 IRE Pedestal |
| x | x | 0 | x | x | x | x | x | Sync Disable |
| x | x | 1 | x | x | x | x | x | Sync Enable |
| x | 0 | x | x | x | x | x | x | Not defined (RESERVED) |
| x | 1 | x | x | x | x | x | x | Not defined (RESERVED) |
| 0 | x | x | x | x | x | x | x | MUXOUT - low (default) |
| 1 | x | x | x | x | x | x | x | MUXOUT - high |

HSYNCOUT and VSYNCOUT (bit 0 and 1 )

HSYNCOUT and VSYNCOUT polarity inversion is provided to allow indication to monitors of the current screen resolution. Since the polarities for VGA mode have been provided at the feature connector, the inputs to TLC34075 will have the right polarities to monitors already, so TLC34075 just passes them through with pipeline delay. These two bits only work under the normal mode, and the input Horizontal and Vertical Sync's are assumed active low incoming pulses. These two bits default to active low but can be changed by software.

Pedestal Enable Control (bit 4)

This bit specifies whether a 0 or 7.5 IRE blanking pedestal is to be generated on the video outputs. 0 IRE specifies that the black and blank levels are the same.

0:0 IRE pedestal

1:7.5 IRE pedestal (default)

Sync Enable Control (bit 5)

This bit specifies whether SYNC information is to be output onto IOG or not.

0: Disable sync (default)

1: Enable sync

MUXOUT-(bit 7)

The MUXOUT- bit is essentially an output bit which provides an indication to external circuitry that the device is running to VGA pass-through mode. This bit does not affect the operation of fire device, it is only an output bit. See 1.10.

0: MUXOUT- is low (default in VGA mode)

1: MUXOUT- is high

Test Register

There are three test functions provided tn TLC34075 and they are all controlled and monitored through this Test Register: Data flow check, DAC analog test and screen integrity test.

This register has 2 ports: one for a control word, accessed by writing to the register location, and one for the data word, accessed by reading from the register location. Depending on the channel written in the control word, the data read will present the information for that channel.

Figure 43A:
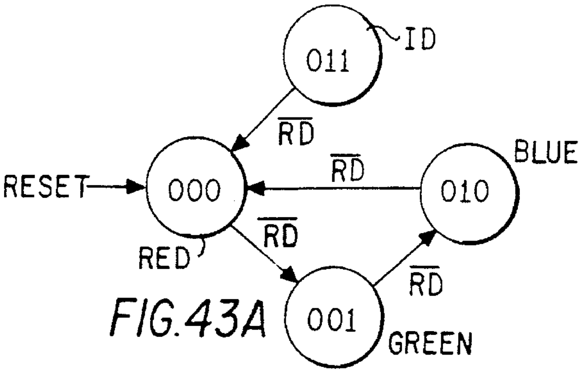
FIGS. 43A, 43B and 43C are state transition diagrams for test circuitry of FIG. 32.
Figure 43C:
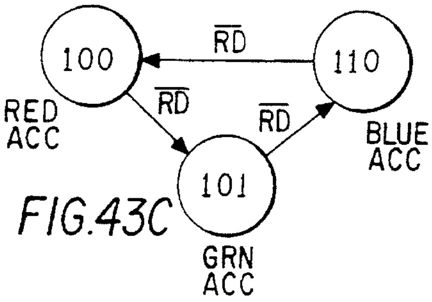
Figure 43B:
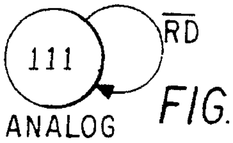

The control register is 3 bits long, occupying bits 0, 1 and 2. There specify, which of the eight channels to inspect. The following table and state machine will show how each channel is addressed; see FIG. 43:

| D2 | D1 | D0 | CHANNEL |
|---|---|---|---|
| 0 | 0 | 0 | Color palette RED value |
| 0 | 0 | 1 | Color palette GRN value |
| 0 | 1 | 0 | Color palette BLU value |
| 0 | 1 | 1 | Identification code |
| 1 | 0 | 0 | One's accumulation RED value |
| 1 | 0 | 1 | One's accumulation GRN value |
| 1 | 1 | 0 | One's accumulation BLU value |
| 1 | 1 | 1 | Analog Test |

Frame Buffer Data Flow Test

For all the data entering the DAC (but before the Output MUX 8/6- shift), TLC34075 provides a means to check them. When accessing these color channels, the data entering the DACe should be kept constant for the entire MPU read cycle. This can be done either by slowing down the Dot Clock or ensuring the data is constant for a sufficiently long series of pixels. The value read will be the one stored in the color palette pointed by the Input MUX. The read operation will cause a post-increment to point to the next color channel, and the post-increment of BLUE will wrap back to RED as shown in above state diagram. E.g. If D2, D1 & DO was written as 001 (binary), then followed by 3 successive reads, the values read out will be GREEN, BLUE, then RED in that sequence.

Identification Code

The ID code could be used for software identification for different version or subroutines. The ID code in TLC34075 is static and may be read without consideration to the Dot Clock or Video signals. To be user friendly, the read post-increment applies to the ID register too, but once it feels Into the color channel, II won't come back pointing to ID unless the user writing 011 (binary) to D2, D1 & DO again. So, if Test Register was first written as 011 (binary) in D2, D1 & D0, the followed by 6 successive reads, the first value read will be the ID, and the last value read will be the GREEN.

The ID value defined here is 75 (HEX).

One's Accumulation

As the One's accumulation for specified color is selected by D2, D1 and D0, the specified digital color value from the color palette (before the Output MUX 8/6- shift operation) to the DAC is monitored. The number of ones for the addressed color value is added to a temporary accumulator. E.G. 41 (HEX) has two ones, two will be added to the temporary accumulator if the color palette addressed by the frame buffer Input containing 41 (HEX) value. The falling edge of the VSYNC- after the internal pipeline delay will be used to transfer the final value to One's Accumulation Register and the temporary accumulator will be reset for the next screen. The one's accumulation is calculated only when the specified color is selected, i.e. D2-D0=100, 101 or 110 (binary), and it's operation is disabled when not being selected to save power. So, the user needs to watt long enough for the complete screen displayed at least once before reading the value. To be user friendly, the post-Increment after each read has also been designed in as the above state diagram shown: After the value is read, TLC34075 will point to the next color and calculate the number of one's for the whole screen. The overflow after 8-bit value is truncated. Due to the speed limitation, one's accumulation is calculated at DOTCLK/2 rate. As long as the display pattern for each screen is fixed, the one's accumulation value should stay the same, otherwise, an error is detected. Since the One's accumulation value is calculated before the Output MUX, 8-bit value is mad and calculated. If 6 bit mode is selected and the 2 MSB's tn the color palette are not initialize with 0's, the one's accumulation value will still report for 8–11 pattern. This provides additional checking capability for the color palette.

One's accumulation is a good test tool for system check-out and for the field diagnostics.

One's accumulation is updated every VSYNC- time, not Composite Sync time which is also active during HSYNC- time.

Analog Test

This Analog Test is usual to compare the analog RGB outputs to each other and to a 145 mv reference. This enables the MPU to determine whether the CRT monitor is connected to the analog RGB outputs or not, and whether the DAC's are functioned. When the Analog Test is performed, D7 through D4 need to be set for desired comparison while D2 through DO are set as 111 (binary). When the Test Register is been mad, D3 will then reflect the result. The bit definition is shown as follows:

| Bit definition | Read/Write |
|---|---|
| D7: RED select | R/W |
| D6: GREEN select | R/W |
| D5: BLUE select | R/W |
| D4: 145 mv reference select | R/W |
| D3: Result | R |
| D2: 1 | R/W |
| D1: 1 | R/W |
| D0: 1 | R/W |

| D7–D4 | OPERATION | IF D3 = 1 | IF D3 = 0 |
|---|---|---|---|
| 0000 | Normal operation | don't care | don't care |
| 1010 | RED DAC compared to BLUE DAC | RED > BLUE | RED < BLUE |
| 1001 | RED DAC compared to 145 mv reference | RED > 145 mv | RED < 145 mv |
| 0110 | GREEN DAC compared to BLUE DAC | GREEN > BLUE | GREEN < BLUE |
| 0101 | GREEN DAC compared to 145 mv reference | GREEN > 145 mv | GREEN < 145 mv |

Figure 44:
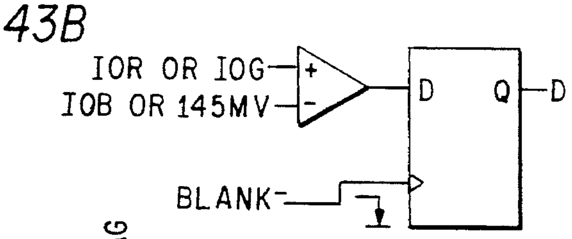
FIG. 44 is a schematic diagram for an analog test circuit in the test circuitry of FIG. 32.
Figure 45:
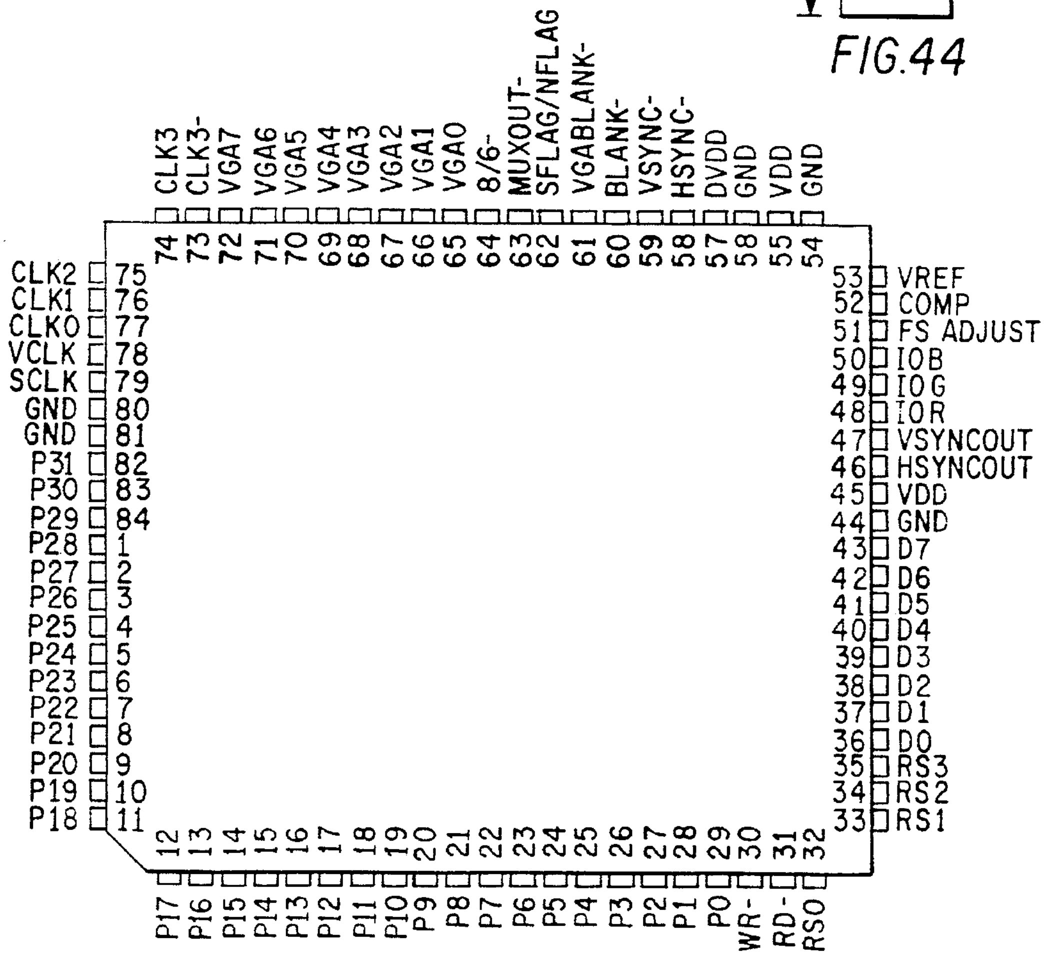
FIG. 45 is a diagram of pins of a semiconductor chip package holding a chip bearing the circuitry of the palette device of FIGS. 31 and 32.
Figure 46:
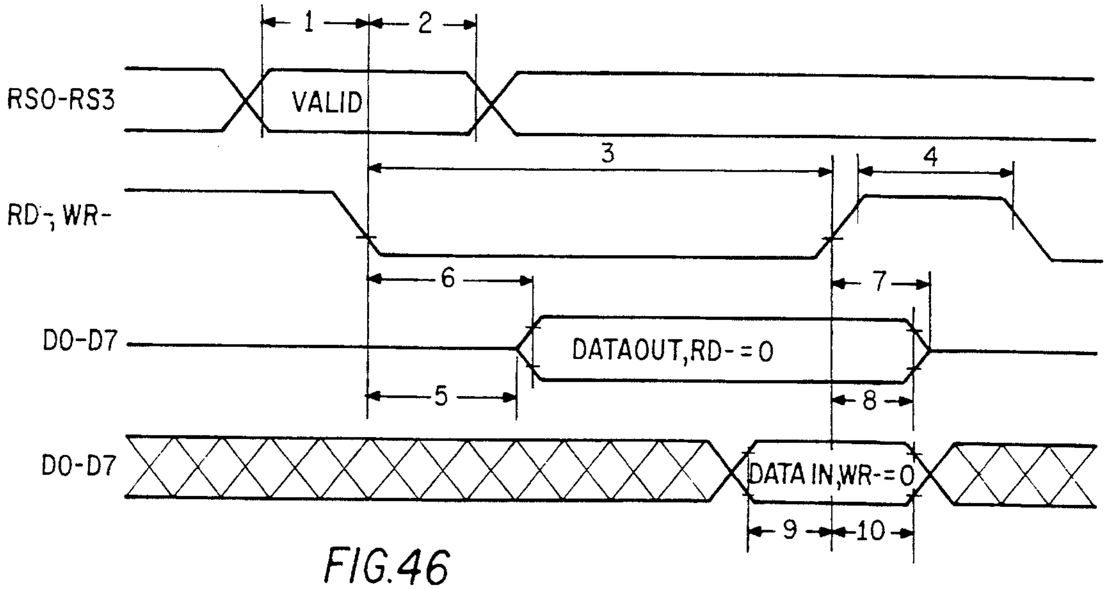
FIG. 46 is a waveform diagram of timing of register select bits RS0–RS3, and read, write and data signals in the palette device of FIGS. 31 and 32.
Figure 48:
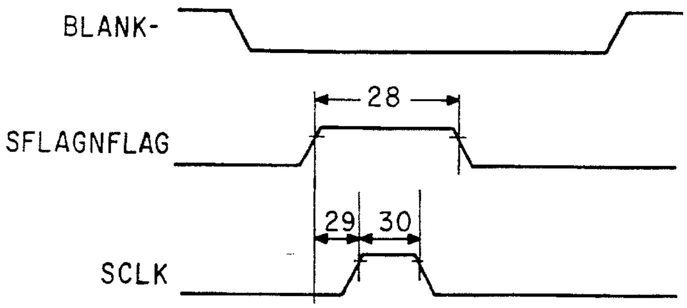
FIG. 48 is a waveform diagram of timing of blanking, SSRT input, and shift clock SCLK when SSRT pulse insertion is enabled.
Figure 47:
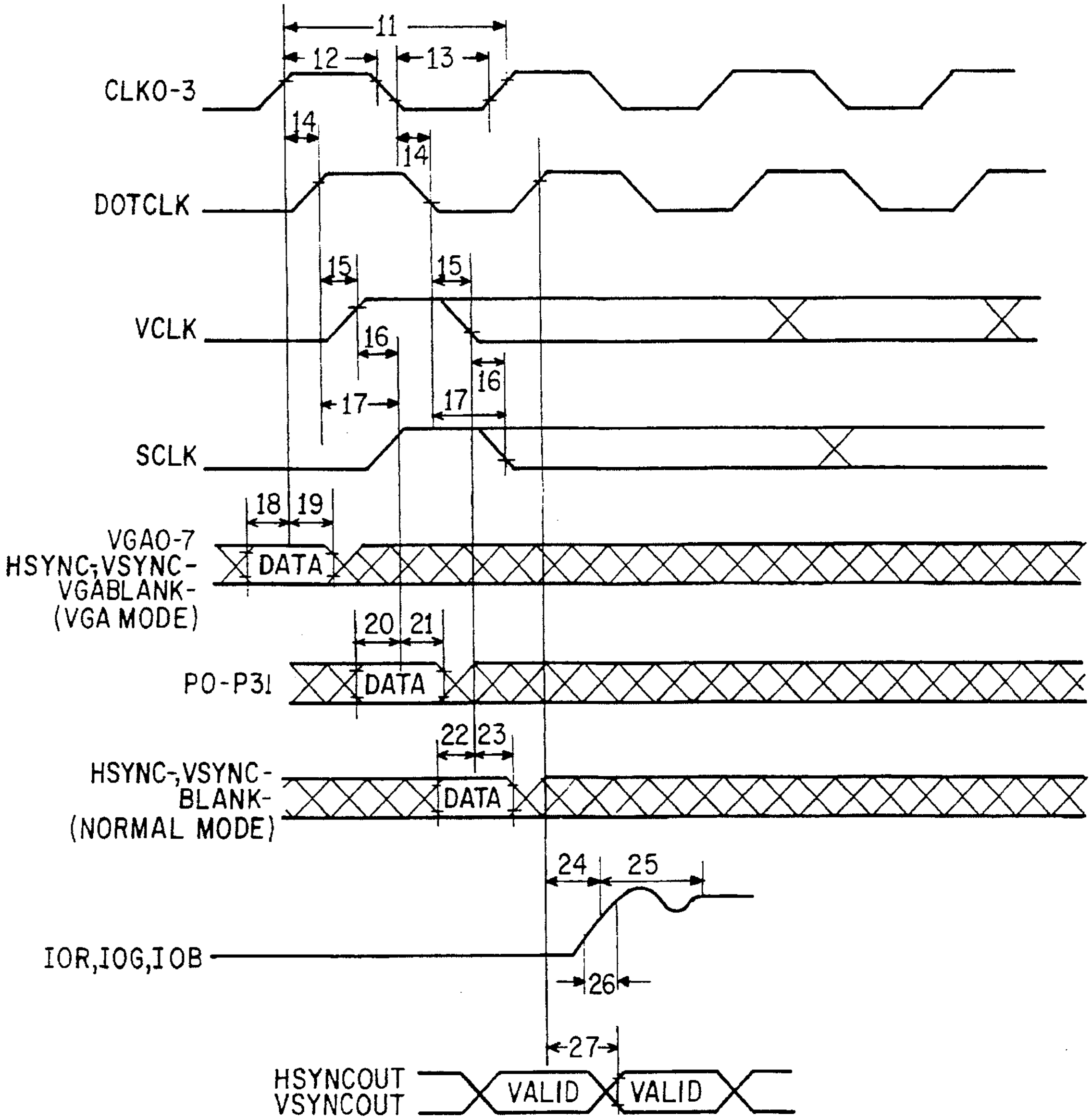
FIG. 47 is a waveform diagram of timing of clock and video control signals in the palette device of FIG. 31 and 32.

NOTE: All the outputs have to be terminated to compare the voltage, see FIG. 44.

The above table lists the valid comparison combinations. A logical one enables that function to be compared: the result is D3. The comparison result is strobed into D3 at the falling edge of the input BLANK- signal (before the pipeline delay), in order to have stable inputs to the comparator, the frame buffer inputs should be set up to always pointing to the same color RAM location.

For normal operation, D7–D4 must be logical zero in this Analog Test Register.

PIN DESCRIPTION (FIG. 45)

| Pin Name | Description |
|---|---|
| CLK0–CLK2 | Dot Clock inputs. Any of the three clocks can be used to drive the dot clock at frequencies up to 80 MHz. When VGA mode is active, it's default to used CLK0. |
| CLK3, CLK3– | Dual mode Dot Clock Input. This input is essentially an ECL compatible input but two TTL clocks may be used on the CLK3 & CLK3– if it's so selected in the Input Clock Selection Register. This input may be selected as the dot clock for any frequency of operation up to the device limit while in the ECL mode. |
| P0–P31 | Pixel input port. The port can be used in various modes as shown in the MUX Control Register. All the unused pins need to be tied to GND. |
| VGA0–VGA7 | VGA pass-through bus. This bus can be selected as the pixel bus for VGA mode. |
| IOR, IOG, IOB | Analog current ouputs. These outputs can drive a 37.5Ω load directly (doubly terminated 75-Ω line), thus eliminating the requirement for any external buffering. |
| VREF | Voltage reference for DACs. A voltage reference of nominally 1.235V should be input on this pin. |
| COMP | Compensation pin. Provides compensation for the internal reference amplifier. |
| FS ADJUST | Full scale adjustment pin. A resistor connected between this pin and ground controls the full scale range of the DACs. |
| SCLK | Shift clock output. This output is selected as a division of the dot clock input. The output signals are gated off during Blank, although SCLK is still used internally to synchronize with the negating of BLANK–. |
| VCLK | Video clock output. User programmable output for synchronization to graphics processor. |
| SFLAG/NFLAG | Split shift register transfer flag or Nibble flag input. This pin has dual function. When the General Control Register bit 3 = 0 & bit 2 = 1, Split shift register transfer function is enabled and a low to high transition on this pin during a blank sequence initiates an extra SCLK cycle to allow a split register transfer in the VRAMS. When the General Control Register bit 3 = 1 & bit 2 = 0, Speical Nibble Mode in enabled and this input is sampled at the failing edge of VCLK. A high value sampled indicates the next SCLK rising edge should latch the high nibble of each byte pixel data and low value indicates low nibble (See 1.9). When the General Control Register bit 3 = 0 & bit 2 = 0, this pin is ignored. The condition of General Control Register bit 3 = 1 & bit 2 = 1 is not allowed, and the operation is unpredictable if they are set so. |
| RS0–RS3 | Register select inputs. These pins specify the location in the register map that is to be accessed, as shown in table 1. |
| D0–D7 | MPU interface data bus. Used to transfer data in and out of the register map and palette/overlay RAM. |
| RD- | Read strobe input. A logic 0 on this pin initiates a read from the register map. Reads are performed asynchronously and are initiated on the low going edge of RD-, see FIG. 7. |
| WR- | Write strobe input. A logic 0 on this pin initiates a write to the register map. As with RD- write transfers are asynchronous and initated on the low going edge of WR-, See FIG. 7. |
| 8/6- | DAC resolution selection. This pin is used to select the data bus width (8 or 6 bits) for DAC. When this pin is a logical 1, 8-bit bus transfers are used with D7 being the MSB and D0 the LSB. For 6-bit bus operation, while the color aplette still has the 8 bit information, D5 shifts to the bit 7 position with D0 shifted to the bit 2 position and the two LSB's are filled with zero's at the Output MUX to DAC. The palette holding register will zero the 2 MSB's when it's read in the 6-bit mode. |
| HSYNC-, VSYNC- | Horizontal and vertical sync inputs. These signals are used to generate the sync level on the green current output. They are active low inputs for the normal mode and passed through a true-complement gate. For the VGA mode, they will be passed through to HSYNCOUT & VSYNCOUT without polarity change, the operation of which is specified by the control regiser (see §1.8). |
| HSYNCOUT | Horizontal sync output of the true/complement gate mentioned above (see §1.8). |
| VSYNCOUT | Vertical sync output of the true/complement gate mentioned above (see §1.8). |
| BLANK-, VGABLANK- | Blanking inputs. Two blank inputs are provided in order to remove any external multiplexing of the signals which may cause data and blank to skew. When the VGA mode is set in the MUX Control Register (2D HEX), the VGABLANK- input is used for blanking, otherwise, BLANK- is used. |
| MUXOUT- | MUX output control. This output pin is software programmable, it is set low to indicate to exteranl devices that VGA mode is being used when MUX Control Regiser is entered with 2D (HEX). If the bit 7 of the General Control Register is set high after mode set, the output will become high. This pin is only used for external control and it affects no internal circuitry. |
| VDD | Power. All VDD pins must be connected. The analog and digital VDD are connected internally. |
| GND | Ground. All GND pins must be connected. The analog and digital GND are connected internally. |

NOTES:
All unused inputs should be tied to a logic level and not be allowed to float.
All digital inputs and outputs are TTL compatible unless otherwise stated.
Pin names with a minus sign followed (e.g. CLK3–) indicate active low operation.

Figure 32:
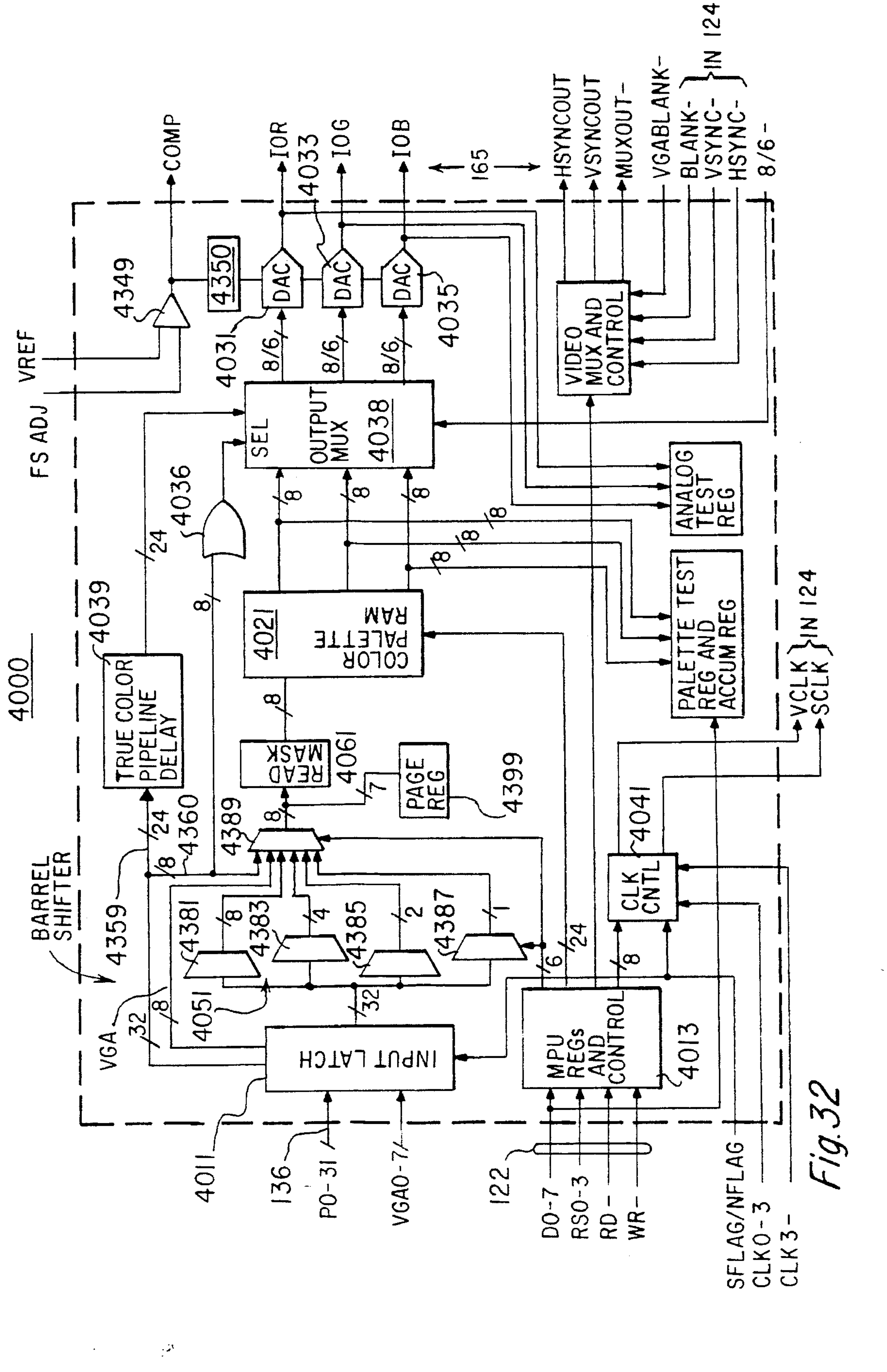
FIG. 32 is a block diagram of the palette device of FIG. 31 emphasizing packed bus, selectable pixel width capability; true color and overlay features; VGA pass through; ones-accumulation and analog test features; and other features.

The selector circuitry 4051 of FIGS. 31 and 32 is programmed by the entries in register map 4013 to operate in any one of several modes defined by Table 4. While the selector circuitry is shown as a network of multiplexers and some embodiments suit themselves to use of gate logic multiplexers, shift register selection circuitry such as a barrel shifter implementing the input latch 4011 and selector 4051 is presently believed to be even more fully suitable for use at frequencies even up to the highest dot clock rates.

In several of the modes selector 4051 acts as an example of color code transfer circuitry connected between the input latch 4011 and the look-up table memory 4021 to supply the look-up table memory 4021 from the input latch 4011 sequentially with color codes of selectable width packing the entire width of the bus. Control register 4371 via decode circuitry 4052 of FIG. 31 configures the barrel shifter to function like the set of multiplexers 4381, 4383, 4385 and 4387 in the FIG. 32 detail of selector 4051.

The multiplexers have selection inputs receiving the control signals which operate the multiplexers according to each mode established by the contents of control register 4371. The multiplexers 4381–4387 have data inputs connected to input latch 4011 for the entire width of the bus 136 and each of the multiplexers has a number 8,4,2 or 1 of outputs which is a different submultiple /4,/8,/16, or /32 of the width of the 32 bit bus 136. When a given one of the multiplexers 4381–4387 is activated, the decoder and counter circuitry 4052 operates that multiplexer to cyclically and sequentially transfer to the look-up table memory 4021 the contents of the input latch 4011 for the entire width of the bus 136 in sets of parallel bits equal in number to the number of outputs 8,4,2,or 1 of the multiplexer or multiplexer function of the barrel shifter.

Decoder and counter 4052 can sequentially cycle across part or all of the input latch width and the entire bus width of bus 136 may only connect to part of the latch width. Thus, the bus width to which the multiplexers respond can also be advantageously programmed. In this way selector circuit 4051 and decoder and counter circuit 4052 act as an example of a externally programmable bus width coupling circuit connected between the input and the look-up table memory 4021 to pass color codes from the bus 145 according to the bus width programmed or internally externally for the palette device 4000. In the preferred embodiment, the programmable bus widths are powers of two , as well as a width of 24 in true color mode. Increasingly smaller bus width selections pass bits from sections of input latch 4011 which are increasingly smaller subsets of each other at the most significant bit end of the latch 4011, in one example.

In a still further feature, decoder or counter 4052 in the special nibble mode activates the multiplexers to transfer bits from input latch 4011 by alternately transfering bits, skipping bits, transfering, skipping and, so on. The skipping introduces no delay of its own. While a few modes have been described, it should be apparent from these examples that any selection or sequence of selections of bits from any part or all of either the latch or bus width or from the VGA section can be selected programmably under the control of decoder and counter 4052 and selector 4051. The 32 bit bus width is merely illustrative, and narrower buses or wider 64, 96, and 128 bit buses or any even or odd number of bits in buses can be employed.

In true color mode, output multiplexer 4038 of FIG. 32 acts as selection circuitry having inputs connected to input latch 4011 and to an output of look-up table memory 4021 to supply three color outputs to the digital to analog converters 4030 either with bytes of a color data word supplied by the look-up table memory 4021 or with a color data word comprised of 24 color codes from the input latch 4011. The selection circuitry includes a detector 4036 for a predetermined code such as 0hex from minority bits in the input latch 4011 to make the selection. A delay circuit 4039, for the color data word comprised of the color codes from the input latch, has a first delay that is substantially the same as a second delay inherent in supplying a color data word from the look-up table memory 4021 in response to a color code from the input latch.

In the True Color Mode, 24 bits of data (e.g. bytes A, B, C of FIG. 31) are transferred directly from the input latch 4011 via a pixel bus 4359 of FIG. 32 directly to the DACs 4031, 4033 and 4035. In this mode, overlay is provided by utilizing the remaining 8 bits (such as byte D as the alpha gun or attribute input) of the input latch 4011 as an overlay bus 4360 to address the palette RAM 4021 via multiplexer 4389 and read mask circuit 4061. Such addressing results in a 24 bit palette RAM 4021 output that is then used as overlay information to the DACs 4031, 4033 and 4035. When all the overlay inputs P7–P0 (byte D of input register 4011) are at logic 0, or the read mask register 4353 of FIG. 31 is cleared, no overlay information is displayed. Thus, selector logic 4051 includes logic to detect the state of byte D and control the operations accordingly. Also, when a non-zero value is input to byte D of input register 4011 and read mask register 4353 is not cleared, the color palette RAM 4021 is addressed and the resulting data is then fed through to the DACs, receiving priority over the True Color data on lines 4359 of FIG. 32.

Overlay inputs in True Color mode are the ones that go to the color palette RAM. True Color mode can also operate without occurrence of overlay. Advantageously, however, overlay allows setting of an artificial color data word in the palette RAM 4021 that is not available in the video RAM or to establish a special set of colors for overlaying text or cursor or both on a background, for instance. Overlay can also be used to establish graphics on an ongoing video image in colors that are user controlled in addition to the colors in the video RAM. Some graphics applications can use overlay to outline an object by overlaying the outline graphic on the object as the true color image. Overlay can provide a superset of the available colors.

Circuit 4000 of FIG. 1 provides the shift clock SCLK signal that directly clocks the shift register 139 for each VRAM 130. The SCLK signals can support split shift register transfer VRAMs. Such VRAMs are described in connection with FIGS. 3–21 hereinabove. Background information on VRAMs is found in coassigned U.S. Pat. Nos. 4,639,890, 4,330,852, 4,683,555, and 4,667,313 which are hereby incorporated herein by reference.

In the discussion next, the preferred embodiment has a graphics processor 120 that has its own clock and thus does not necessarily rely for clock on the palette dot clock or derivative of dot clock. The processor 120 may (as in the case of the TMS340x0) contain video counters that are driven by a derivative of the dot clock. It is this latter use of the dot clock in the processor 120 that is next discussed.

The synchronization between palette 4000 and GSP 120 is mediated by both outputs VCLK and SCLK from the palette 4000. In other words, the clocking that coordinates the video counting of GSP 120 with the palette 4000 originates in this embodiment not with the processor 120 but with the palette 4000. The GSP 120 is connected to use the VCLK to determine where relative on a particular scan line of the image operations are occurring. VCLK also is used by GSP 120 to determine when GSP 120 should assert blank and assert the sync pulses HSYNC and VSYNC.

GSP 120 in FIG. 2 has counters in video display controller 270. The counters count up in response to clocking by video clock VCLK. At a predetermined count, blanking is output. At a subsequent predetermined count, sync pulse is output. At a still further predetermined count, the sync pulse is released and then the blanking is released, and then the count is restarted. The counter is reset at the start of the sync pulse. VSYNC and HSYNC from processor 120 are sent via bus 124 to palette 4000 FIG. 32 block Video Mux and Control at pins VSYNC and HSYNC. The processor 120 can be dedicated to the graphics function and sets up the signals to accommodate whatever monitor display standard is appropriate to display 170, and thus establishes the blanking and sync pulse timing.

In the computer graphics system 100 of FIG. 1, the palette 4000 creates the time base for the front end GSP 120. The front end in effect closes a loop by using the time base to create blanking and sync signals which are then sampled by the back end, here palette 4000. The loop is advantageously closed because there is a discontinuity between the random access side of the VRAM, which is what the GSP 120 accesses, as contrasted with the operations of palette 4000. In this way, the GSP elegantly counts pulses and can determine when the operations in the VRAM 130 are occurring.

In a further related feature, blanking precess delay circuit logic 4384, 4322 and 4321 of FIG. 31 has an input connected to a selected blanking signal BLANK- or VGABLANK- from input latch 4011 selected by a multiplexer 4386. A second input of logic 4322 is connected for clocking by clock circuitry 4041. Delay logic 4322 imparts a variable delay or programmable delay which is followed by a fixed delay 4321 that feeds the DACs 4030 with blanking precisely coordinated with the last pixel in each line.

In FIG. 31, blanking precess is the delay that changes depending on what the bus width to pixel depth ratio N is. For example, aside from a fixed delay F2 of circuit 4321 to compensate for the inherent delay in the architecture of the palette, the blanking precess delay circuit logic takes into account the number of dot clock cycles needed to transfer the contents of the input latch 4011 to the RAM 4021. This number of cycles is directly proportional to the ratio of bus width to the pixels per bus load of Table 4. That determines how much additional delay is necessary from the time that blank goes active on the input pin BLANK- until the circuit drives the DACs 4031, 4033 and 4035 to the blank level in FIG. 31. When processor 120 counts a predetermined number of VCLK pulses, it asserts its BLANK pin which is connected to the palette 4000 blank input pin. At that time, the palette 4000 has to take account of how many pixels are still left in the input selector 4051 that are left to display before it drives the DACs into blanking. The blanking precess delay circuit logic 4322, 4321 thus determines how many dot clock periods the palette 4000 should wait before driving the DACs into blanking. If blanking is asserted to the DACs too soon, one or more pixels are lost from the display. If blanking is asserted to the DACs too late, a meaningless "garbage" pixel is introduced into the delay. Blanking precess logic advantageously causes the blanking to occur at just the right time, no matter what combination is chosen of width of data path and number of pixels per bus load in FIG. 31 control register 4371.

In FIG. 31, a selector-mode dependent variable delay plus appropriate fixed delay is provided as a total delay by circuit 4322,4321 for each video control signal, not only BLANK but also HSYNC and VSYNC. In some other embodiment the variable delay on sync is omitted because the timing of sync is less critical than for blanking. Part of the delay is switchably bypassed in VGA pass through mode to provide a fixed delay F1 in that mode.

Figure 31A:
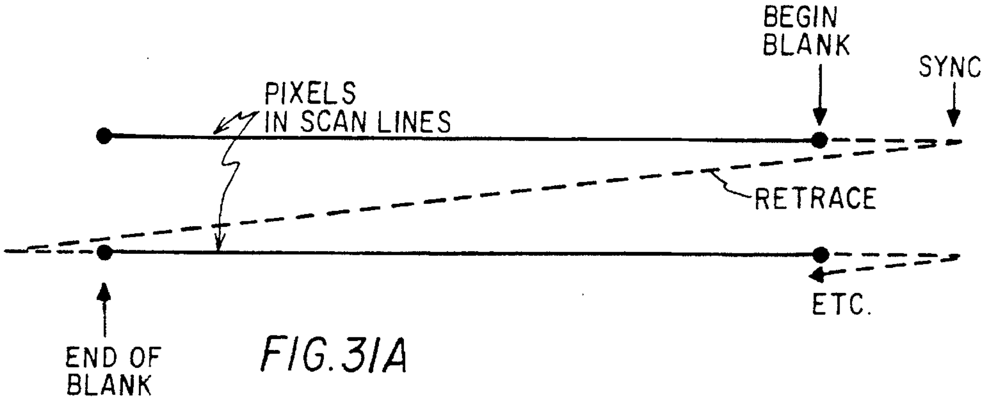
FIG. 31A is a magnified pictorial of two scan lines in a raster scan video display to illustrate timing of blank and sync signals.

FIG. 31A shows why sync is less critical in timing than blanking. In a raster-scanned CRT monitor, for example, the intensity of pixels in the scan line is precisely terminated at the end of each scan line by the onset of blanking. Blanking sampling circuit 4384 and blanking precess delay circuit logic 4322 and 4321 establish the termination by input to blank the DACs 4030. However, the sync pulse in composite video in FIGS. 39 and 40 is roughly centered in the middle of the blanking. Consequently, as shown in FIG. 31A by dotted lines, continued deflection of the extinguished scan line (dotted) until sync and during retrace (diagonal) is invisible to the viewer. When blanking ends (at left), the length of blanking is precisely established by GSP 120 and precisely delayed in palette 4000 to allow the first pixel in the next scan line to be viewed. A small error in delay of sync does not alter the relative position of the scan lines or clip off any pixels, and therefore can be tolerated in another embodiment.

In general, the palette device is provided with a mode circuit such as register 4371 establishing one of a plurality of different operating modes. Color code processing circuitry (such as selector 4051, RAM 4021) is operable according to a mode established by the mode circuit and responsive to the color codes to supply color data words that are convertible to analog form wherein the color code processing circuitry depending on the different modes establishes different time intervals between input of the color codes to the color code processing circuitry and supplying of color data words. A variable delay circuit (such as 4322, 4321) responds to the mode circuit to delay the video control signal (such as blanking, sync or any other display control signal) by a time interval depending on the mode established by the mode circuit. The variable delay circuit is connected to control the DAC with the video control signal thus delayed. Since the selector 4051 sequentially delivers different sets of bits from the input latch to the look-up table memory in different modes in FIG. 31, the sequential delivery makes the time interval in the color code processing circuitry different in the different modes. Thus, the delay can vary from mode to mode in correspondence with the amount which a time for sequential delivery in the selector 4051 varies from mode to mode.

In general in various embodiments, the skilled worker determines the circuit delay of the DACs, and of the palette circuitry ahead of the DACs, and adds the delays to obtain the amount of delay which should be built into block 4321.

Propagation time elapses between the time when processor 120 counts up to and reaches the predetermined count at which blank is issued, and when the blank signal arrives at palette 4000 from GSP 120. Furthermore, there is a clock delay because the processor 120 video counter circuitry and palette 4000 are in sync but offset in time from each other. This clock delay is described more fully in connection with FIG. 49–50. So the palette 4000 sends VCLK and SCLK with propagation delay to the processor 120 where counters are running at a time offset to palette 4000. Then processor 120 returns blank and sync signals with propagation delay to the palette 4000. This creates a situation where blank and sync are offset relative to the palette perspective by some indeterminate delay that amounts to a skew off the dot clock. This blank or sync skew at a dot period of 7 to 16 nanoseconds can vary across multiple pixels of the image. However, for display integrity, blanking desirably should occur exactly on a correct dot edge, wherein the image goes into blanking exactly upon display of the last pixel in each line.

Figure 49:
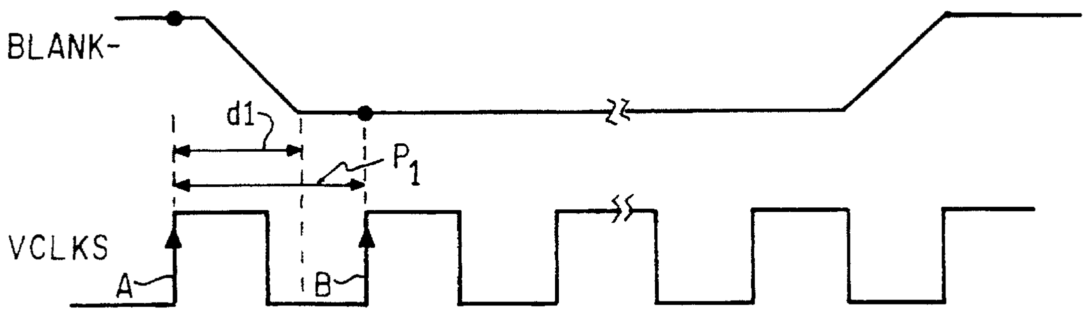
FIG. 49 is a waveform diagram of timing in a process of sampling the blanking signal with clock signals of increasingly higher time resolution to establish a sampled blank signal (Q output of X24) for blanking the digital to analog converters such as the one in FIG. 38.
Figure 50:
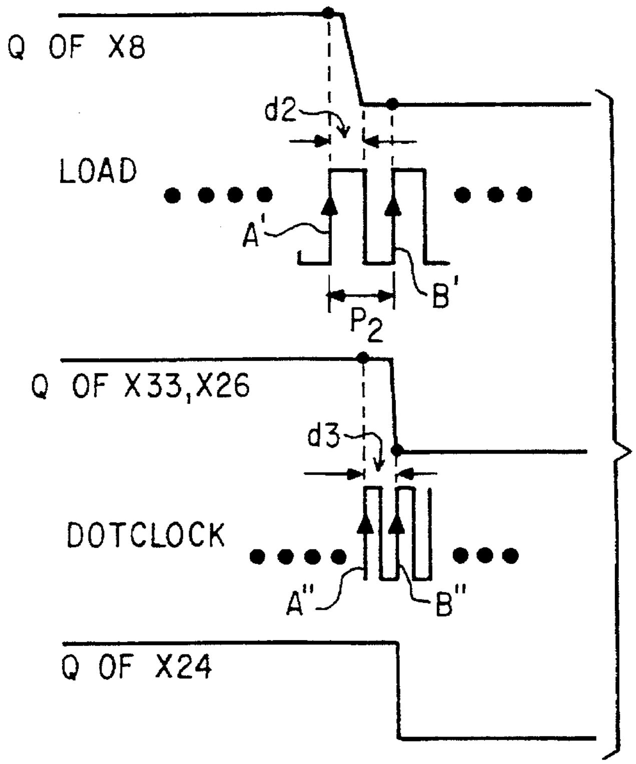
FIGS. 50 and 50B are schematic diagrams of flip-flops clocked with ascending time resolution to perform the process of sampling the blank signal of FIG. 49.
Figure 50A:
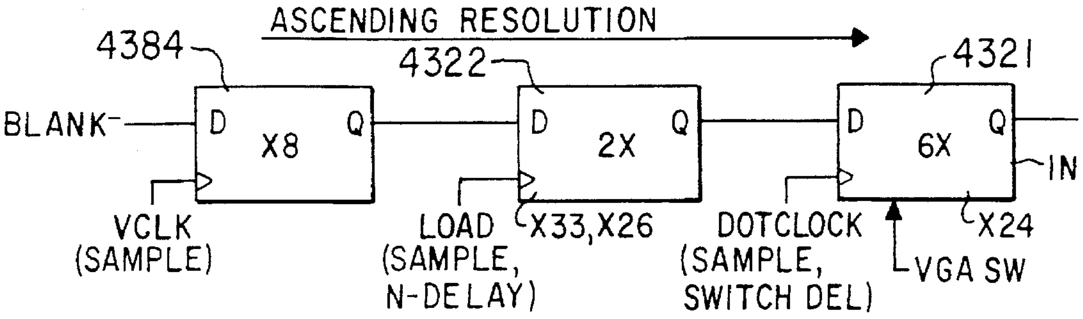

Since blank can vary over 4–8 dot clock periods and needs to be sync'd back up in the DAC and asserted in just the right window, the timing is done by a sampling process with ascending resolution shown in FIGS. 49–50 in blocks 4384, 4322 and 4321. The resynchronization or sampling can be and is mixed with blanking precess delay in the circuitry but these two concepts are different and both confer advantages to the preferred embodiment.

One transition edge A of VCLK in FIG. 49 triggers blank from processor 120. Flip-flop 4384 uses the next transition edge of same rising or falling sense in VCLKS to sample, capture or trap the newly arrived blank value or signal. So the maximum allowable skew implicit is one VCLK period. If there more skew than that, the frequency of VCLK is decreased by reprogramming the VCLK divide ratio established by the output clock select register OCS 4363 in order to allow processor 120 more time between edges to assert blank. The VCLK period should be significantly longer than the BLANK (from GSP 120) transition time. BLANK can be sampled effectively at a dot clock edge that occurs well after the VCLK edge (rising) that causes BLANK- transitions. This insures that resynchronization can be accomplished.

Clocking of flip-flop 4384 by VCLKS samples blank from GSP 120 to the resolution of the video clock, thereby recapturing blank to that resolution. VCLKS has a selectable period as short as the dot clock period or as long as 32 times the dot clock period. In an example of 20 nanosecond dot clock period, the period of VCLKS would be 20 nanoseconds or more. The multiple is suitably a power of 2 that insures that between any two VCLKS edges there will occur one and only one blanking edge. Sampling has about a two nanosecond time between a clocking transition and appearance of valid Q output of a flip-flop 4384 being clocked.

By sampling the signal, the variability in the blanking edge is reduced to the settling time of the flip-flop 4384.

In FIG. 49 VCLKS operates at nanoseconds compared to BLANK at microseconds. Since the period of VCLKS is programmable, the rising edge A can be made to see a high level of BLANK- while edge B at period P1 later, will see a low level of BLANK-. Then edge B triggers flip-flop 4384 causing its output to fall. The time uncertainty d1 is on the order of 0–40 nanoseconds. The use of flip-flop 4384 reduces the uncertainty in a time when the flip-flop 4384 output occurs to amount d2 which is an uncertainty of perhaps 1–2 nanoseconds. Even though the edge B is even more delayed than the amount d1 by which BLANK is indeterminately delayed, the edge B has a known time relationship to the dot clock, which is the point of recovering correct time relationship for blanking. Having established a relationship between the output Q of one VCLK period P1, a multiple of dot clock period, two further stages of sampling increase the time resolution of the sampling in FIGS. 50, 49 and 52.

In successive flip-flops in FIG. 50, increasingly higher frequency clock signals clock the flip-flops 4384, 4322 and 4321, thereby confining the blanking edge to ever higher time resolution. This arrangement of clocking flip-flops in order of ascending time resolution is called acceleration herein. The resolution reaches dot-clock resolution upon entry of the blanking signal into the pipeline 4321.

Selectable delay is advantageously introduced by clocking flip-flops 4322 with a signal LOAD. LOAD bears the same divide ratio to dot clock as shift clock SCLK and runs continuously, instead of being interrupted during blanking like SCLK. Therefore clocking flip-flops 4322 with LOAD introduces a delay in dot clock periods that firstly corresponds to the clocking of input latch 4011 by LOAD and secondly which is equal to the number of dot clock periods used by selector 4051 to transfer all the pixels from input latch 4011 to RAM 4021. This is precisely the desired blanking precess delay. Thus, time resolution is increased and blanking precess occurs also.

The output of flip-flops 4322 is supplied to the pipeline 4321. The pipeline is clocked by dot-clock, completing the sampling at highest time resolution and providing fixed delay, thereupon producing blanking internal signal BLBD for blanking to the DACs. Since blanking BLBD has a known relationship of delay relative to the dot clock edge which earlier propagated to processor 120 to initiate blanking, and delay in the signal path in the palette 4000 corresponds to and is compensated by that delay, the color signal output is precisely synchronized with blanking.

Figure 51:
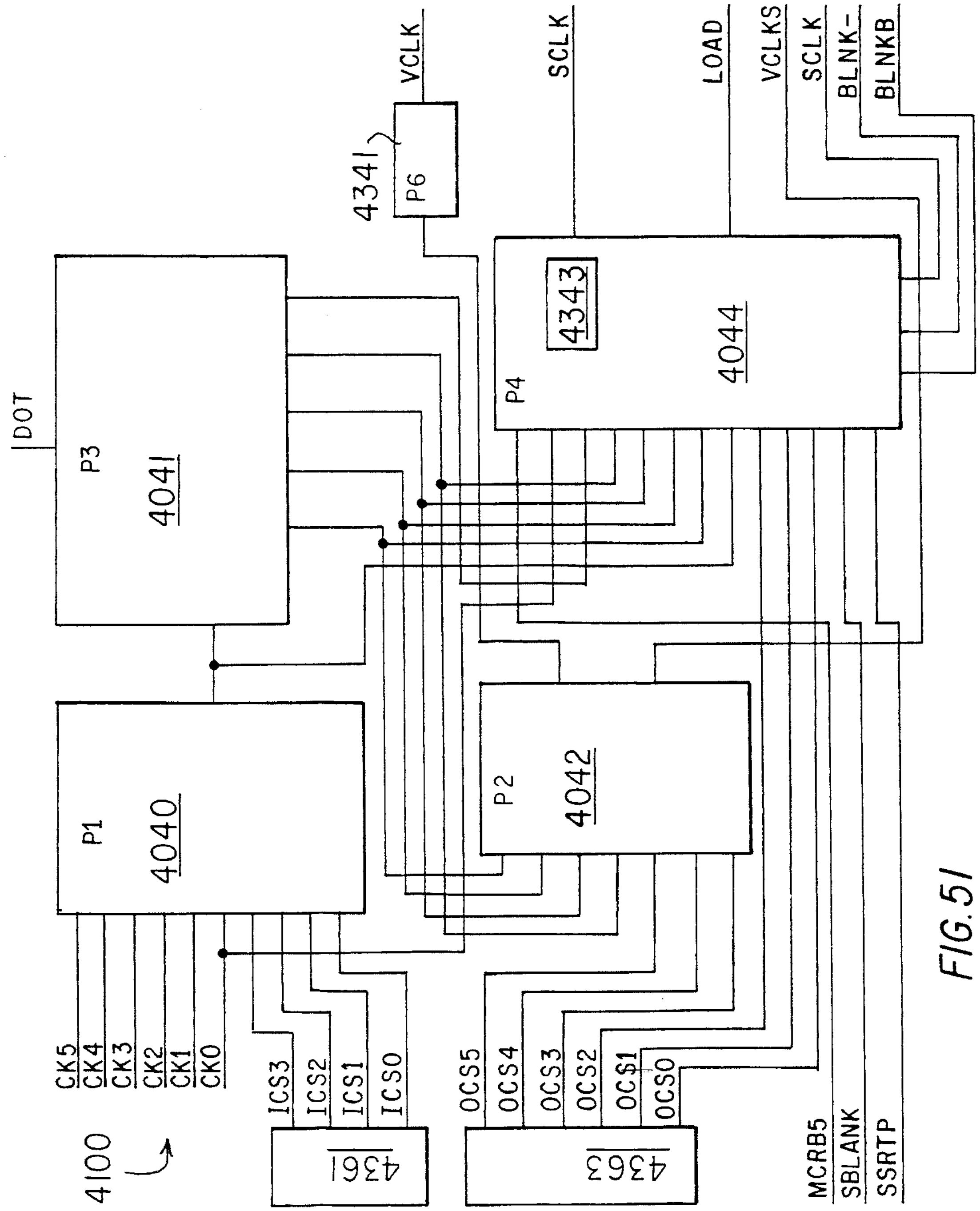
FIG. 51 is a schematic diagram of clock control circuitry in the palette device of FIGS. 31 and 32.
Figure 52A:
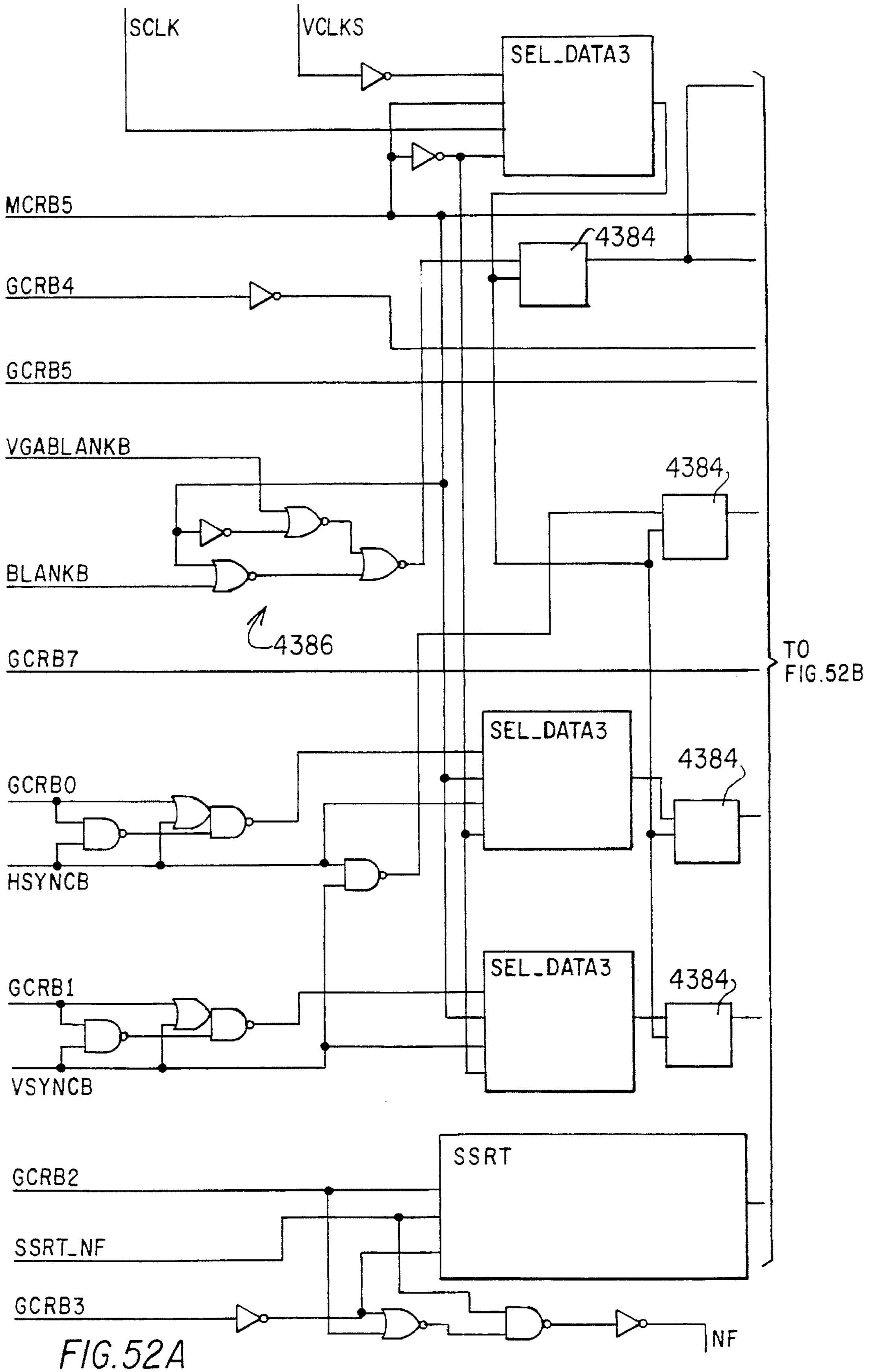
FIGS. 52A and 52B are schematic diagrams of circuitry for sampling the blanking signal and providing selectable variable delay in the palette device of FIGS. 31 and 32.
Figure 52B:
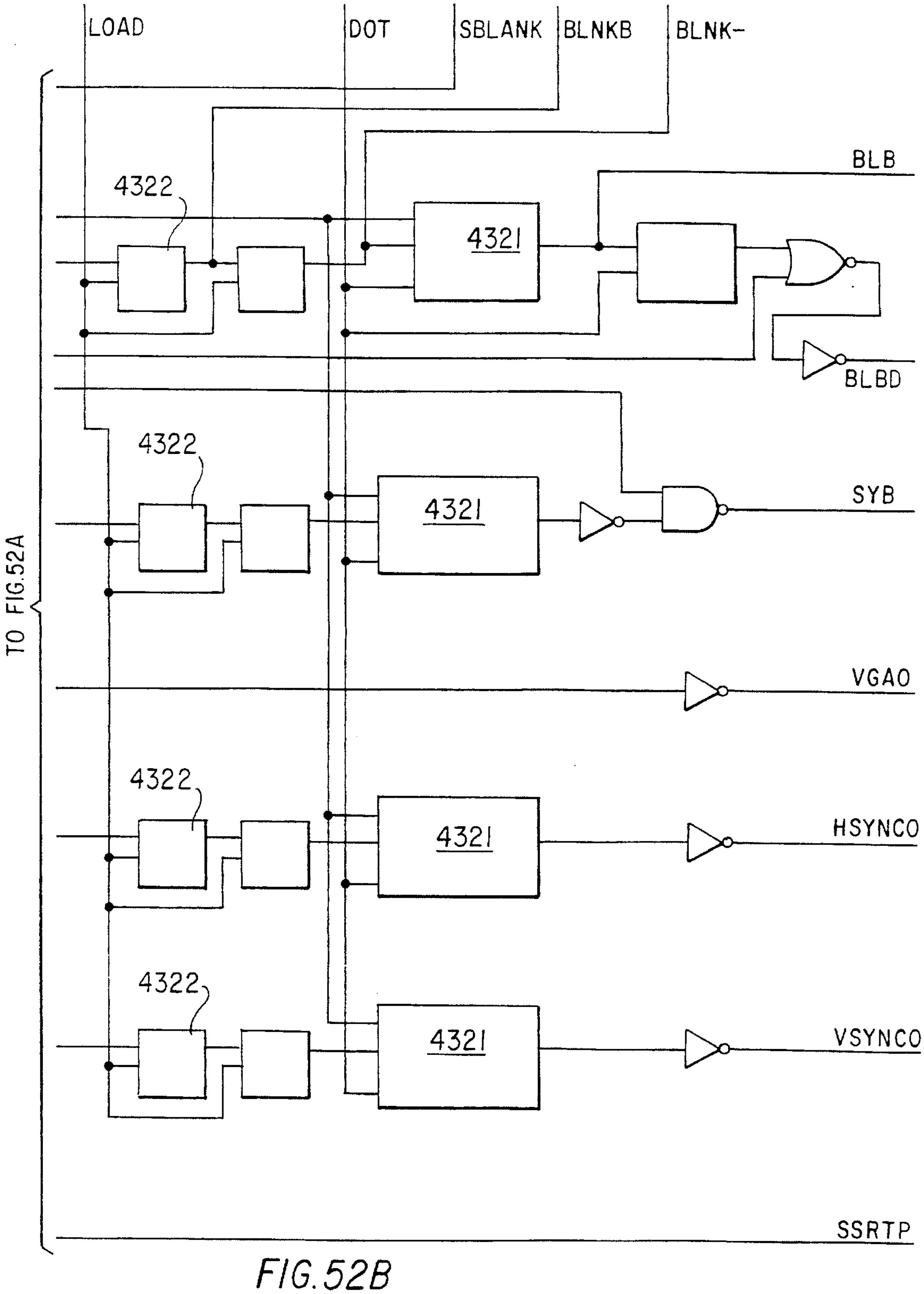
Figure 53A:
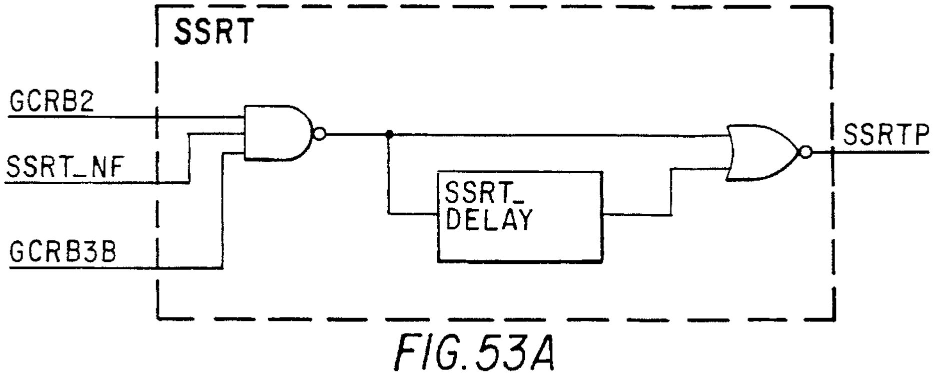
FIGS. 53A, 53B, 53C and 53D are detailed schematic diagrams of circuit parts of FIG. 52.
Figure 53B:
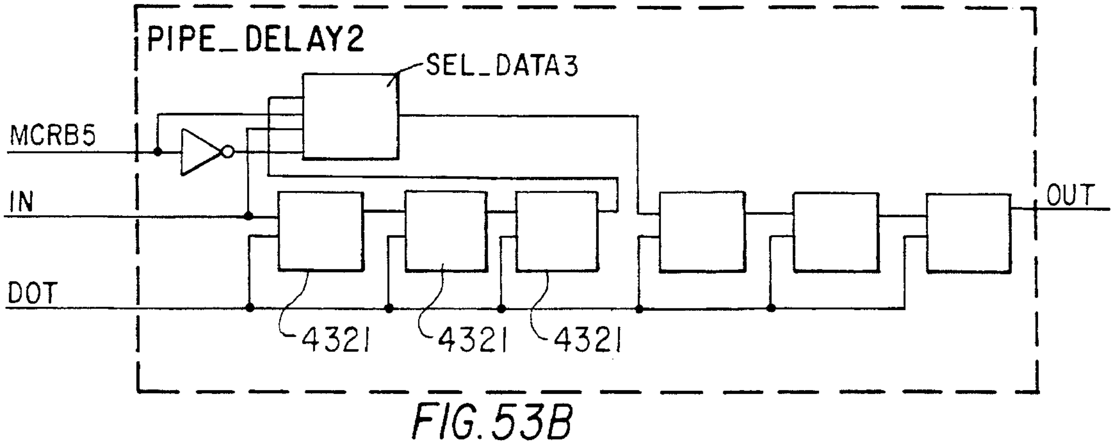
Figure 53C:
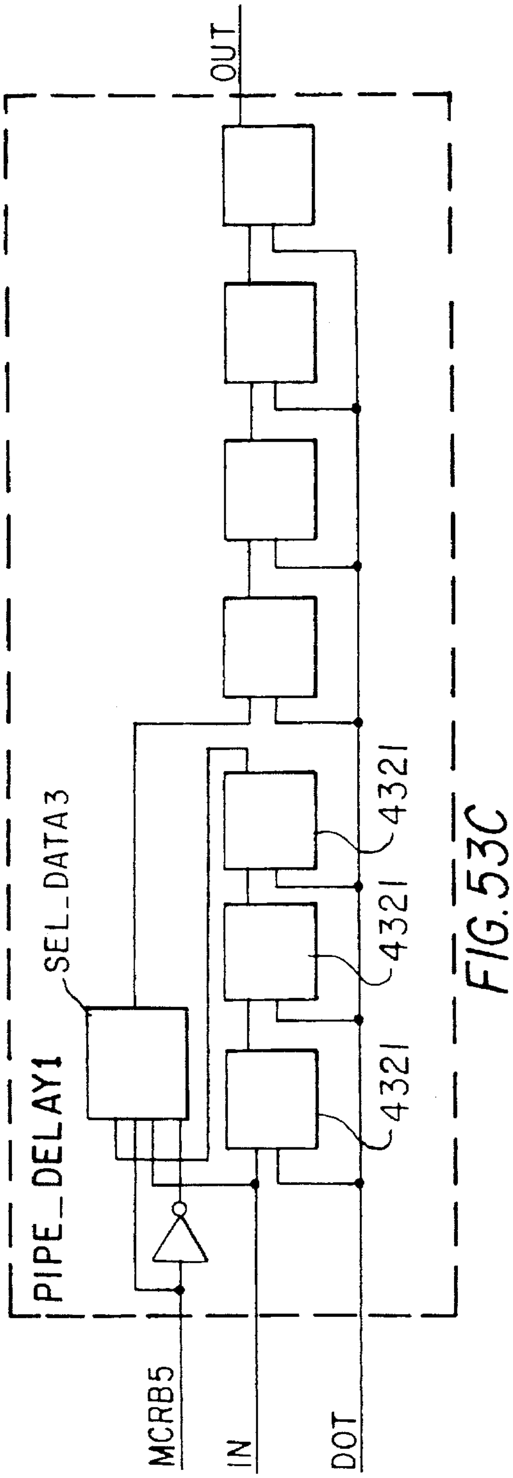
Figure 53D:
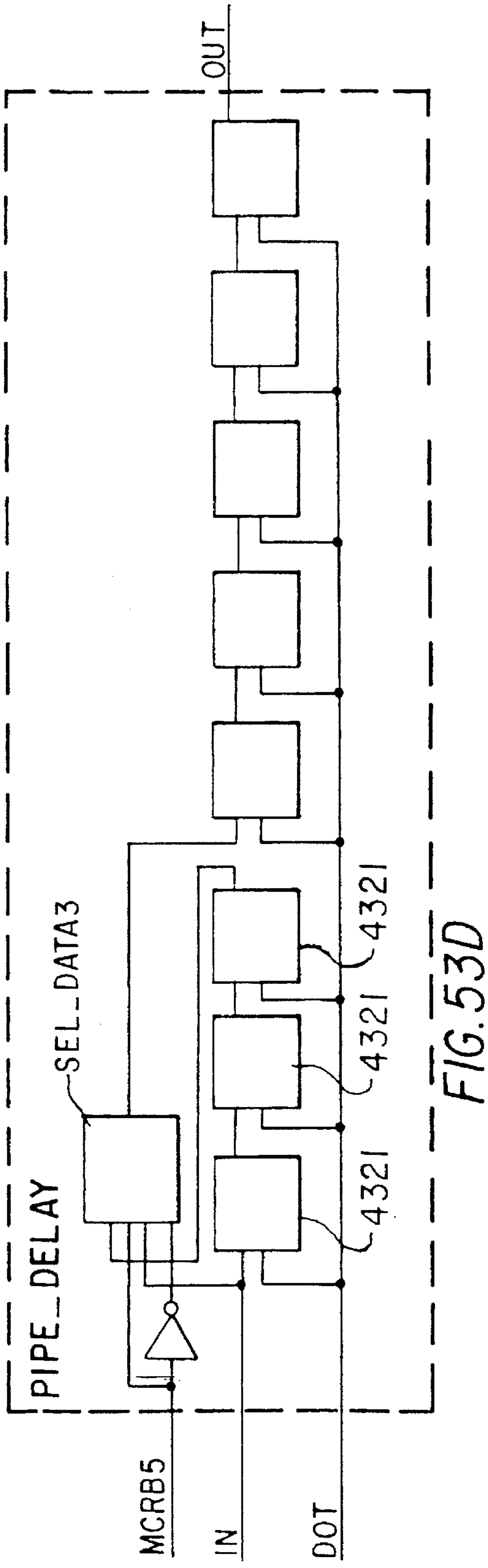
Figure 54A:
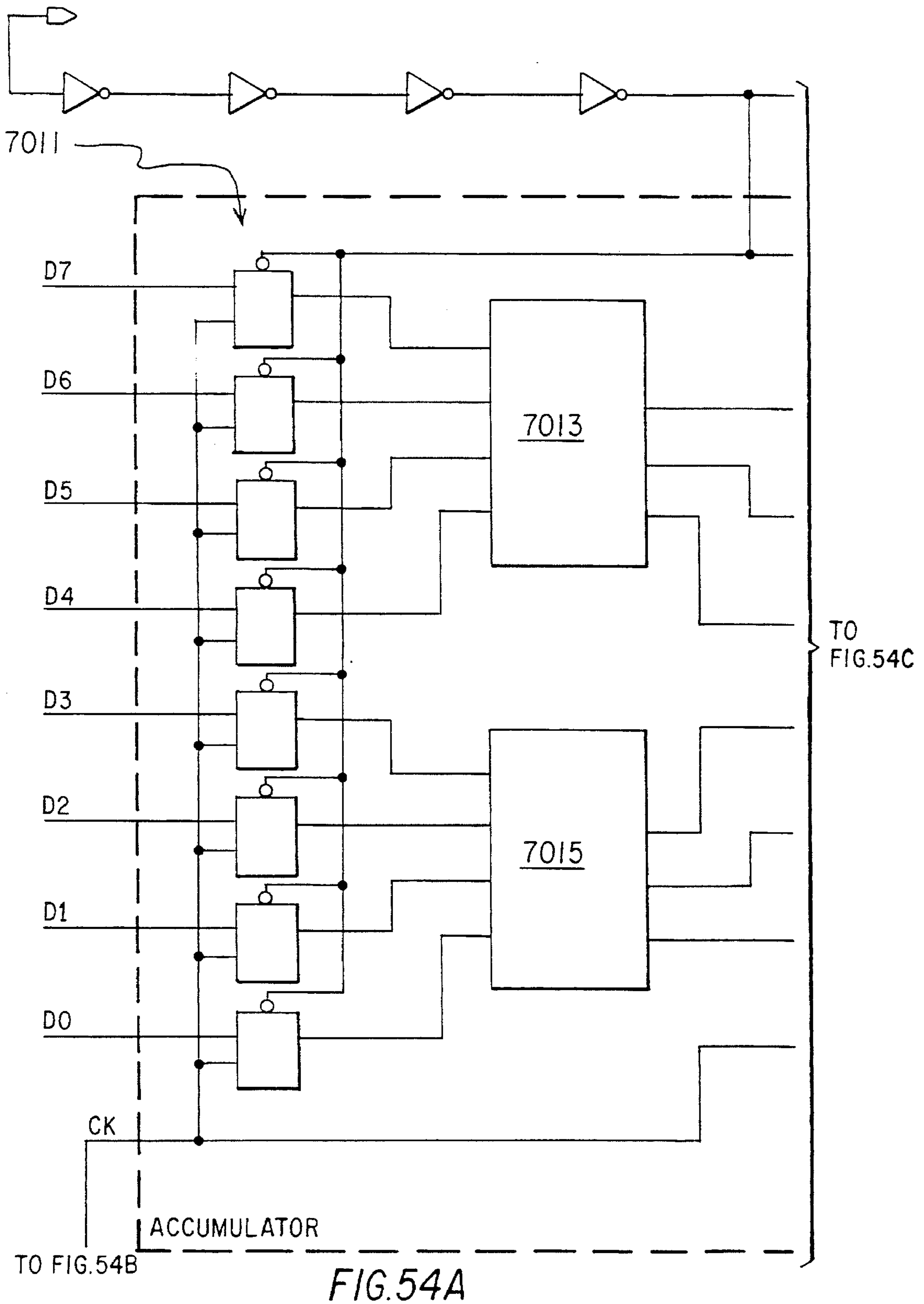
FIG. 54A, 54B, 54C, 54D and 54E are schematic diagrams of an accumulator circuit for test circuitry of FIGS. 31 and 32.
Figure 54B:
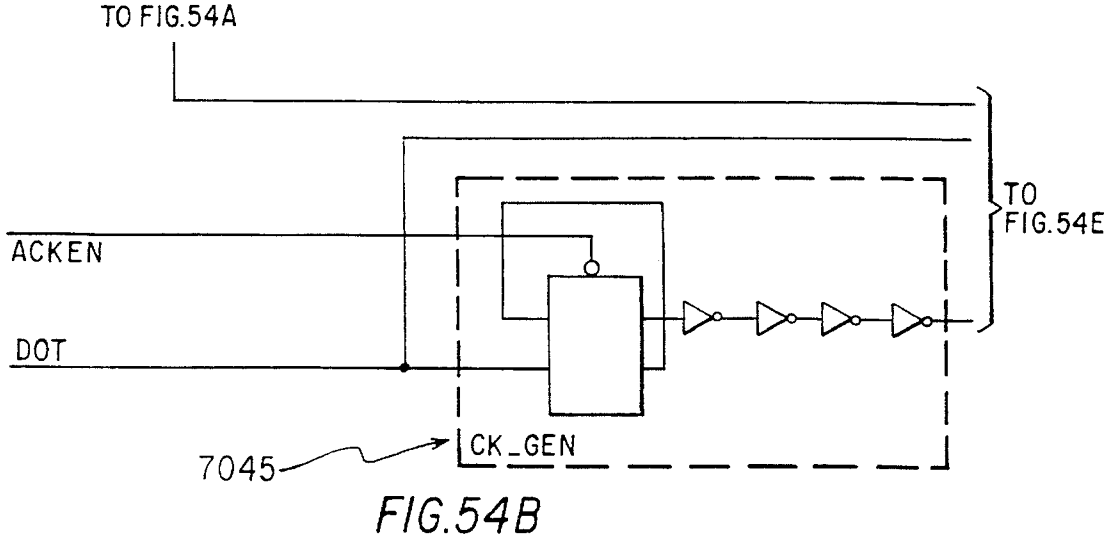
Figure 54C:
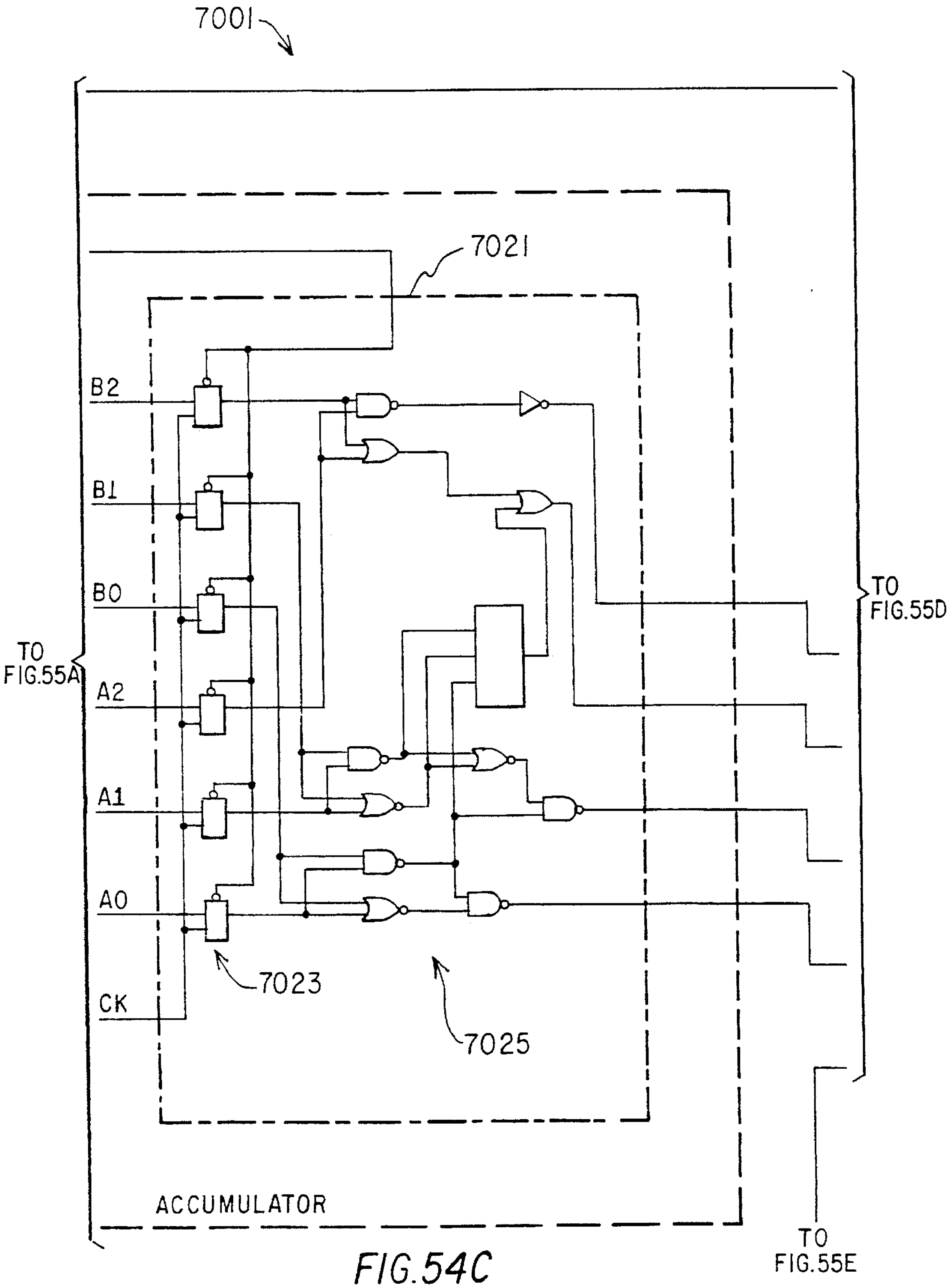
Figure 54D:
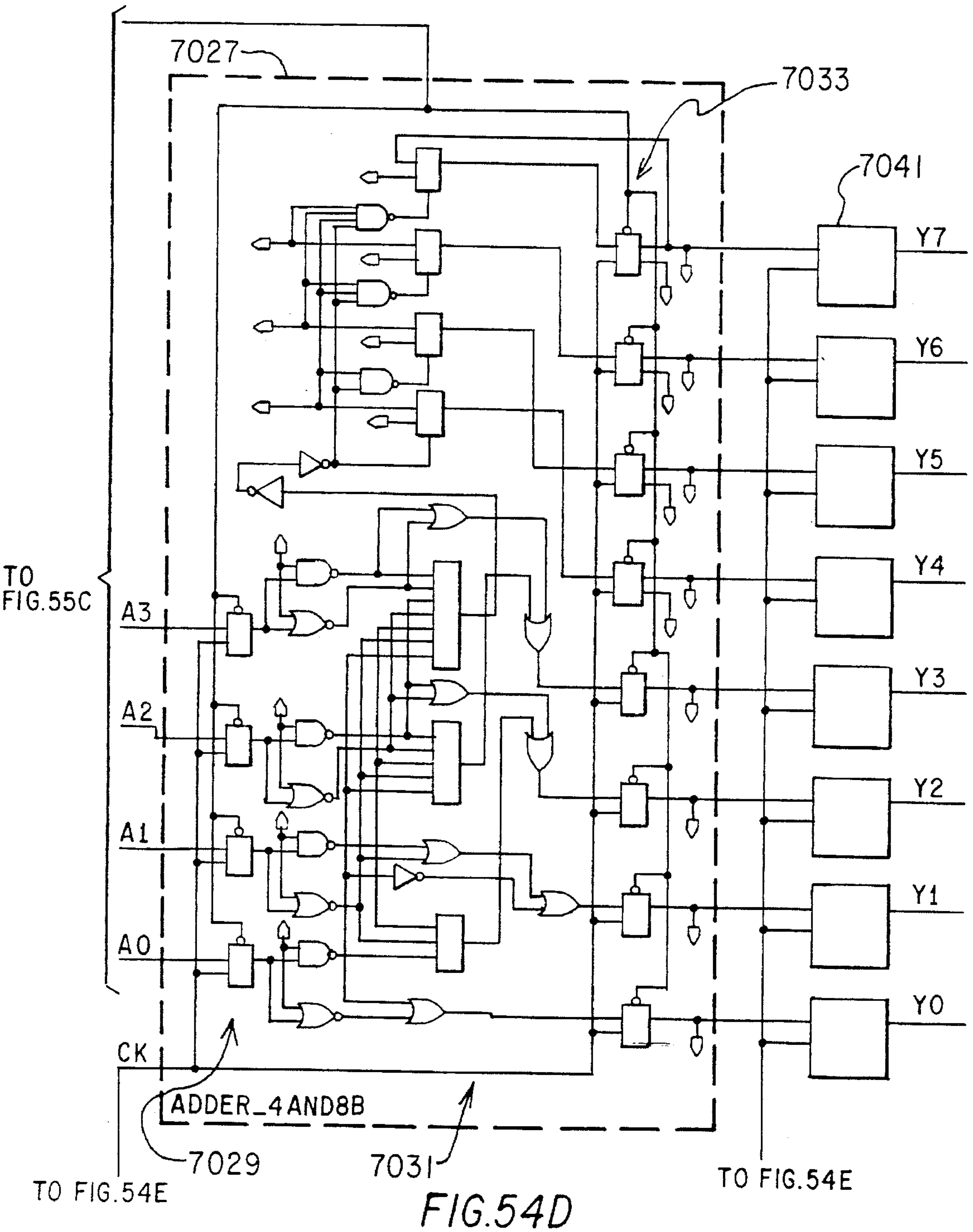
Figure 54E:
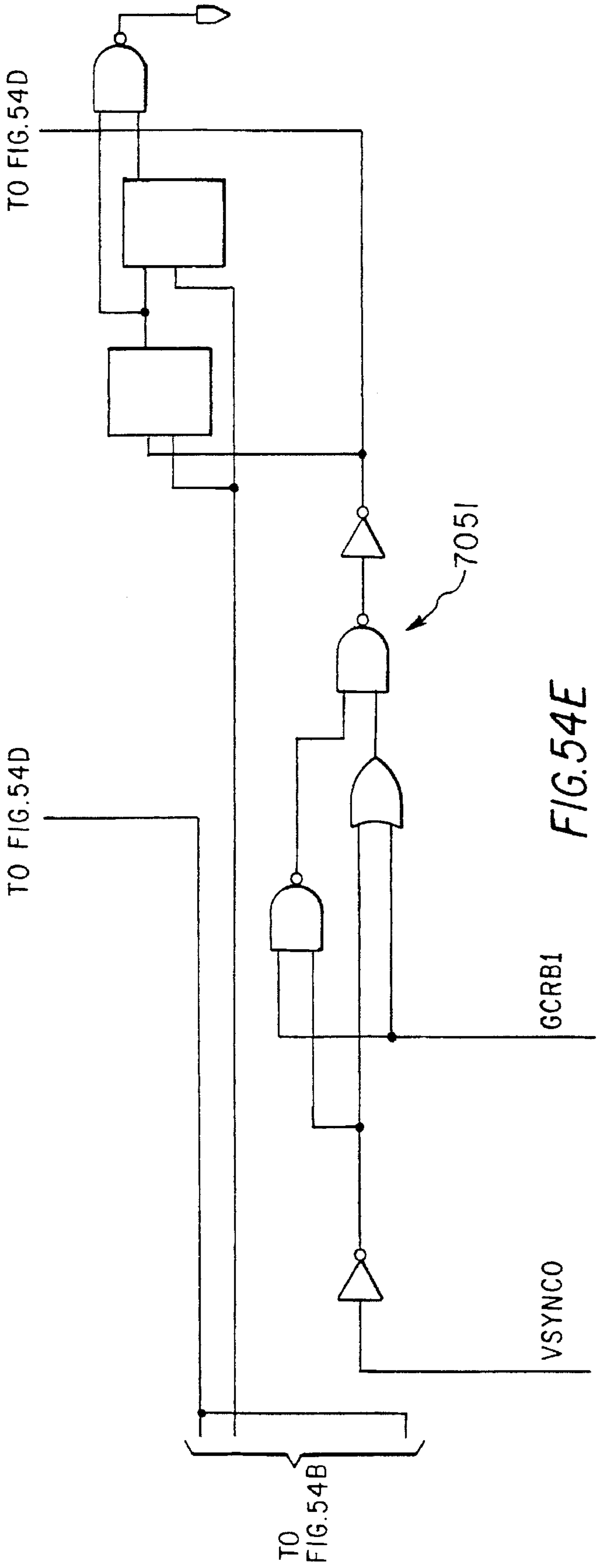

Considering FIGS. 51 and 52 together, correspondingly labeled lines are connected to each other in the two figures of drawing. Multiplexer control register bit 5 (Table 4) MCRB5 causes multiplexer 4386 to select between BLANKB and VGABLANKB inputs in FIG. 52. FIG. 51 shows connections between Input Clock Selection Register and the clock multiplexing circuitry connected to the CK (clock) inputs. FIG. 51 also shows connections between the Output Clock Selection Register and multiplexing circuitry to provide combinations of frequency division outputs from a frequency divider chain. Some of these outputs are coupled to the blanking and sync circuitry of FIG. 52 by lines VCLKS, LOAD and DOT.

In FIG. 50, blanking signal BLANKB passes through gates X8, X33, and between delay flip-flops X33 and gate X26. One output is a signal called BLNKB, that shuts down shift clock signal SCLK in the precess functionality.

A block SSRT in FIG. 52 is responsive to the signal level on pin SSRT/NF (split shift register transfer/nibble flag). in control register bits 2 and 3 determine whether the circuit is in SSRT mode or nibble flag mode. If in SSRT mode then the SSRT signal is gated through NAND gate X1 and then the SSRT delay block generates a pulse on line SSRTP of predetermined width needed to trigger VRAM 130 through the circuitry of FIG. 51 and SCLOCK output.

A purpose of having the SSRTP low pulse on the memory cycle waveform line is to load the new tap point for the full transfer to the registers inside the VRAM 130. The tap point register transfers an address to the input latches of the VRAM 130. There is a two step process in VRAM 130. Processor 120-supplies a LAD code to call for the shift register transfer. A tap point value does not get transferred to the tap point counter 94 until the next rising edge of shift clock SCLK. If no pulse were inserted between these two functions, the value that is in the latch 91 might not be transferred to the tap point counter 94. The second transfer would overwrite the current value in the latch. So the insertion of pulse SSRTP advantageously moves the full shift register transfer tap point to the tap point counter 94 and overwriting is avoided.

Thus as shown in FIG. 14, the latch 91 is clocked by memcy- waveform and memcy- moves data from the bus onto the input latch 91. SCLK subsequently causes transfer of the data out of the tap point counter 94, as indicated by the notation SCLK in FIGS. 14 and 21.

During blanking SCLK is disabled (except for SSRT pulse insertion) in this circuitry. This shift clock signal output to the chip bond pad is designated SCLOCK in FIG. 52 but corresponds to the identical output SCLK of FIG. 31.

Clock control 4041 of FIG. 31 is shown in greater detail in schematic diagram of FIG. 51. A series of clock generation circuitry generates correct frequencies based on control signals MCRB5, input clock select ICS 0–3, and the five oscillator inputs CK0–CK5. Block 4040 shows circuitry for selecting which of six clock oscillators are allowed to drive the programmable palette 4000. The output of block 4040 feeds block 4041 which is a clock divider to determine the correct frequency for SCLK and VCLK based on inputs OCS0-5.

The divide ratio is equal to the pixel bus width divided by the pixel depth, and divides the dot clock selected by block 4040. If there is a 32 bit wide data path and a 4 bit pixel, the divide ratio is 8. This is pertinent because it confers the capability of using all of the pixels in the input latch 4011 before loading the next set of 8 pixels into input latch 4011. The divide ratio (e.g. divide-by-8 of dot clock) yields the frequency of shift clock SCLK which causes 8 pixels to be loaded on each rising edge. In this example, the palette chip is sequentially accessing four-bit portions of the bus one after the other just in time before the next SCLK cycle is generated by this division circuitry to load input latch 4011 with a new set of 32 bits constituting 8 pixels of 4 bits each.

In FIG. 31 clock control register ICS 4361 determines the clock oscillator selection and not the divide ratio in this embodiment. Thus clock control register 4361 is selected by RS0–RS3 and accessed directly by data bits D0–D7 for clock selection. Logic 4362 on the other hand decodes part of control register OCS 4363 and establishes the divide ratio in circuit 4041.

Output control bits 0CS0–0CS5 are outputs of logic 4362 which is driven by control register bits in 4363 and determine what clock divide ratio is introduced. Input clock selects ICS0-3 by contrast are the bits from register 4361 and determine which clock oscillator is selected. Circuitry 4044 $SCLK_{}_{SELECT}_NEW3$ takes the inputs from the dividers and OCS0-2 and determines what frequency is distributed to SCLK output, providing appropriate delays in block 4041 to supply LOAD, and to VCLK and SCLK (internal signal). In FIG. 51 VCLOCK is VCLK output to bond pad from a buffer 4341 supplied by logic 4042 responsive to OCS3-5. SCLOCK is SCLK output to bond pad from a buffer 4343 from logic 4044.

Buffering is provided by buffers such as 4341 and 4343 to drive several inputs externally of the chip 4000 as necessary and to increase the current capability of the chip 4000 for external drive over what is needed for internal circuits to drive each other on-chip.

Figure 55A:
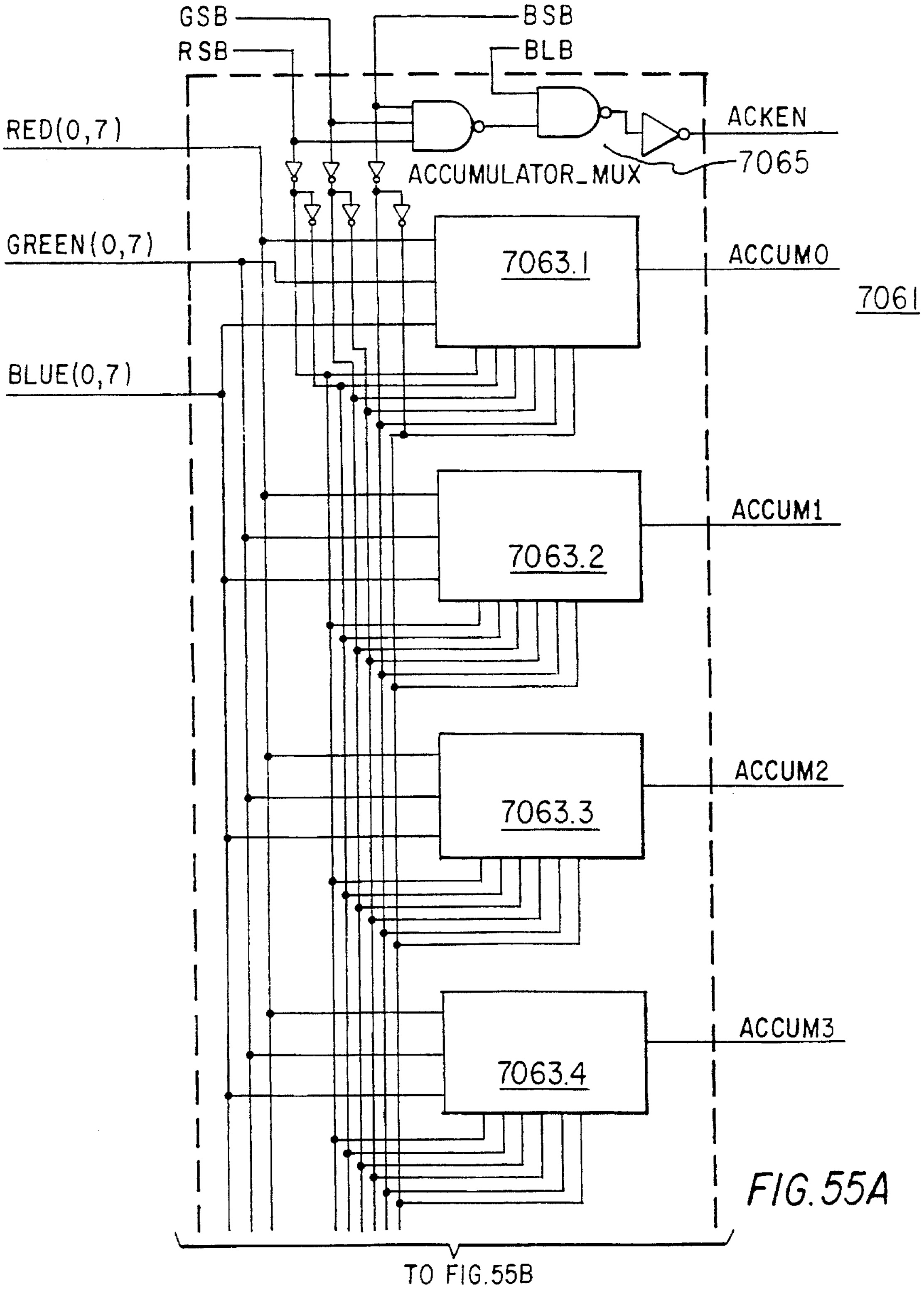
FIGS. 55A and 55B are block diagrams of accumulator multiplexing circuitry for the test circuitry of FIGS. 31 and 32.
Figure 55B:
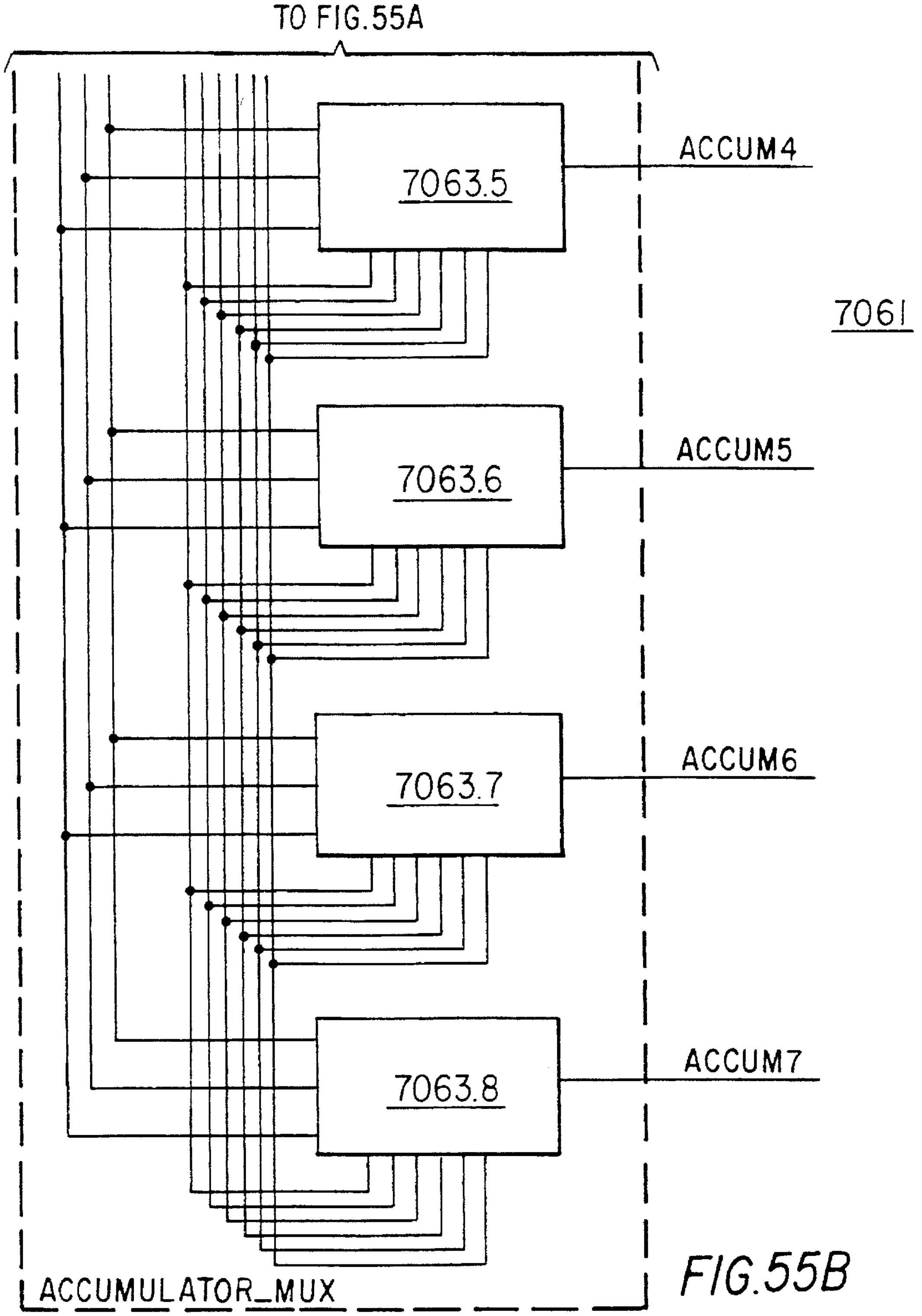

In FIGS. 54 and 55, test circuitry 4395 of FIG. 31 accumulates a sum of one bits in color-related bytes of output from RAM 4021 in a time interval between vertical sync pulses. Each byte enters an a ones-counter circuit 7001 of FIG. 54 from a circuit 7061 of FIG. 55 which selects the color to be counted. In FIG. 54 the byte ACCUM[0-7] is entered in a latch 7011. The latch 7011 has 8 bits including a high four bit nibble and a low four bit nibble. To make the logic advantageously fast, nibble decoders 7013 and 7015 count the number of ones in the respective high and low nibbles by decoding them. For instance 1111 is decoded 100 (four ones decoded to binary 4), 0101 is decoded to 010 (2 ones decoded to binary 2), etc. The binary number from decoder 7013 is output on lines B2,B1,B0. The binary number from decoder 7015 is output on lines A2,A1,A0. These two binary numbers are then added together by an adder circuit 7021 that has an input latch 7023 and adder logic 7025. The output is a binary number on lines N3,N2, N1,N0. For example if ACCUM[0-7] is 01101100 (has four ones) the output of adder 7021 correspondingly is 0100 (binary four). A running total, or accumulation of the number of ones thus counted is generated by accumulator 7027. Accumulator 7027 has an input latch 7029 and accumulation logic 7031. The running total is updated in a set of latches 7033 clocked by dot clock, and then clocked into test register latches 7041 upon occurrence of the next vertical sync pulse VSYNC0. Circuit 7045 supplies dot clock to circuits 7011, 7021 and 7027 when an enable line ACKEN is active. Circuit 7051 supplies vertical sync to test register 7041 when enabled by general control register 4398 bit 1 (GCRB1).

In FIG. 55, an accumulator mux circuit 7061 has a set of 3-input multiplexers 7063.1-.8 that produce one line of output apiece for the 8 lines ACCUM[0-7]. The inputs are connected to the 24 lines of output of RAM 4021 RED[0-7], GREEN[0-7] and BLUE[0-7]. The 3 way selection of color bits to be counted is controlled by a set of lines BSB,GSB, RSB. Enable Circuitry 7065 has inputs connected to the 3 lines as well as blanking line BLB to produce the signal ACKEN as output.

As described, circuitry 7061 and 7001 does a one-bit accumulation analysis from the input latch 4011 through the output of the color palette RAM 4021. Palette test register and ones accumulation register 7041 counts the ones that appear at the output of the color palette RAM during a period of time. The period of time suitably is the period between successive vertical sync signals or 16.7 milliseconds. Since this period may be long enough for overflow to occur in latch 7033, the accumulation is the least significant bits of a binary running total thus accumulated. The accumulation allows a host computer running test software to determine if the correct data is passing from input latch 4011 through the output of RAM 4021. Software does a comparison between what it received and a value that should be received for verification purposes. The one's accumulation value is accessed via pins D0–D7 and is selected by RS0-3.

The ones-accumulation facilitates system test. When a predetermined test image is supplied by host 110, and displayed by operations of GSP 120, VRAM 130 and palette device 4000, then a known value of the accumulation value should be counted. If this value does not occur, the system test detects a condition possibly calling for system replacement or repair.

The color palette RAM 4021 produces three 8-bit outputs. At first glance, the 8-bit outputs could have any sequence of 1s and 0s whatever. When a test regime is introduced, a constraint is introduced. In one test scheme, all zeros are written into the VRAM and all ones are written into RAM 4021. Then on every access every byte should contain all ones, and if this does not occur, the test is failed. However, this would only access address zero in the palette RAM 4021. In a second phase of the test, the VRAM is filled with all 00000001 values and the address in RAM is accessed. In a number of phases equal in number to the number of addresses of RAM 4021, the test is run with values in VRAM being all equal to the latest address in RAM 4021 to be accessed. In this way all bits across the width of the bus 145, all multiplexers and all addresses in RAM 4021 are exercised.

In another test, all locations in the RAM 4021 are loaded with ones except for the location to be accessed which is loaded with zeros. Accordingly if all zeros are not produced as output, a defect somewhere in the system including processor, VRAM and palette 4000 is detected. The defect can be isolated to the palette by having the processor do a test routine on the VRAM to determine whether it is producing the output which would be expected depending on what was loaded into the VRAM, and if the VRAM passes the test, the palette 4000 has the defect.

Other tests can also be devised. Another test principle is to count the number of ones in the data to be transmitted and that number is appended to the data transmitted. When received the number of ones is counted again and compared to the number appended to the transmission. If the number is the same then the data passes the test. In this way, the number of bits required to test the RAM increases only logarithmically with RAM size.

In still another test, the entire RAM 4021 is unloaded, and all the ones stored therein are counted by color type and compared with numbers expected for the contents of the RAM. Three registers for R,G,B gun hold data unloaded from memory, and a sum is done across each set of eight bits, and then accumulated as all locations in the memory are unloaded. The one's accumulator register can also be made to hold totals for Red, Green, Blue sums and are sequentially accessible by one RS0-3 address followed by three assertions of a Read signal to read the ones-accumulation registers. In the muxing of the present embodiment, one color is selected and accumulated between instances of vertical sync, then another color and another.

The analog comparison bits in the test register provide test for the palette device 4000 individually, in addition to the system test provided by the ones-accumulation register. Identical bytes can be loaded into the RAM 4021 for each color. If they do not produce approximately the same analog outputs, then a possible problem condition is detected. A given byte of a value that should be equal to a reference level can be supplied to each DAC 4031, 4033 or 4035 and the DAC output compared to the reference level as an analog level. If there is a discrepancy, a defective DAC or defective connection to the monitor is indicated. The reason that the connection to the monitor may affect the DAC output is that the input impedance of the monitor loads down the DAC, so that inadvertent disconnection of the monitor changes the DAC output.

256×24 RAM 4021 is fast static RAM technology SRAM.

Turning to another aspect, the OR-gate 4036 of FIG. 32 is but one example of circuitry which can be used to detect the presence of true color mode. Either of two or more values could be alternatively detected to operate the output mux 4038 to true color mode, and each value then routed to circuitry for attributes or intensity. Also, the selection can be established by on-chip control circuitry, freeing up all values of the 8 remaining bits of byte D in FIG. 31 to control attributes or intensity.

The 8 bits are herein referred to as minority bits and the 24 bits are called majority bits. Generally speaking, the majority bits are equal or greater in number to the minority bits, and in the present embodiment the majority bits are in the ratio of 3:1 to the minority bits. As used herein, majority bits and minority bits involve a concept of preponderance in mere number regardless of location, and which is a different concept from most significant bits and least significant bits, which is a concept of location relationship or significance.

Figure 56:
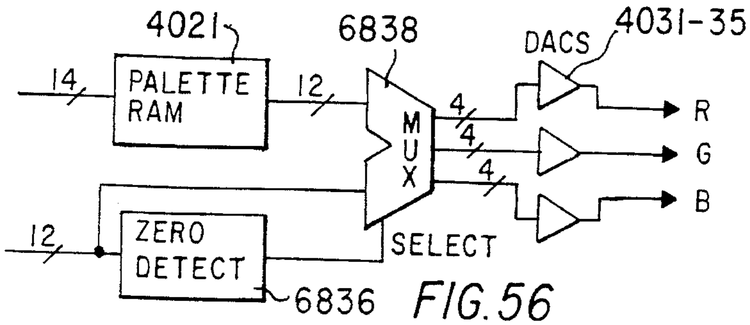
FIG. 56 is a block diagram of an alternative circuit for overlay wherein detection of a particular value in majority bits selects overlay, alternative to to detection of minority bits in the palette device of FIG. 32.

In another embodiment with 16 bit bus shown in FIG. 56, the minority bits are fed to the palette RAM 4021 and the majority bits are fed to a zero detector 6836 (analogous to OR-gate 4036 of FIG. 32). Zero detector 6836 controls the select line of a Mux 6838 which supplies 12 lines in three groups of 4 lines to DACs 4031, 4033, 4035. Palette RAM 4021 is fed with minority bits on 4 lines, and supplies a 12 bit output for selection by Mux 6838. 12 majority bits are fed on 12 parallel lines as an alternative selection by Mux 6838. This embodiment advantageously uses only one value zero out of 4096 (2-to-the-12 power) values representable by the majority bits to perform the selection. This circuit is readily implemented for protection of color repeat functions in GSP 120. An embodiment with majority bits to RAM 4021 would provide highly detailed color selection for a graphics background, and fewer color selections to a foreground (with one of them being the code for true color, or transparent). By contrast, the embodiment of FIG. 56 would provide a foreground of 4095 colors (4096 less 1) provided by true color bypassing, and enables the zero detect 6836 and causes Mux 6838 to select any of 16 colors as background colors from RAM 4021. In other words, there are (4095+16) different colors that can be displayed simultaneously.

Figure 57:
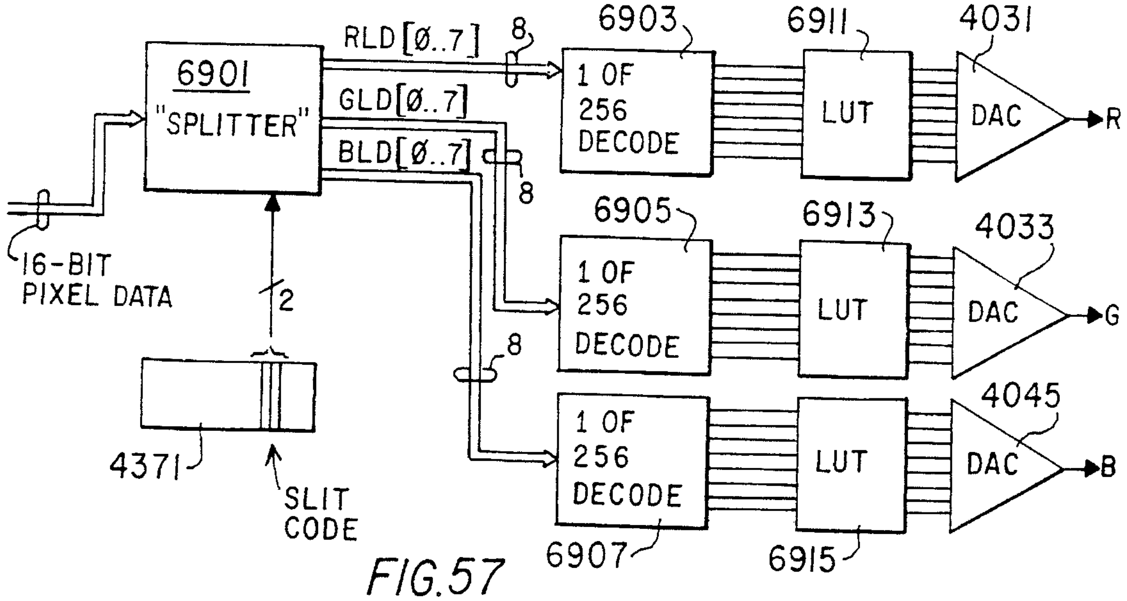
FIG. 57 is a block diagram of an alternative circuit for reduced decoding time in a palette device using splitting modes and parallel decoders and LUTs (look-up table memories)

Turning to FIG. 57, another embodiment of improved palette circuitry is shown. In 8-bit palettes, the 8 bit pixel data is used to select one of 256 (2*8) entries out of a look-up table (LUT) 4021 which contains raw data to drive DACs 4031, 4033, 4035, which then output analog RGB signals. A problem in going to pixel sizes greater than 8-bits is that the decode grows more complex and thus slower. This tends to cause the pixel data bandwidth to drop.

In FIG. 57, the incoming 16 bit pixel data is split by a splitter circuit 6901 (e.g. In selector circuit 4051 of FIG. 31) into components, e.g. red, green and blue sets of bits or "guns". The splitter is a logic circuit that feeds pixel data out simultaneously with other predetermined levels as needed to three eight bit buses RLD, GLD and BLD (red, green, blue load). By splitting the incoming pixel data the size and depth of the decode is minimized in each of three 1-of-256 decoders 6903, 6905 and 6907 respectively connected to buses RLD, GLD and BLD respectively.

For example, consider a 16-bit palette. The data is arbitrarily split into red, green, blue components of 8 bits, 4 bits, and 4 bits apiece. Each of these components is used to drive the decode in component look-up tables 6911, 6913 and 6915 feeding DACs 4031, 4033 and 4035 respectively. Note that the worst-case decode in this example is still only 1-of-256, the Red component.

For flexibility, the palette can be designed to allow the user to choose the split by entering a code establishing the split into the control register 4371. Splits of 7/6/3, 1/14/1, 8/4/4 and 5/7/4 can be selected by any of four permutations of two split control bits, for example. The decoders 6903, 6905 and 6907 and LUTs 6911, 6913 6915 are designed to handle the maximum number of decodes and look-up table entries which the split control bits might call for.

When splitting the data, the unused signals which drive the decoders should be automatically set to a known value, so that there is no ambiguity in the result. Zeroes (0) are a simple choice of known value for this purpose.

In one example, control register 4371 is loaded with a split code establishing a 5/7/4 split for red, green, blue. Splitter 6901 logic feeds the pixel bits S so that 5 bits go to bus RLD with 3 zero bits, 7 bits go to bus GLD with 1 zero bit and 4 bits go to bus BLD with 4 zero bits. Thus, the RLD bus has bits 000SSSSS (where the S is sourced data from the incoming data stream). Similarly, the GLD bus is 0SSSSSSS, and the BLD bus is 0000SSSS.

Turning to a different improvement, direct connection of VRAM and programmable palette 4000 is possible when the VRAMbus width is less than or equal to the width of the data input of palette 4000. When wider buses are used, an additional multiplexer between the bus 145 and input latch 4011 can be provided. The multiplexer has inputs connected to sections of the bus 136 less than or equal in width compared to input latch 4011, and the output of the multiplexer is fed to part or all of the full width of the input latch 4011.

Figure 58A:
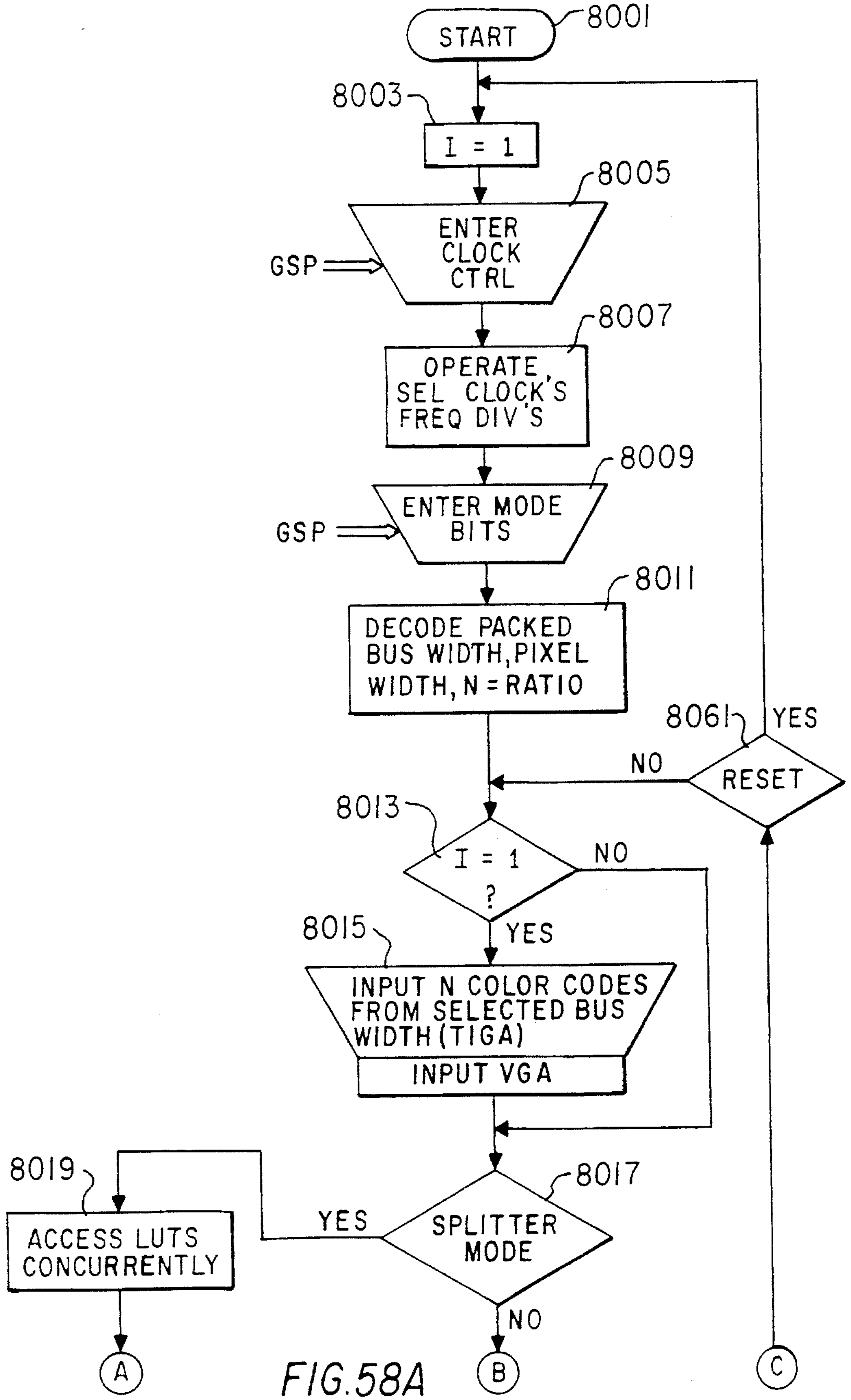
FIGS. 58A, 58B and 58C are three thirds of a flow diagram of a process or method of operating palette devices and systems.
Figure 58B:
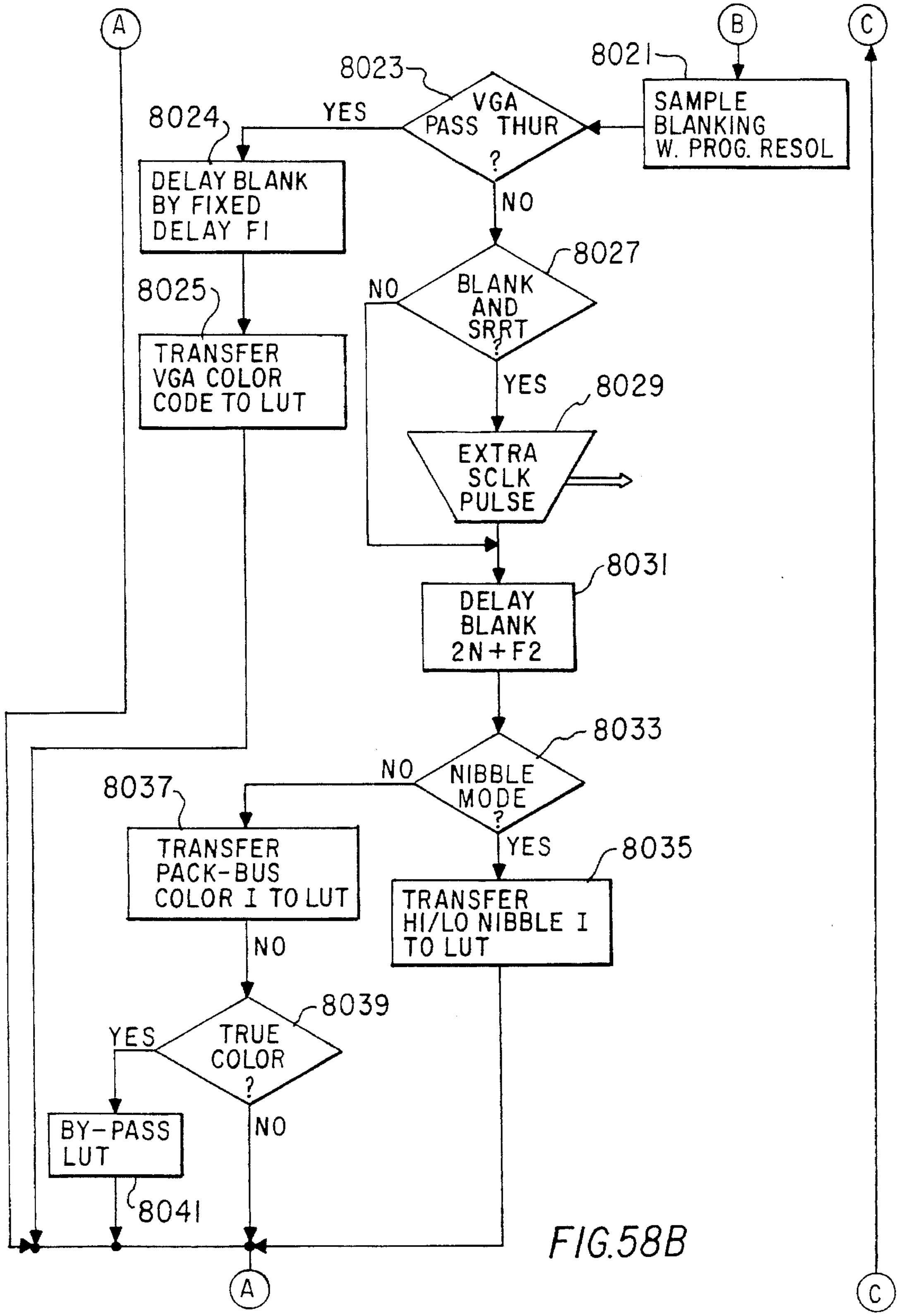
Figure 58C:
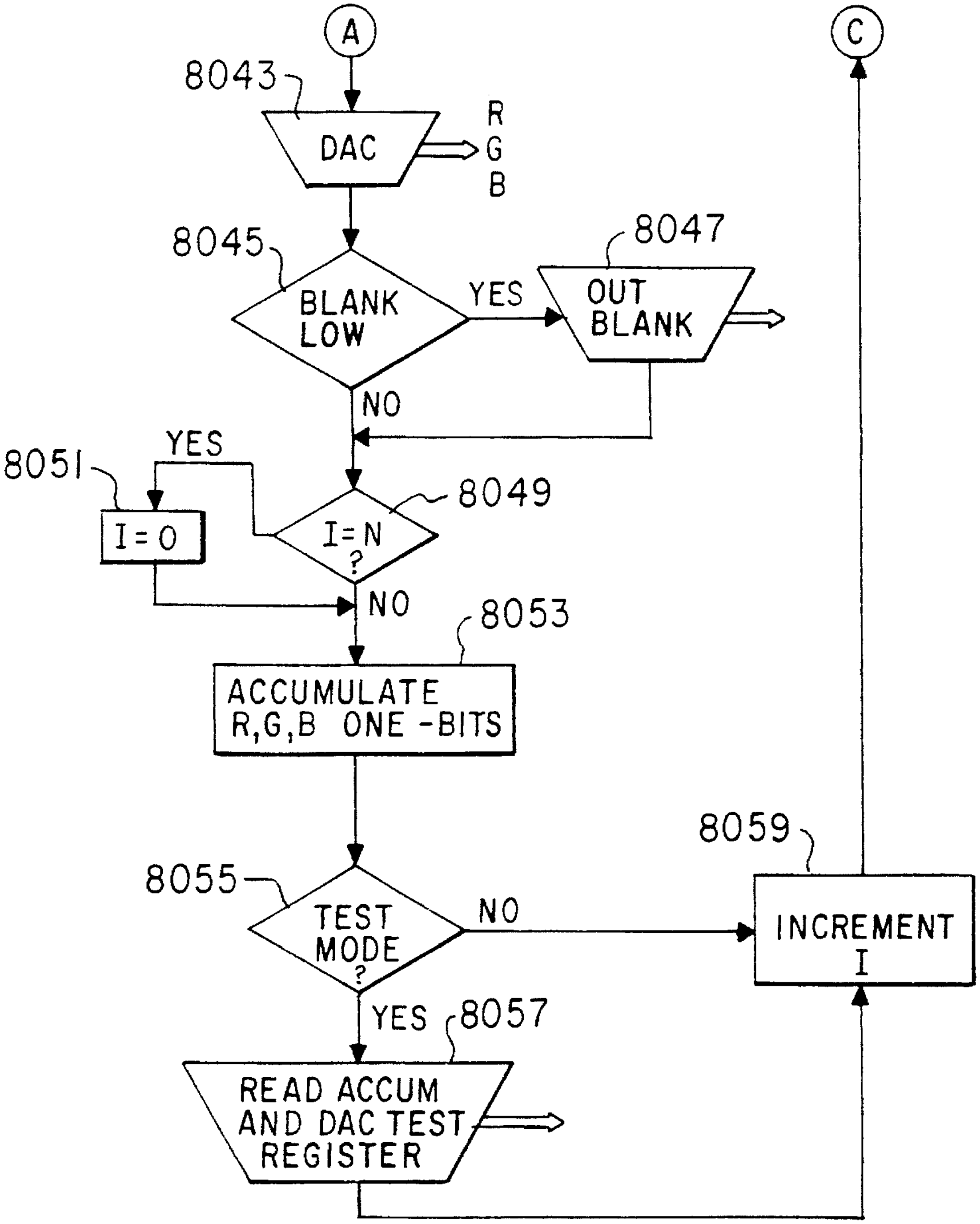

FIGS. 58A–C view the present work from a process or method perspective. In FIG. 58A process operations commence with a START 8001 and go to an initialization step 8003 including initializing a color code index to 1. Then a step 8005 enters clock control information from a source such as GSP 120 external of the palette integrated circuit 4000 into a register ICS and OCS in the integrated circuit. Succeeding step 8007 operates the clock control circuitry 4040 and 4041 in response to the clock control information so that clock pulses are provided to the function performing circuitry (e.g. 4011, 4051, 4021 and 4030 of FIG. 31) by the clock control circuitry in accordance with the clock control information so entered in register ICS and OCS. In this way a particular clock oscillator is selected and a combination of frequency divide ratios is established. The frequency dividers block 4041 supplies clock pulses in a first combination of ratios to clock outputs VCLK and SCLK in response to a first set of bits in the OCS register and supplies clock pulses to the same clock outputs VCLK and SCLK in a second combination of ratios in response to a second set of bits substituted for the first set in the register OCS, see Table 3*b*.

In a step 8009 GSP 120 enters mode bits for MUX control register 4371. The mode bits are decoded to select a packed bus width and a pixel width for transfer by selector circuit 4051 in step 8011. The ratio of the packed bus width and the pixel width is a divide ratio which is used for the circuit 4041 to divide the dot clock to generate shift clock SCLK. This ratio may be computed, or decoded from the mode in register 4371 or supplied independently through OCS register 4363 as in Table 3*b*.

A test step 8013 determines whether index I has its first value one. If so, multiple color codes having a number N equal to the divide ratio (e.g. 32 bits bus width divided by 8 bits per pixel equals an N value of four in one mode) are entered simultaneously from video memory into multiple-bit input latch 4011 in palette device 4000 via bus 136 in step 8015. Also at this time a second set of bits such as VGA bits if any are entered via another bus such as from the feature connector 6521 of FIG. 26.

If a splitter mode is present in a next step 8017, then multiple LUTs are accessed concurrently in a step 8019 with reduced decode time by color code bits and other predetermined bits established by a split of bits called for by the splitter mode. Operations proceed through point A from step 8019. Otherwise operations proceed from step 8017 through a point B.

Turning to FIG. 58B operations passing from step 8017 through point B reach a step 8021 wherein blanking is sampled with progressive resolution as shown in FIG. 49. Next occurs a decision step 8023 regarding VGA pass through. If VGA pass through is activated, then a step 8024 delays VGABLANK- by a delay F1 number of dot clocks. Then a step 8025 transfers the VGA color code to LUT 4021. In this way color data words are selectively supplied by the LUT in response to color codes from input register 4011 by selecting color codes from a first or second graphics bus and also a video control signal is selected for output depending on the selected first or second graphics bus.

When VGA pass through is not selected in step 8023 operations proceed to a test step 8027. If the SSRT pin is active and blank is active, then an extra SCLK pulse is output in step 8029 according to FIGS. 24, 35 and 37 for instance. This provides a method of operating a computer graphics system having a video memory with a shift register adapted for split shift register transfers and a digital computer for controlling the video memory and having a tap point counter clocked by a shift clock signal and also having a blanking circuit supplying a blanking signal. Step 8029 initiates an extra shift clock pulse for the tap point counter during a blanking interval defined by the blanking signal. If the test of step 8027 is not met, then step 8029 is bypassed.

Blanking precess step 8031 delays blanking by a variable delay equal to the sum of fixed delay F2 plus a variable delay equal or proportional to the number N of cycles that are needed to transfer the N pixels in the input latch to the LUT. The fixed delay F2 compensates for the circuit delays of the LUT, other logic and digital to analog converters 4030. The variable delay of 2N dot clocks recognizes that the selector circuit 4051 coacts with LUT and DACs to process color codes according to different modes to supply color data words wherein the processing establishes different time intervals between input of the color codes for processing and supply of the color data words. In this way, the blanking signal as an example of one video control signal is variably delayed concurrently with the processing by time intervals correlated in at least two of the different selector modes to the time intervals of the processing thereby to supply the video control signal thus delayed.

Nibble mode test step 8033 determines whether the nibble mode is called for. If so, a step 8035 passes a high or low nibble (depending on the high or low state of the nibble input) identified by index I from the input latch 4011 to the LUT 4021. If not, operations pass to step 8037. Here, a bus width coupling circuit, configured by selector 4051 connected between the input latch 4011 and the LUT 4021, is programmed to pass the latest color code I from the bus according to the bus width programmed. Advantageously, the bus width coupling circuit transfers color codes of selectable width sequentially across and packing the entire width of the bus. The sequence or cycle, from the process viewpoint of FIGS. 58A–C is a series of loops through the flow diagram for a number N of times to transfer all of the color codes that were loaded into input latch 4011 for the bus width established by the mode in register 4371.

After step 8037 a test step 8039 detects whether true color, or overlay is requested. This detection is mediated by a circuit such as OR-gate 4036 of FIG. 32 or detector 6836 of FIG. 56, for example. If so, enough bits to constitute a color data word (e.g. 24) are transferred simultaneously to the DACs 4030 and the LUT 4021 is bypassed in a step 8041. Point A is reached after any of steps 8025, 8035, 8041, No in step 8039 and after step 8019 of FIG. 58A.

Turning to FIG. 58C operations proceed from point A to a conversion step 8043 executed by DACs 4030 to produce analog color signals such as R,G,B. It is to be understood that in various embodiments the analog signals may be matfixed color signals, or display signals for color display devices that do not use raster scanned video or of whatever type the skilled worker employs in the practice of the invention.

Succeeding step 8045 tests for delayed blanking signal low active. If so, the DACs are blanked in a step 8047. Otherwise, operations proceed directly to a step 8049. If index I has reached the number N, then index I is set to zero in a step 8051. Otherwise, operations proceed from step 8049 to accumulation step 8053 to update a running count of bits of a particular state (e.g. one) that are supplied at a given set of outputs of LUT 4021 over a period of time between vertical sync pulses, for instance. In the test circuitry of FIG. 32, running counts of bits are maintained for Red, Green and Blue color data word bytes.

A next step 8055 checks to determine whether test mode access is requested. If so a step 8057 externally accesses the count or counts of running total of bits in the accumulator outputs. Also at this time, analog tests of the DACs 4031, 4033 and 4035 are performed and bits representative of the analog comparisons are accessed from the DAC test register. If there is no test mode in step 8055 or step 8057 is completed, operations proceed to a step 8059 to increment the index I and return through point C to FIG. 58B and FIG. 58A to a step 8061 checking for a reset condition. If there is no reset condition, operations complete the loop to step 8013 and continue executing. If there is reset, operations proceed to step 8003 whereupon when reset is lifted, operations reestablish the operating parameters of the palette device 4000.

In a present embodiment the clock control circuit 4041 has various combinations of clock divide ratios established by the OCS register. In other embodiments the clock divide ratios can be established by decode from the mux control register 4371 to insure that the selector 4051 configuration corresponds with the clock divide ratios established. In such embodiment, nonzero values in particular bits of the OCS register can override the clock decode from mux control register 4371 while zero values allow default to decode from register 4371. Other variations in the control plan for consistency, simplicity, flexibility and reliability can also be made.

Figure 59:
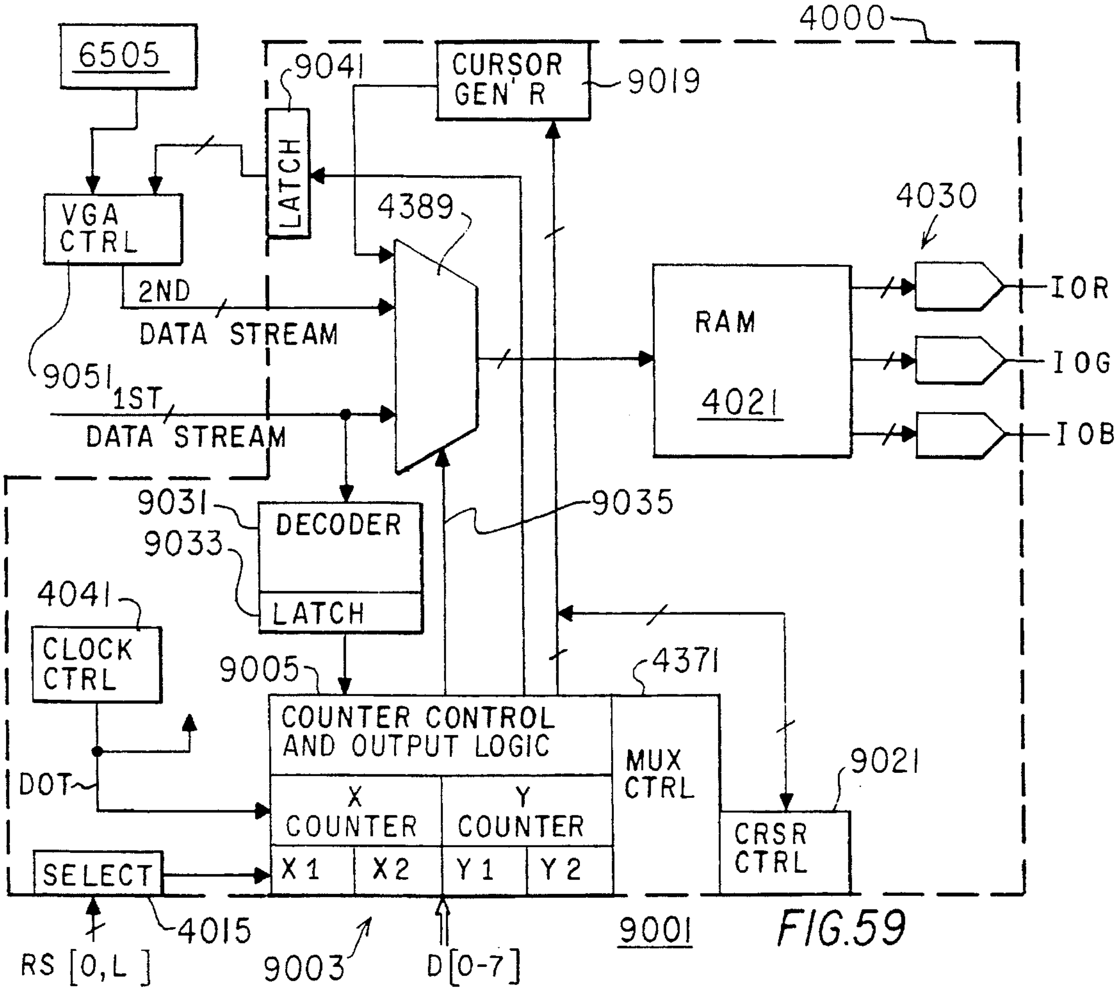
FIG. 59 is a block diagram of circuitry for internal dynamic control of VGA pass-through and cursor generation.

In another aspect shown in FIG. 59, internal palette control of alternative first and second data streams is provided be even further refinements illustrated by control logic 9001. In FIGS. 31 and 32, selection between VRAM 130 input or VGA input is externally controlled by entry of bit 5 (MCRB5) in control register 4371. A selection circuit such as 4389 of FIG. 32 selects between the two data streams and passes color codes on to RAM 4021. RAM 4021 supplies color data word bytes to DACs 4030 to produce color outputs IOR, IOG and IOB.

Figure 60:
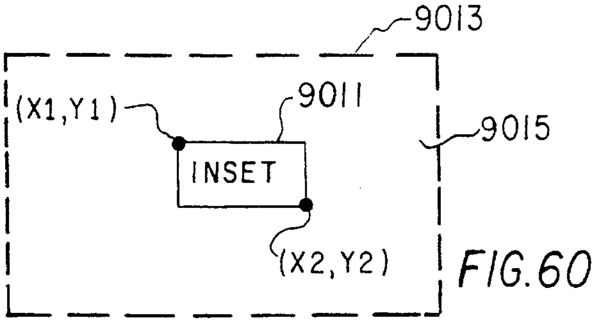
FIG. 60 is a pictorial sketch of a graphics screen with a second graphics image added as an inset.

In the embodiment of FIG. 59, control register 4371 bit 5 does not select VGA outright but instead enables an inset over a rectangular portion 9011 of a frame 9013 in an image represented in FIG. 60. The inset 9011, or secondary graphics window, is displayed from one data stream and the remainder 9015 of the image is displayed from the other data stream. Which data stream supplies the inset 9011 is determined by an inversion bit in control register 4371. The size and position of the inset is defined by coordinates of the upper left corner (X1,Y1) and lower right corner (X2,Y2). These coordinates are established by GSP 120 writing a field into a register set 9003 in the control block 9001. If the coordinates cause the inset to cover the entire screen, an unconditional selection is equivalent to VGA passthrough of FIGS. 31 and 32.

Thus, the data stream to the palette can be automatically switched at the appropriate time on a line by line basis. A counter array including an X counter and a Y counter count dot clock pulses from clock control 4041 to determine when to switch from one data stream to another. Counter control and output logic 9005 send a select signal to control selector 4389. The select signal is inverted or not inverted in logic 9005 depending on the inversion bit in control register 4371. The register select input RS[O-L] has lines sufficient in number L to accommodate all of the register accesses for palette control.

It should be apparent that the geometric shape of inset 9011 is rectangular for illustrative purposes only, and other geometric figures are defined by registers in the register set 9003, and control bits in mux control 4371 and appropriate circuitry in logic 9005. Trapezoidal, polygonal, triangular, circular, oval, curved, closed bands, and other figures are suitably implemented with substantially reduced processing burden on GSP 120.

Additional data streams besides the two shown can be accommodated. One or more data streams can be generated internally, such as by a hardware cursor circuit 9019. The cursor circuit can be self controlled, or controlled externally by external signals supplying data to the register set 9003. An input/output cursor control register 9021 in register set 9003 mediates information transfer regarding the cursor. Cursor generator 9019 in one embodiment shares X and Y counters in circuit 9001 to position the cursor, and in an alternative embodiment has extra dedicated counters (not shown). Circuit 9001 and cursor generator 9019 in another complex embodiment are implemented as a secondary graphics coprocessor integrated on-chip into palette 4000 itself.

Alternative and augmented control of selector 4389 selection of data streams is provided by decoding one or more of the data streams in a decoder 9031 to detect predetermined value(s) for overlay or other purposes. The decode result is entered in a latch 9033, the output of which is connected to counter control and output logic 9005. For example, logic 9005 suitably includes a mode-controlled switch to selectively connect the control lines to selector 4389 to the latch 9033 or to the logic 9005 for internal dynamic control. In a more complex arrangement, the decode result is processed jointly with the counter control information to control selector 4389 and deploy sophisticated graphics features.

Integrating data streams from different buses such as VGA is also improved by recognizing that the different images represented by the data have different resolutions. If the parts of a whole frame 9013 are to have a controlled resolution relationship, such as equal resolutions, VGA board 9505 is connected to feed a VGA control circuit 9051 which buffers slower-speed VGA data and supplies the second data stream at a data rate equal or related to the data rate of the first data stream. If the first data stream has a higher resolution, then the second data stream (e.g. VGA) is most likely displayed at a reduced scale as perceived by a viewer because a low-resolution frame has fewer pixels than a high resolution frame, and these fewer pixels can be advantageously displayed as an inset like inset 9011. A control latch 9041 in palette 4011 is suitably included to mediate transfer of control information from logic 9005 to the VGA control circuit 9051 to control the data rate and time the starting and stopping of the VGA data stream by starting and stopping transmit operations of a buffer in circuit 9051. Latch 9041 has a first mode by which VGA simply passes through control 9051, when it is desired to view a full size VGA frame at VGA resolution. In one or more other modes established by bits in latch 9041, all or a selected part of a VGA frame is remarkably displayed as a window or inset 9011 with controllable XY positioning.

Improved panning capabilities are provided in palette 4000 to accommodate applications in which panning is desired. VRAM 130 is suitably controlled to do panning in units of the number of pixels M accommodated by the width of bus 136 and input latch 4011. When this number M exceeds one, a degree of roughness in display may occur because panning by control of VRAM 130 may involve successive frames laterally shifting an image by multiple pixels numbering M. Smoother panning is provided by palette improvement circuitry described next, which provides panning in one pixel increments.

Figures 61A, 61B, 61C:
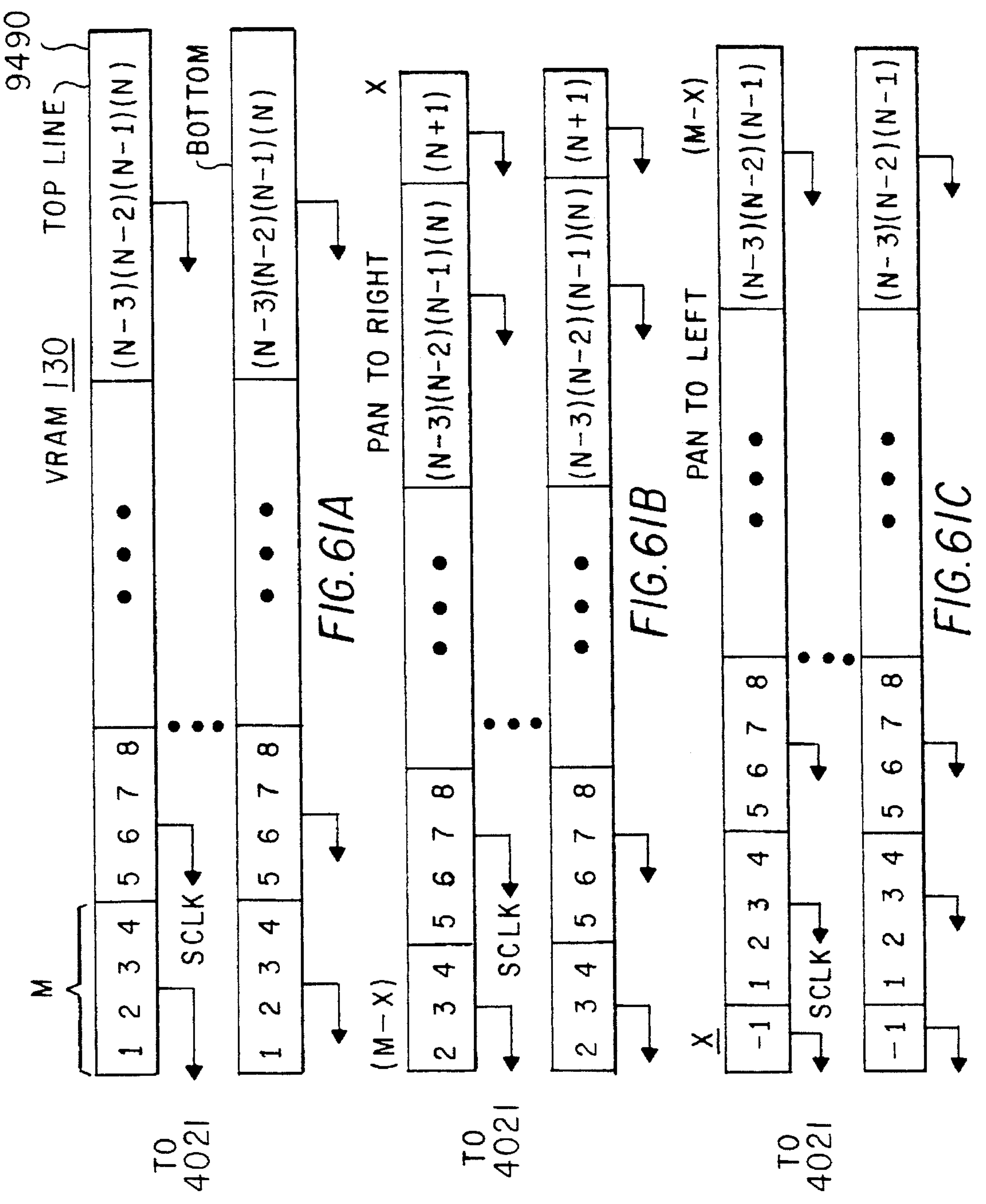
FIGS. 61A, 61B and 61C are each diagrams of pixels in two lines of a video frame for describing right and left panning.
Figure 62:
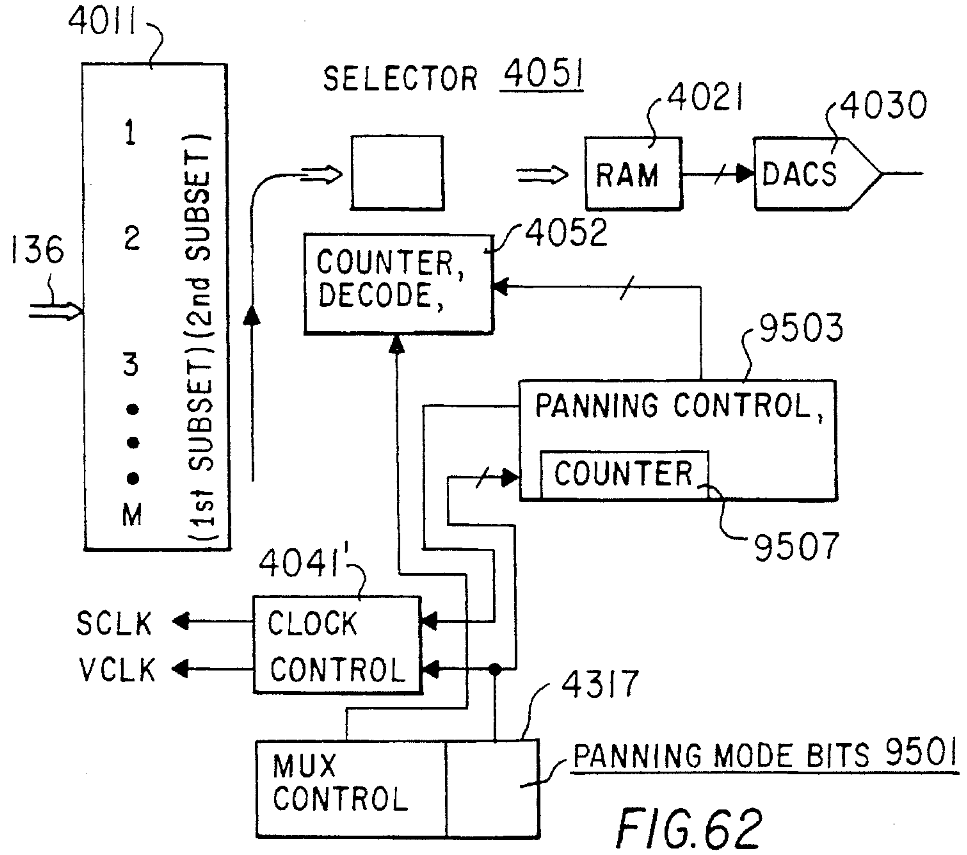
FIG. 62 is a block diagram of a first embodiment of circuitry to support panning.

A panning process is shown with reference to FIGS. 61A, 61B, 61C. VRAM 130 is arranged to hold image information which can be panned. In display of a first frame, VRAM 130 supplies groups of M (e.g. 4) pixels (color codes) in each bus load to input latch 4011. The number M is the number of pixels on the bus clocked into the input latch 4011 by each active transition edge of shift clock SCLK. The pixels are transferred to RAM 4021 by barrel shifting circuitry designed to implement latch 4011 and selector 4051. The pixels are transferred in 1,2,3,4 order to palette RAM 4021 as shown in FIG. 62. Returning to FIG. 61A, each line in the frame is completed by transfer of a last group of pixels (n−3),(n−2),(n−1),(n) where n is the number of pixels per line. (If the line length n is not evenly divisible by M, the last group 9490 has a remainder number of pixels.)

In FIG. 61B, panning to the right begins with a frame succeeding the frame of FIG. 61A. Of the pixels 1,2,3,4 the first pixel is ignored by selector 4051 and not transferred to RAM 4021. Instead the pixels are transferred 2,3,4 whence the next group of M pixels are loaded and all transferred: 5,6,7,8. All succeeding groups are loaded and transferred including the group (n−3), (n−2), (n−1), (n). Then another load occurs, whereupon only the pixel (n+1) is transferred to RAM 4021 before onset of blanking.

When panning is desired in one pixel increments, the first frame of right pan is as shown in FIG. 61B. The next frame of right pan (not shown) transfers pixels 3,4 followed by full groups all across each scan line and ending with pixels (n+1) and (n+2). A third frame of right pan (not shown) transfers pixel 4, followed by full groups of M across each scan line and ending with pixels (n+1), (n+2), (n+3). A fourth frame of right pan is the same as FIG. 61A except that GSP 120 coordinates the pan operation to access VRAM 130 by incrementing the first group to be accessed, to start with 5,6,7,8. Succeeding frames of right pan loop through the process just detailed, see FIG. 63.

In left panning with one-pixel resolution, the first pan to the left is shown in FIG. 61C. Here, GSP 120 has decremented the first group to be accessed. The first group tO be transferred on each line of the frame includes pixels arbitrarily designated (−4),(−3),(−2),(−1). Only pixel (−1) in that group of M leftward pixels gets transferred to RAM 4021. Then follows group 1,2,3,4 with all pixels to RAM 4021, group by group until the last group 9490 is reached. In the last group only pixels (n−3),(n−2) and (n−1) reach RAM 4021 before blanking.

In a second frame of left pan (not shown) pixels (−2) and (−1) are followed by 1,2,3,4 and so on, and the scan line of display is completed by pixels (n−3) and (n−2). in a third frame of left pan (not shown) pixels (−3), (−2) and (−1) are followed by 1,2,3,4 and so on, with the scan line completed by pixel (n−3). A fourth frame of left pan is like that of FIG. 61A with all pixels (−4),(−3),(−2),(−1) transferred to RAM 4021 and omitting group 9490. Succeeding frames of left pan loop through the process just detailed, see FIG. 63.

In FIG. 62, one or more panning mode bits 9501 are included in mux control register 4371 to call for right or left pan, and to designate any desired further parameters and to include least significant bit LSB VRAM address bits as described in further detail hereinbelow. The panning mode bits are connected to a panning control circuit 9503 including a panning counter 9507 to handle the frame-by-frame incrementation in control of input latch 4011 by counter and decode circuitry 4052 of FIGS. 62 and 31. Circuitry 4052 is arranged to include logic responsive to panning counter 9507 in panning control 9503 to transfer out a number x of pixels from the first group 1,2,3,4 for example and a number M-x of pixels from the group (n+1),(n+2),(n+3),(n+4) in right pan. Analogous or symmetric control for left pan occurs. The number x is incremented (or decremented) frame by frame by the panning counter 9507 in panning control 9503.

The VRAM 130 is suitably controlled for panning purposes based on the most significant bits (MSBs) of the address value asserted to VRAM 130 corresponding to the X coordinate of the pixel groups. The palette 4000 suitably controls the panning by the LSBs of that address value. For example with 8 pixels in the latch 4011 of the palette 4000, a number 3 of the LSBs control panning in the palette and the MSBs, or rest of the VRAM address bits, control the panning in the VRAM 130.

Thus, for panning, circuit 4052 is improved so that it not only can transfer pixels packing an entire bus width, with selectable width pixels, as earlier described, but also can transfer first and second subsets of the pixels packing the entire bus, the first subset transferred at the beginning of each line of a panned frame and the second complementary subset at the end of the each line in a panned frame. The subsets vary in their number of pixels as determined by the number x in the panning counter 9507.

Clock control circuitry 4041 of FIGS. 62 and 31 is also arranged to supply the video clock pulses VCLK to GSP 120 and the shift clock pulses SCLK to VRAM 130 so that the groups of M pixels are supplied to input latch 4011 as needed for panning and to support a continuous transfer of pixels to RAM 4021 in each scan line.

Figure 63:
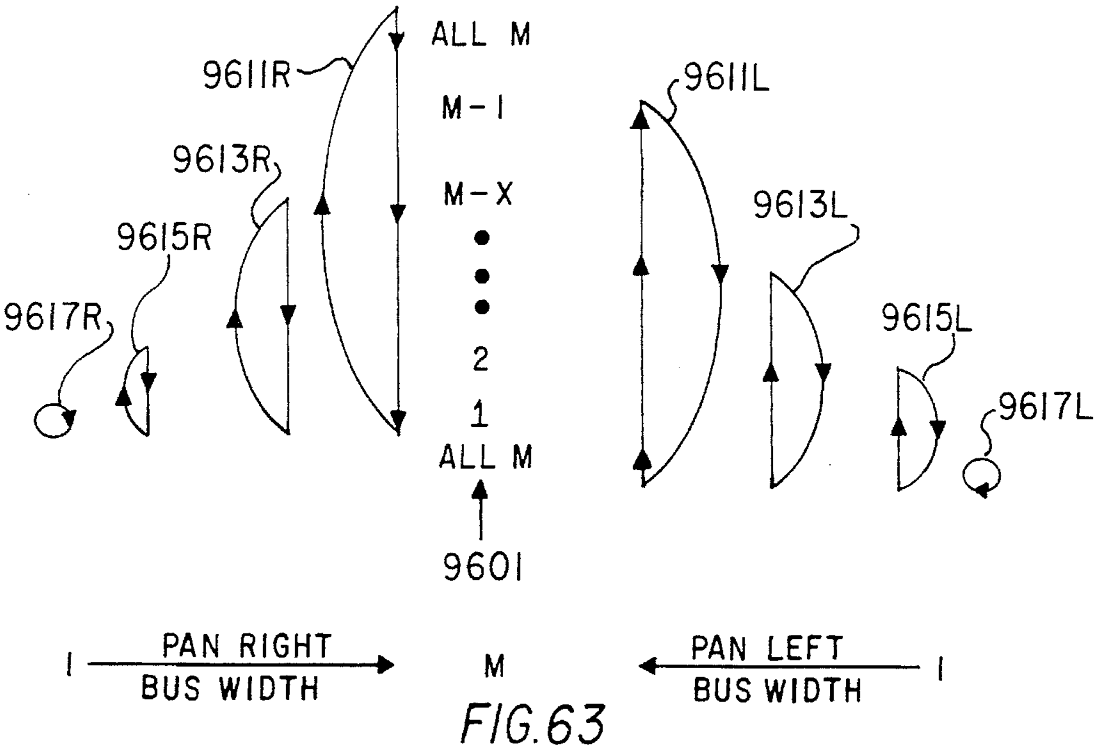
FIG. 63 is a diagram showing process loops of right and left panning in systems with different bus widths.

FIG. 63 shows a column 9601 of sizes of the first subset each value of which controls respective frames for panning. Right panning over the full capacity of input latch 4011 (such as 32 bits for example) is shown by down arrows in loop 9611R. First all M pixels are transferred in FIGS. 63 and 61A. Then M-1 pixels are transferred in the first subset in FIGS. 63 and 61B for the next frame of right pan, later followed by M-x in the Xth frame of right pan until the last one (1) pixel (as the first subset) is reached and the loop returns to transfer all M pixels at top.

In FIG. 63, panning is integrated with the selectable bus width feature of palette 4000 as shown by loops 9613R for 16 bit bus, 9615R for 4 bit bus and 9617R for 1 bit bus (examples not exhaustive all bus widths). Loop 9617R is a limiting case in which the panning counter 9507 is clocked but does not change in value since M=1, and panning is performed by VRAM control as a practical matter.

Left panning in FIG. 63 is symmetric in concept to right panning. In loop 9611L all M bits in the first group in FIG. 61A are transferred to RAM 4021. Then in FIG. 63 one pixel (−1) of FIG. 61C is transferred from the first subset in latch 4011 of FIG. 62 at the beginning of each line of the frame. Then 2 pixels (−2),(−1) are transferred in the next frame, and so on frame-by-frame until M-1 pixels are transferred at the beginning of each line of a frame, whence the loop 9611L returns to transfer all M pixels in the following frame as in FIG. 61A. Similarly, loops 9613L, 9615L and 9617L show operations for smaller bus widths in left panning.

In FIG. 62, circuit 4041" is configured to supply an additional SCLK pulse 9711 advanced by a number x of dot clock periods relative to the termination 9713 of blanking BLNK- active low. The advancement x is variable as a function of frame number x and is equal to x in right panning (compare FIG. 61B) wherein (M-x) pixels are transferred after termination 9713 at the beginning of a line. The advancement x is equal to M-x in left panning (compare FIG. 61C) wherein x pixels are transferred after termination 9713 at the beginning of a line. Panning pulse 9711 thus transfers an initial group of pixels only a subset of which will be actually transferred to RAM 4021. A first complete SCLK pulse after the termination 9713 of blanking is delayed by a number of dot clock periods to enter a group of M pixels which will be all transferred to RAM 4021 with continuity after the initial group.

Figure 65:
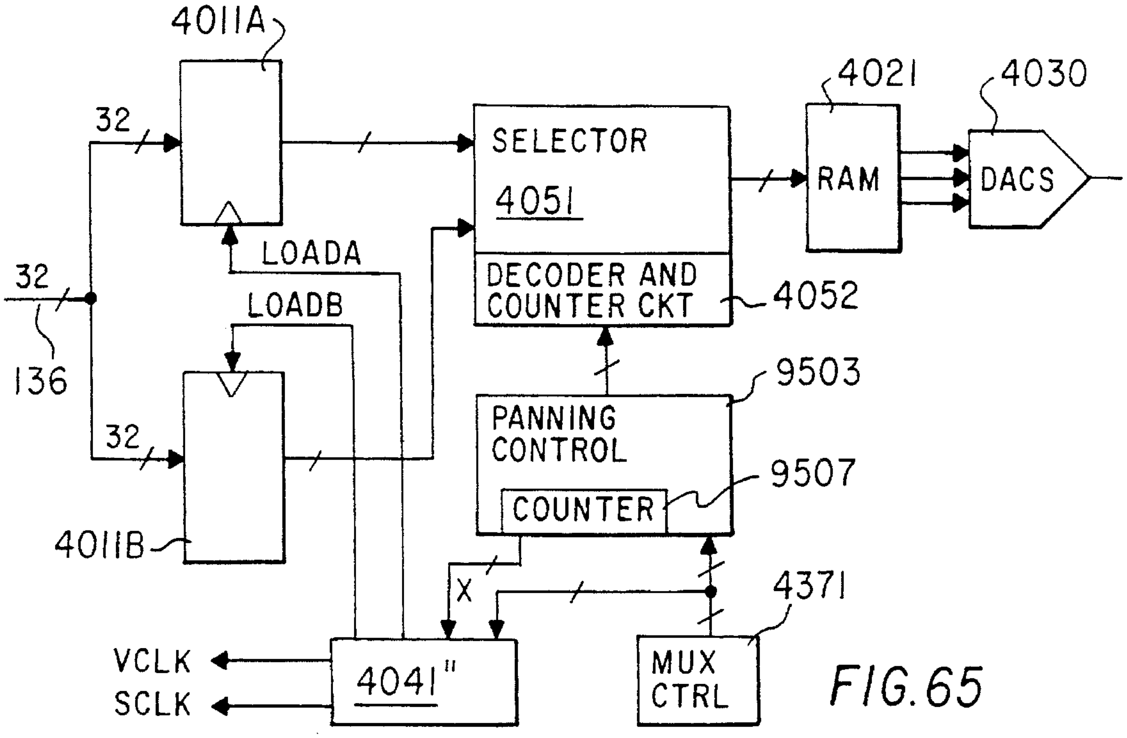
FIG. 65 is a block diagram of a second embodiment of panning circuitry.
Figure 64:
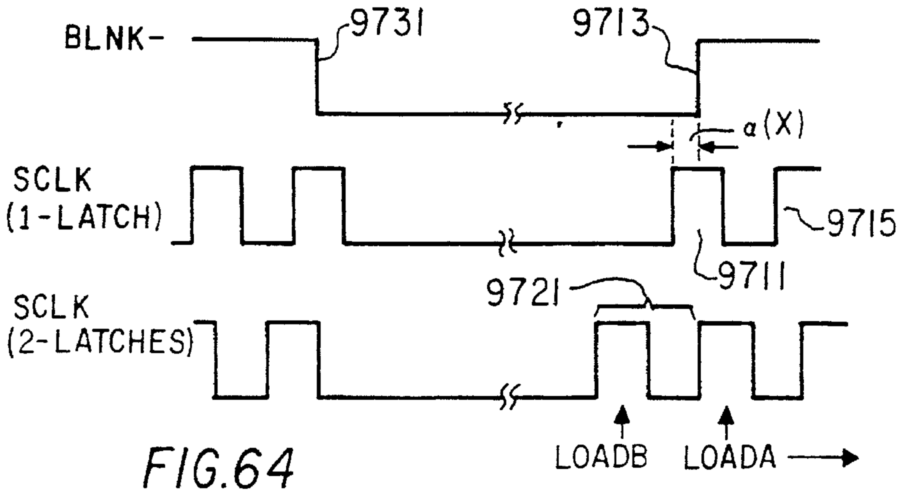
FIG. 64 is a waveform diagram of timing of SCLK in two embodiments of panning circuitry of FIGS. 62 and 65.

FIG. 65 shows another panning embodiment using two latches 4011A and 4011B, wherein the advancement is fixed and does not vary as a function of frame number x. For the FIG. 65 embodiment, the timing is represented by a waveform SCLK (2-LATCHES) in FIG. 64. There, a cycle of SCLK is inserted in a time interval 9721 equal to the period of SCLK, and that time interval 9721 terminates at the same instant 9713 as blanking terminates.

In FIG. 65, bus 136 is connected to a plurality of latches, here two, illustrated by input latches 4011A and 4011B. A clock control circuit 4041" supplies shift clock SCLK (2-LATCHES) as in FIG. 64. Also, clock control circuit 4041" is responsive to the panning control 9503 and 9507 to supply load signals LOADA and LOADB having the same period as SCLK to latches 4011A and 4011B respectively. LOADB is inserted as a single pulse in this embodiment when frame number x is not zero and the initial group of pixels at the beginning of a line is to be shifted. LOADB can be active for other purposes, but for panning purposes in this embodiment of FIG. 65, LOADB is otherwise inactive. LOADA is a series of pulses latching in all succeeding groups of pixels in each line in FIGS. 61A,61B,61C. Transfers from either of the latches 4011A and 4011B via selector 4051 to RAM 4021 occur at dot clock rate. Blanking transition 9731 at the end of each line extinguishes any remaining pixels being transferred. Selection of latch 4011A or 4011B by selector 4051 and the number of pixels transferred from each group to RAM 4021 is coordinated by panning control 9503 as discussed in connection with FIGS. 61A, 61B, 61C. Otherwise the circuitry of FIG. 65 operates and is constructed analogous to the circuitry of FIG. 62 having corresponding numerals already described.

A few preferred embodiments have been described in detail hereinabove. It is to be understood that the scope of the invention comprehends embodiments superficially different from those described yet within the inventive scope. For a few examples, color display devices utilized in combination can be raster-scanned cathode ray tube monitors, other raster-scanned devices, devices that are not raster-scanned and have parallelized line or frame drives, color printers, film formatters, and other hard copy displays, liquid crystal, plasma, holographic, deformable micromirror, and other displays of non-CRT technology, and three-dimensional and other nonplanar image formation technologies. Microprocessor and microcomputer in some contexts are used to mean that microcomputer requires a memory; the usage herein is that these terms can also be synonymous and refer to equivalent things. The phrase processing circuitry comprehends ASIC circuits, PALs, PLAs, decoders, memories, non-software based processors, or other circuitry, or digital computers including microprocessors and microcomputers of any architecture, or combinations thereof. Palette in some contexts refers to a specific look-up table device and in the present work it also comprehends alternative color data word generation combined with one or more associated circuits such as digital to analog converter, selectors, timing controls, and functional and testability circuits and interfaces. Internal and external connections can be ohmic, capacitive, direct or indirect via intervening circuits or otherwise as desirable. Implementation is contemplated in discrete components or fully integrated circuits in silicon, gallium arsenide, and other electronic materials families as well as in optical-based or other technology-based forms and embodiments. It should be understood that various embodiments of the invention can employ hardware, software or microcoded firmware. Process diagrams herein are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to this description. It is therefore contemplated that the appended claims cover any such modifications or embodiments as fall within the true scope of the invention.

What is claimed is:

1. A method of testing an integrated circuit that includes read/write memory circuitry and additional non-memory circuitry all fabricated on one semiconductor chip, the read/write memory circuitry having a plurality of addressable storage locations each for storing a data word including a plurality of data bits therein, said plurality of data bits of said data words stored in said read/write memory circuitry having logic states including a first logic state and at least one other logic state, the method comprising the steps of:

loading each data word of each addressable storage location of said read/write memory circuitry with said first logic state;

repeatedly addressing said read/write memory circuitry with a predetermined number of each possible address in sequence, thereby recalling from the read/write memory circuitry said data words stored in said corresponding addressable storage locations;

generating a count included within said integrated circuit of a number of occurrences of the first logic state in each data word recalled from said read/write memory circuitry;

accumulating in a counter said count of a plurality of data words recalled from said read/write memory circuitry over a period of time;

externally accessing the count of said counter; and comparing the count of said counter with an expected count.

2. The method of testing of an integrated circuit of claim 1, wherein:

said step generating a count included within said integrated circuit of a number of occurrences of the first logic state in each data word recalled from said read/write memory circuitry consists of generating an upper count of a number of occurrences of the first logic state in a most significant half of each data word recalled from said read/write memory circuitry, generating a lower count of a number of occurrences of the first logic state in a least significant half of each data word recalled from said read/write memory circuitry, and adding said upper count and said lower count.

3. An integrated circuit comprising:

a plurality of connection pins including input pins and output pins;

a read/write memory connected to a first subset of said input pins having a plurality of addressable storage locations each for storing a data word including a plurality of data bits therein, said read/write memory responsive to an address received on said first subset of input pins for recall of said data word stored at one of said addressable storage locations corresponding to said received address;

a non-memory circuit connected to said read/write memory to receive said data word recalled from said read/write memory, said non-memory circuit producing an output on a first subset of said output pins corresponding to said data word recalled from said memory;

a selector circuit connected to said read/write memory to receive said data word recalled from said read/write memory and connected to a second subset of said input pins, said selector circuit outputting a selected subset of said plurality of data bits of said data word recalled from said read/write memory, said subset selected corresponding to data received at said second subset of input pins; and an accumulator connected to said selector circuit to receive said selected subset of said plurality of data bits of said data word recalled from said read/write memory, said accumulator including:

a detector for detecting the number of bits within said selected subset of said plurality of data bits of said data word recalled from said read/write memory having a predetermined logic state, said detector forming a count of said detected number of bits, an adder for accumulating said count of said detected number of bits for each data word recalled from said read/write memory over a period of time, and a count register storing therein said count, said count register producing an output on a second subset of said output pins corresponding to said count.

4. The integrated circuit of claim 3 further comprising:

an identifying register connected to a third subset of said output pins, said identifying register storing therein a unique identification code corresponding to a particular integrated circuit to thereby generate an externally accessible identification code.

5. The integrated circuit of claim 3 wherein:

said non-memory circuit includes a plurality of analog signal generating circuits generating respective analog voltage signals corresponding to said data word recalled from said memory, a comparison circuit connected to said analog signal generating circuits, said comparison circuit generating a digital comparison signal indicative of the voltage relationship between a selected two of said analog voltage signals.

6. The integrated circuit of claim 5 wherein:

said non-memory circuit further includes a comparison latch connected to said comparison circuit and a third subset of said output pins, said comparison latch storing said digital comparison signal to thereby generate an externally accessible digital comparison signal.

7. The integrated circuit of claim 3, wherein:

said detector includes an upper decoder receiving a most significant half of each data word recalled from said read/write memory, said upper decoder generating a multibit digital upper count indicating a number of bits within said selected subset of said most significant half of each data word recalled from said read/write memory having said predetermined logic state, a lower decoder receiving a least significant half of each data word recalled from said read/write memory, said lower decoder generating a multibit digital lower count indicating a number of bits within said selected subset of said least significant half of each data word recalled from said read/write memory having said predetermined logic state, and an adder connected to said upper decoder and said lower decoder for adding said multibit digital upper count and said multibit digital lower count thereby forming said count of said detected number of bits.

8. A method of testing an integrated circuit that includes read/write memory circuitry and additional non-memory circuitry all fabricated on one semiconductor chip, the read/write memory circuitry having a plurality of addressable storage locations each for storing a data word including a plurality of data bits therein, said plurality of data bits of said data words stored in said read/write memory circuitry having logic states including a first logic state and at least one other logic state, the method comprising the steps of:

loading a data word stored at a predetermined addressable storage location of said read/write memory circuitry with said other logic state;

loading each data word of each addressable storage location of said read/write memory circuitry other than said predetermined address storage location with said first logic state;

repeatedly addressing said read/write memory circuitry with an address corresponding to said predetermined addressable storage location, thereby repeatedly recalling from the read/write memory circuitry said data word stored in said predetermined addressable storage location;

generating a count included within said integrated circuit of a number of occurrences of the first logic state in each data word recalled from said read/write memory circuitry; accumulating in a counter said count of a plurality of data words recalled from said read/write memory circuitry over a period of time;

externally accessing the count of said counter; and comparing the count of said counter with an expected count.

9. The method of testing of an integrated circuit of claim 8, wherein:

said step generating a count included within said integrated circuit of a number of occurrences of the first logic state in each data word recalled from said read/write memory circuitry consists of generating an upper count of a number of occurrences of the first logic state in a most significant half of each data word recalled from said read/write memory circuitry, generating a lower count of a number of occurrences of the first logic state in a least significant half of each data word recalled from said read/write memory circuitry, and adding said upper count and said lower count.

* * * * *